US012597901B2

(12) United States Patent
Venkatesh et al.

(10) Patent No.: US 12,597,901 B2
(45) Date of Patent: Apr. 7, 2026

(54) RECONFIGURABLE INTELLIGENT SURFACE REALIZED WITH INTEGRATED CHIP TILING

(71) Applicant: The Trustees of Princeton University, Princeton, NJ (US)

(72) Inventors: Suresh Venkatesh, Princeton, NJ (US); Xuyang Lu, Princeton, NJ (US); Hooman Saeidi, Princeton, NJ (US); Kaushik Sengupta, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 732 days.

(21) Appl. No.: 17/713,556

(22) Filed: Apr. 5, 2022

(65) Prior Publication Data

US 2022/0337240 A1     Oct. 20, 2022

Related U.S. Application Data

(60) Provisional application No. 63/170,811, filed on Apr. 5, 2021.

(51) Int. Cl.
H03H 1/00        (2006.01)
H01Q 15/00        (2006.01)
(Continued)

(52) U.S. Cl.
CPC ............ H03H 1/00 (2013.01); H01Q 15/002 (2013.01); H03H 11/02 (2013.01);
(Continued)

(58) Field of Classification Search
CPC .. H03H 1/00; H03H 11/02; H03H 2001/0064; H01Q 15/002; H01Q 15/148; H03K 17/687; H03K 3/037; H03K 19/18
See application file for complete search history.

(56) References Cited

U.S. PATENT DOCUMENTS

2019/0044246 A1* 2/2019 Pitsillides .......... H01Q 15/0086
2021/0175931 A1* 6/2021 Choi ...................... H02J 50/80

OTHER PUBLICATIONS

T. H.-Y. Nguyen and G. Byun, "Design of High-Q Metasurfaces Using a Trapped Mode for High-Efficient Energy Harvesting," 2020 IEEE Pels Workshop on Emerging Technologies: Wireless Power Transfer (WoW), Seoul, Korea (South), 2020, pp. 309-311 (Year: 2020).*

(Continued)

*Primary Examiner* — Quan Zhen Wang
*Assistant Examiner* — Rajsheed O Black-Childress
(74) *Attorney, Agent, or Firm* — Meagher Emanuel Laks Goldberg & Liao, LLP

(57) ABSTRACT

Disclosed is an electromagnetic-circuit co-design approach for massively reconfigurable, multifunctional, and high-speed programmable metasurfaces with integrated chip tiling. The ability to manipulate the incident electromagnetic fields in a dynamically programmable manner and at high speeds using integrated chip tiling approach is also disclosed. The scalable architecture uses electromagnetic-circuit co-design of metasurfaces where each individual sub-wavelength meta-element is uniquely addressable and programmable. The disclosed device comprises a large array of such meta-elements. The design relies on integrated high frequency switches designed in conjugation with meta-element for massive reconfigurability of incident amplitude and phase. The disclosed chip is multi-functional and can perform beamforming, high speed spatial light modulation, dynamic holographic projections, and wavefront manipulation.

28 Claims, 42 Drawing Sheets

(51) Int. Cl.
   *H03H 11/02*     (2006.01)
   *H03K 3/037*     (2006.01)
   *H03K 17/687*    (2006.01)
(52) U.S. Cl.
   CPC ... *H03K 17/687* (2013.01); *H03H 2001/0064*
        (2013.01); *H03K 3/037* (2013.01)

(56)       References Cited

OTHER PUBLICATIONS

Nagatsuma, T., Ducournau, G. & Renaud, C. C. Advances In Terahertz Communications Accelerated By Photonics. Nat. Photon. 10, 371-379 (2016); 34 pages.

Sengupta, K., Nagatsuma, T. & Mittleman, D. M. Terahertz Integrated Electronic And Hybrid Electronic-Photonic Systems. Nat. Electron. 1, 622-635 (2018); 14 pages.

Karl, N. J., McKinney, R. W., Monnai, Y., Mendis, R. & Mittleman, D. M. Frequency-Division Multiplexing In The Terahertz Range Using A Leaky-Wave antenna. Nat. Photon. 9, 717-720 (2015); 5 pages.

Venkatesh, S. et al. Interferometric Direction Finding With A Metamaterial Detector. Appl. Phys. Lett. 103, 254103 (2013); 7 pages.

Sengupta, K., Seo, D., Yang, L. & Hajimiri, A. Silicon Integrated 280ghz Imaging Chipset With 4×4 SiGe Receiver Array And CMOS Source. IEEE Trans. Terahertz Sci. Technol. 5, 427-437 (2015); 11 pages.

Zeng, B. et al. Hybrid Graphene Metasurfaces For High-Speed Mid-Infrared Light Modulation And Single-Pixel Imaging. Light Sci. Appl. 7, 51 (2018); 8 pages.

Yu, N. & Capasso, F. Flat Optics With Designer Metasurfaces. Nat. Mater. 13, 139-150 (2014); 12 pages.

Zhang, L., Mei, S., Huang, K. & Qiu, C.-W. Advances In Full Control Of Electromagnetic Waves With Metasurfaces. Adv. Opt. Mater. 4, 818-833 (2016); 16 pages.

Jahani, S. & Jacob, Z. All-Dielectric Metamaterials. Nat. Nanotechnol. 11, 23-36 (2016); 15 pages.

Lin, D., Fan, P., Hasman, E. & Brongersma, M. L. Dielectric Gradient Metasurface Optical Elements. Science 345, 298-302 (2014); 7 pages.

Genevet, P., Lin, J., Kats, M. A. & Capasso, F. Holographic Detection Of The Orbital Angular Momentum Of Light With Plasmonic Photodiodes. Nat. Commun. 3, 1278 (2012; 6 pages).

Wan, X., Jiang, W. X., Ma, H. F. & Cui, T. J. A Broadband Transformation—Optics Metasurface Lens. Appl. Phys. Lett. 104, 151601 (2014); 6 pages.

Ni, X., Kildishev, A. V. & Shalaev, V. M. Metasurface Holograms For Visible Light. Nat. Commun. 4, 2807 (2013); 7 pages.

Zheng, G. et al. Metasurface Holograms Reaching 80% Efficiency. Nat. Nanotechnol. 10, 308-312 (2015); 12 pages.

Li, L. et al. Electromagnetic Reprogrammable Coding—Metasurface Holograms. Nat. Commun. 8, 197 (2017); 7 pages.

Xu, H.-X. et al. Tunable Microwave Metasurfaces For High Performance Operations: Dispersion Compensation And Dynamical Switch. Sci. Rep. 6, 38255 (2016); 10 pages.

Huang, C. et al. Dynamical Beam Manipulation Based On 2-Bit Digitally-Controlled Coding Metasurface. Sci. Rep. 7, 42302 (2017); 8 pages.

Liu, X. & Padilla, W. J. Dynamic Manipulation Of Infrared Radiation With MEMS Metamaterials. Adv. Opt. Mater. 1, 559-562 (2013); 5 pages.

He, S., Yang, H., Jiang, Y., Deng, W. & Zhu, W. Recent Advances In Mems Metasurfaces And Their Applications On Tunable Lens. Micromachines 10, 505 (2019); 21 pages.

Zhao, X. et al. Electromechanically Tunable Metasurface Transmission Waveplate At Terahertz Frequencies. Optica 5, 303-310 (2018); 34 pages.

Sensale-Rodriguez, B. et al. Broadband Graphene Terahertz Modulators Enabled By Intraband Transitions. Nat. Commun. 3, 780 (2012); 7 pages.

Arezoomandan, S., Quispe, H. O. C., Ramey, N., Nieves, C. A. & Sensale-Rodriguez, B. Graphene-Based Reconfigurable Terahertz Plasmonics And Metamaterials. Carbon 112, 177-184 (2017); 8 pages.

Zheng, W., Fan, F., Chen, M., Chen, S. & Chang, S.-J. Optically Pumped Terahertz Wave Modulation In MoS2—Si Heterostructure Metasurface. AIP Adv. 6, 075105 (2016); 9 pages.

Liu, M. et al. Terahertz-Field-Induced Insulator-To-Metal Transition In Vanadium Dioxide Metamaterial. Nature 487, 345-348 (2012); 5 pages.

Hashemi, M. R. M., Yang, S.-H., Wang, T., Sepulveda, N. & Jarrahi, M. Electronically-Controlled Beam-Steering Through Vanadium Dioxide Metasurfaces. Sci. Rep. 6, 35439 (2016); 8 pages.

Kim, J. et al. Controlling The Polarization State Of Light With Plasmonic Metal Oxide Metasurface. ACS Nano 10, 9326-9333 (2016); 8 pages.

Chanana, A. et al. Colour Selective Control Of Terahertz Radiation Using Two-Dimensional Hybrid Organic Inorganic Lead-Trihalide Perovskites. Nat. Commun. 8, 1328 (2017); 8 pages.

Chen, H.-T. et al. Active Terahertz Metamaterial Devices. Nature 444, 597-600 (2006); 7 pages.

Wu, X. & Sengupta, K. Dynamic Waveform Shaping With Picosecond Time Widths. IEEE J. Solid-State Circuits 52, 389-405 (2016); 17 pages.

Sengupta, K. & Hajimiri, A. Mutual Synchronization For Power Generation And Beam-Steering In CMOS With On-Chip Sense Antennas Near 200GHz. IEEE Trans. Microw. Theory Tech. 63, 2867-2876 (2015); 10 pages.

Sengupta, K. & Hajimiri, A. Designing Optimal Surface Currents For Efficient On-Chip Mm-Wave Radiators With Active Circuitry. IEEE Trans. Microw. Theory Tech. 64, 1976-1988 (2016); 13 pages.

Liu, L. et al. Broadband Metasurfaces With Simultaneous Control Of Phase And Amplitude. Adv. Mater. 26, 5031-5036 (2014); 6 pages.

Zhang, X. et al. Broadband Terahertz Wave Deflection Based On C-Shape Complex Metamaterials With Phase Discontinuities. Adv. Mater. 25, 4567-4572 (2013); 6 pages.

Venkatesh, S., Viswanathan, N. & Schurig, D. W-Band Sparse Synthetic Aperture For Computational Imaging. Opt. Express 24, 8317-8331 (2016); 16 pages.

Landy, N. & Smith, D. R. Two-Dimensional Metamaterial Device Design In The Discrete Dipole Approximation. J. Appl. Phys. 116, 044906 (2014); 11 pages.

* cited by examiner

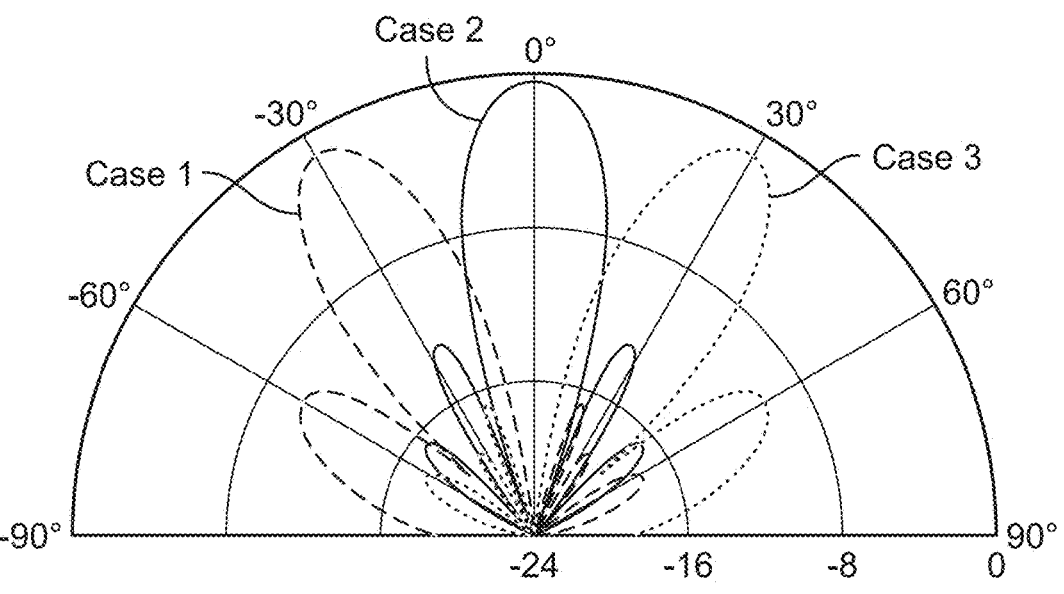
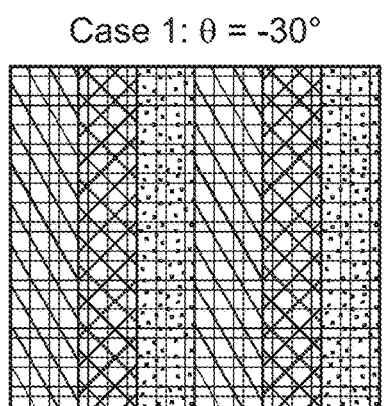
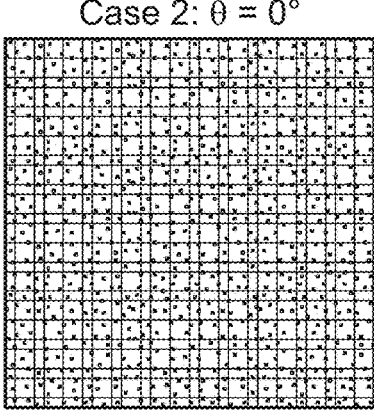
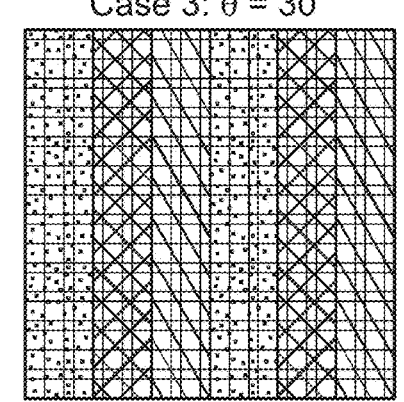
Case 1: θ = -30°     Case 2: θ = 0°     Case 3: θ = 30°
Digital Setting (Phase)
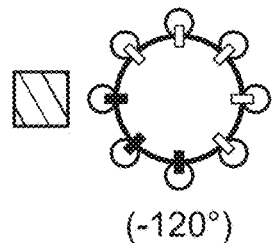
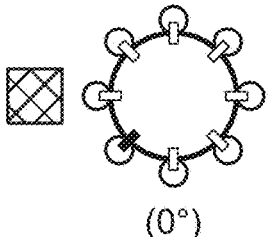
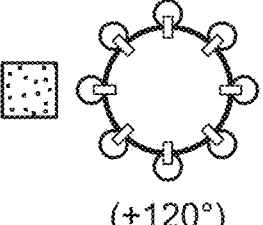
(-120°)     (0°)     (+120°)
*FIG. 4A*

Simulation

Simulation

Measurement

Measurement

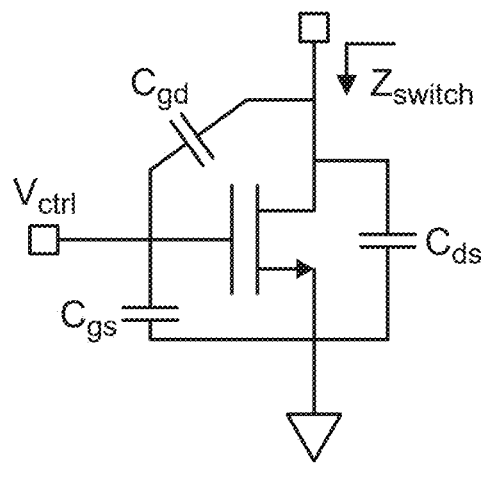
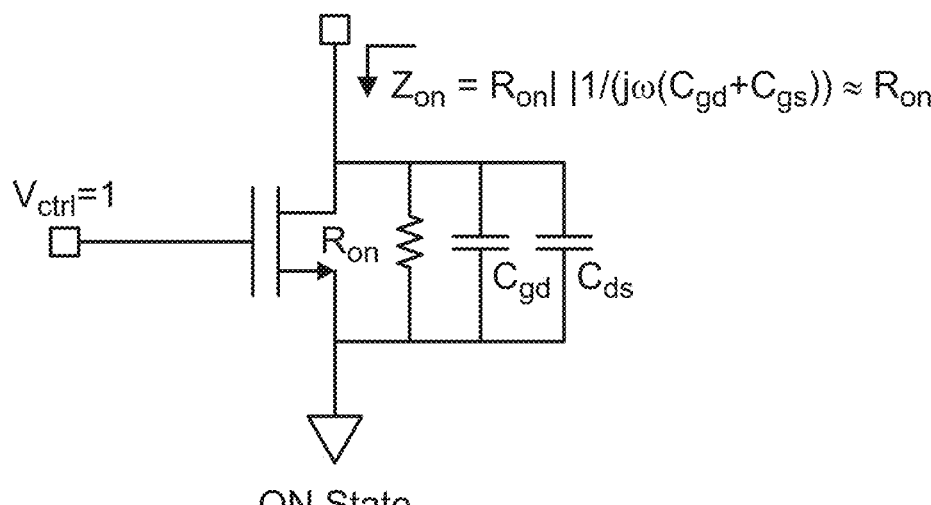
ON State
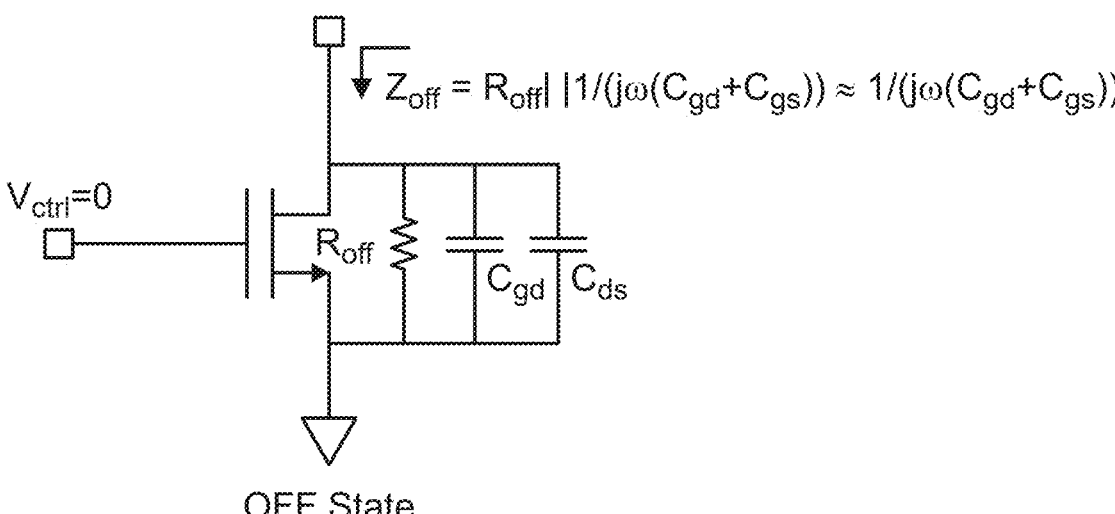
OFF State
*FIG. 6*

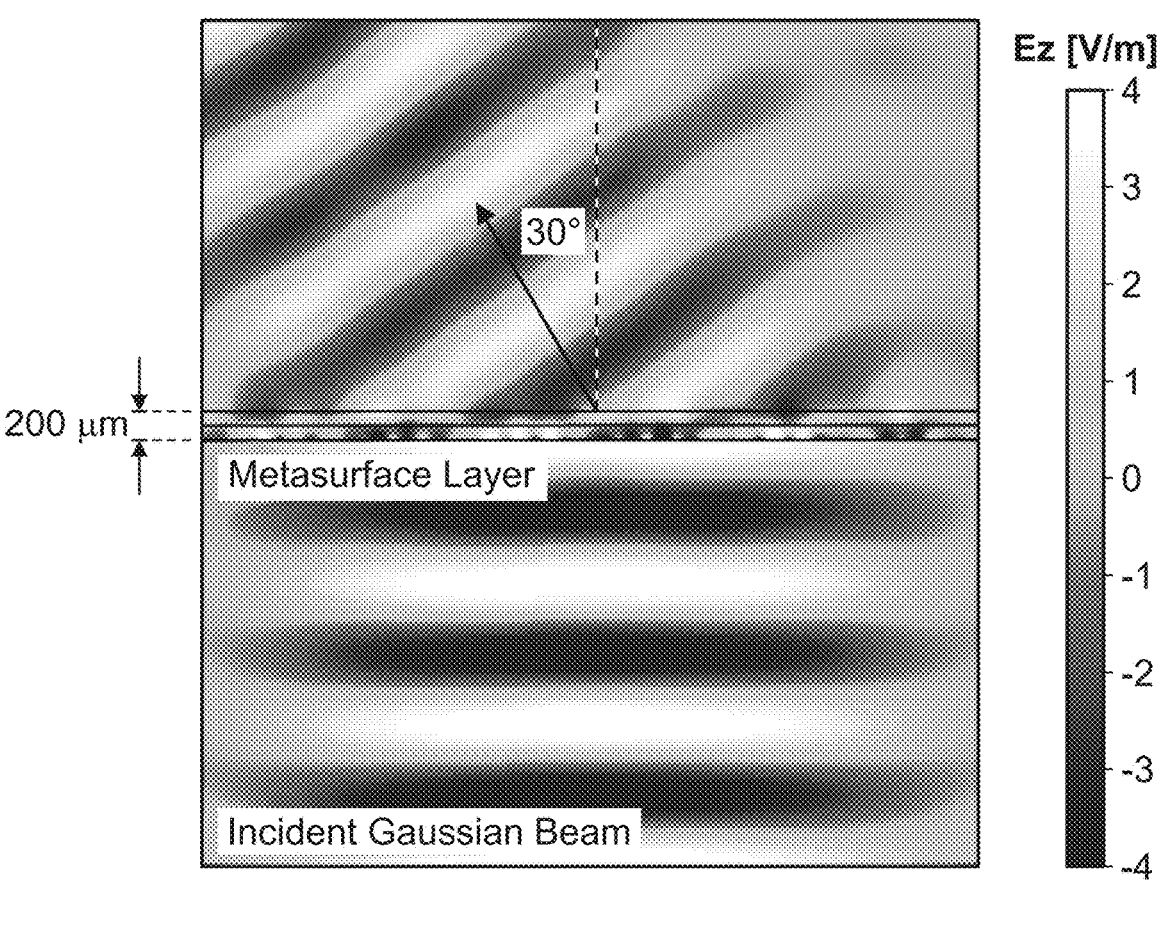
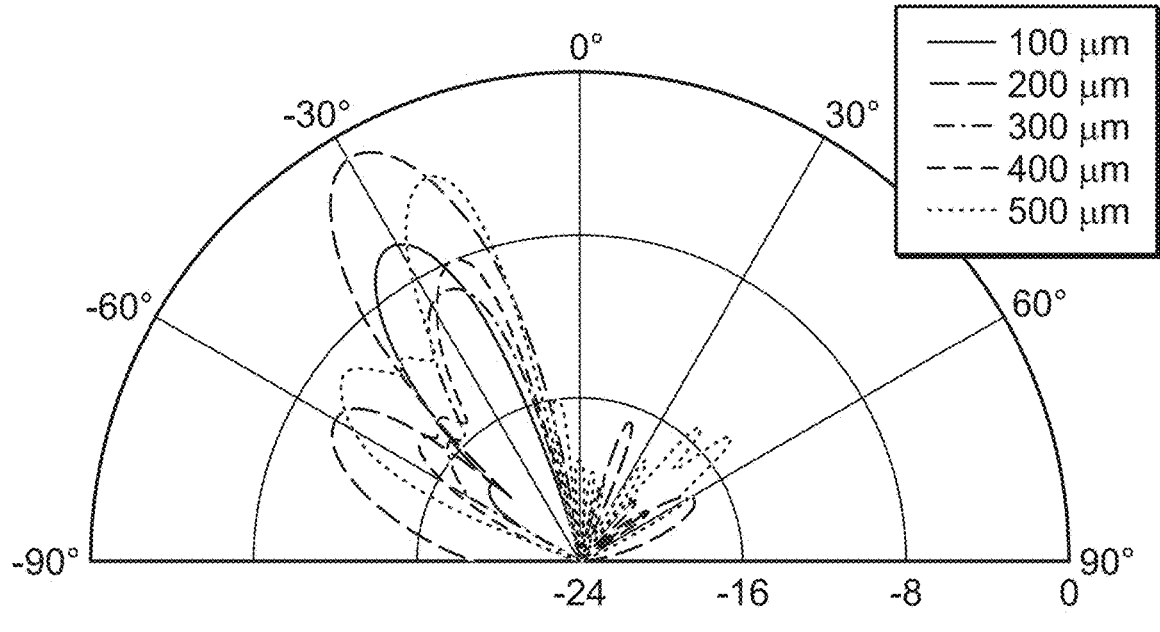
*FIG. 10*

Emulating Aperture Rotation for Amplitude Control

Emulating Aperture Opening for Phase Control

Simulation

Measurement

**Optimization Algorithm for Binary
Amplitude-Only Holographic Projections**

Algorithm 1: Genetic algorithm based optimization using binary-amplitude only angular spectrum method for holographic projection.

Result: $|E(x,y,z_1)| \approx |E_{desired}|$

Initialize: Array with arbitrary unit-cells turned STATE0 (all switches short) and STATE1 (all switches open);

$E_{desired}$, desired electric field norm at distance $z = z_1$;

while Minimize ErrorFunction $= |E(x,y,z_1)| - |E_{desired}|$ do

Start Genetic Optimization;

Function Angular Spectrum Method for each Gene $$\hat{E}(k_x,k_y;0) = \frac{1}{4\pi^2} \iint_{-\infty}^{\infty} E(x,y,0)e^{-i(k_x x + k_y y)} dx dy$$

$$\hat{E}(x,y;z_1) = \hat{E}(k_x,k_y;0)e^{-ik_z z} \text{ where}; k_z = \sqrt{k_0^2 - (k_x^2 + k_y^2)}$$

$$\hat{E}(x,y;z_1) = \iint_{-\infty}^{\infty} \hat{E}(x,y;z_1)e^{i(k_x x + k_y y)} dk_x dk_y$$

Evaluate ErrorFunction;

Store Best Gene;

Generate New Population;

end

FIG. 13

Transmission Phase Control

Outdoor Environment

Indoor Environment

RECONFIGURABLE INTELLIGENT SURFACE REALIZED WITH INTEGRATED CHIP TILING

CROSS-REFERENCE TO RELATED APPLICATIONS

This application claims priority to provisional application 63/170,811, filed Apr. 5, 2021, which is herein incorporated by reference in its entirety.

STATEMENT REGARDING FEDERALLY SPONSORED RESEARCH OR DEVELOPMENT

This invention was made with government support under Grant Nos. N00014-17-1-2494 and N00014-19-1-2525 awarded by the Office of Naval Research (ONR), Grant No. FA9550-16-1-0566 awarded by the Air Force Office of Scientific Research (AFOSR), and Grant No. W911NF-19-1-0204 awarded by the Army Research Office (ARO). The government has certain rights in the invention.

BACKGROUND

The terahertz frequency range (0.1-10 THz) could form the basis of the next generation of high-speed wireless communication, as well as a range of spectroscopy, sensing and imaging applications. Spatiotemporal control of the far- and near-field distribution of terahertz signals, and the manipulation of terahertz fields at subwavelength scales at high speed, will be crucial in enabling these applications. Beyond rapid and reconfigurable beamforming, such capabilities could also deliver new forms of energy-efficient, compact and lensless terahertz sensing and imaging systems with a low number of pixels. The directionalities of terahertz beams, which are typically generated with high-aperture radiators to overcome path losses, bear similarities to those at optical frequencies. This has naturally led researchers to investigate metasurfaces to accomplish many of these signal processing tasks. Metasurfaces are two-dimensional surfaces with precisely designed scatterers that create controlled field transformation of incident wavefronts across the properties of amplitude, phase, frequency and polarization. A technique to realize the full potential of reconfigurable metasurfaces, and enable complex electromagnetic transformations, scalable metasurfaces that offer individually addressable elements, simultaneous amplitude and phase control, and gigahertz-speed reconfiguration, is therefore useful and desirable.

BRIEF SUMMARY

The present disclosure provides a system and method for a modular approach to create programmable terahertz metasurfaces with fully integrated silicon chip tiles. Active meta-element structures are created by incorporating within each subwavelength passive meta-element multiple active devices, strongly coupled with deeper subwavelength inductive loops. Exploiting local resonances within the meta-element, the devices can operate like efficient switches even at terahertz frequencies. The digital codes for various configurations allow the structure to be reconfigured to assume different shapes, creating a multitude of amplitude and phase transformations.

BRIEF DESCRIPTION OF THE DRAWINGS

FIG. 6 depicts switch performance analysis for operation close to $f_r$.

FIG. 10 depicts simulated beamforming of the metasurface with broadside incidence and variation of the transmitted beam pattern with substrate thickness. The simulation shows largest transmission at the designed substrate thickness of 200 μm as indicated in FIG. 9.

FIG. 13 depicts an optimization algorithm for binary amplitude-only holographic projections.

FIGS. 14(a-c) depict, with respect to operation of the 2×2 metasurface array as a spatial light modulator, measured near field scans when the 2×2 metasurface chips are digitally coded to turn on and off, showing measured fields when different and multiple quadrants of the chips turned ON.

FIGS. 14(d-f) depict, with respect to operation of the 2×2 metasurface array as a spatial light modulator, measured near field scans when the 2×2 metasurface chips are digitally coded to turn on and off, showing measured fields when parts of different chips turned ON to generate more complex field patterns and beam shaping.

Figure 19A:
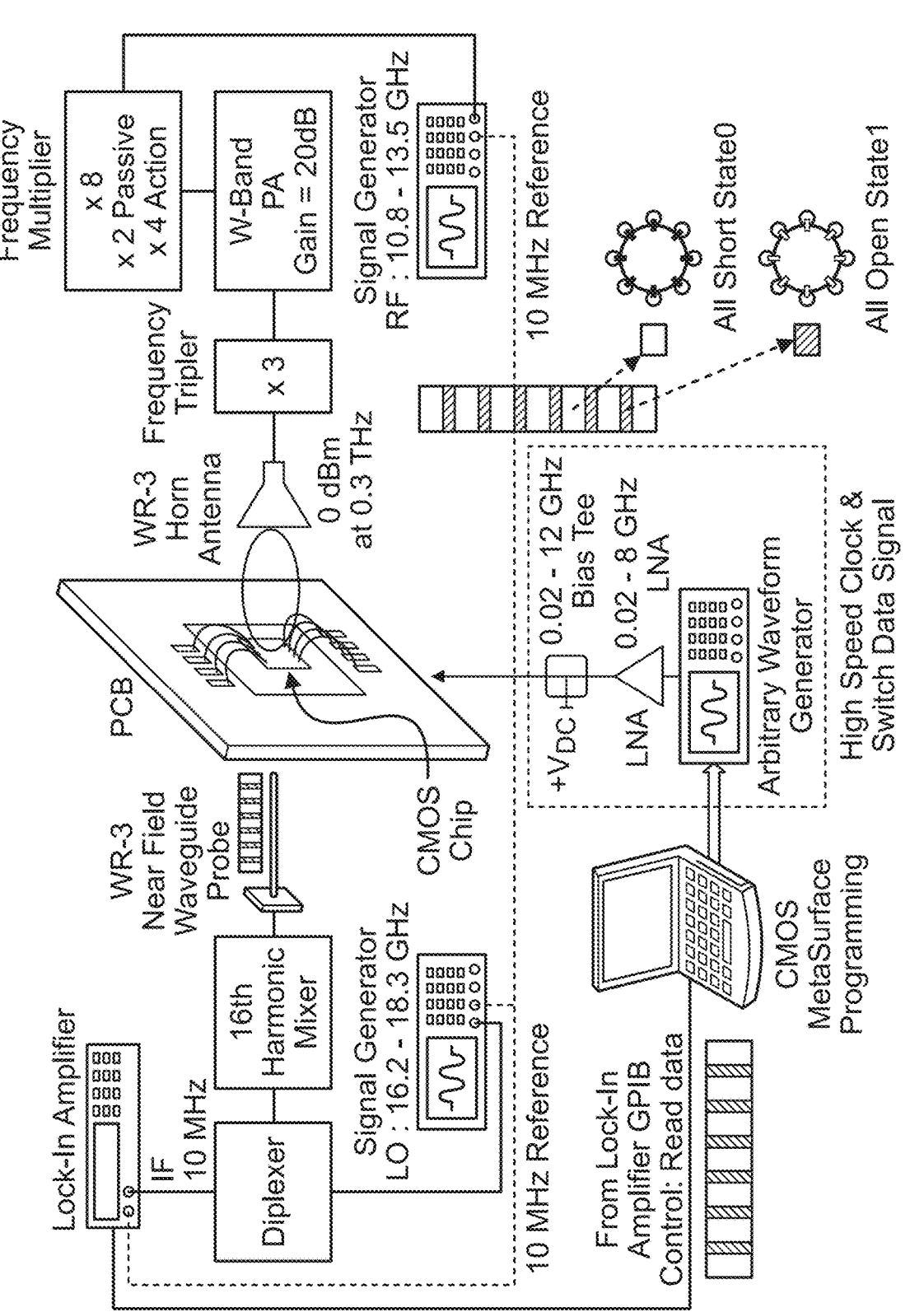
Figure 19B:
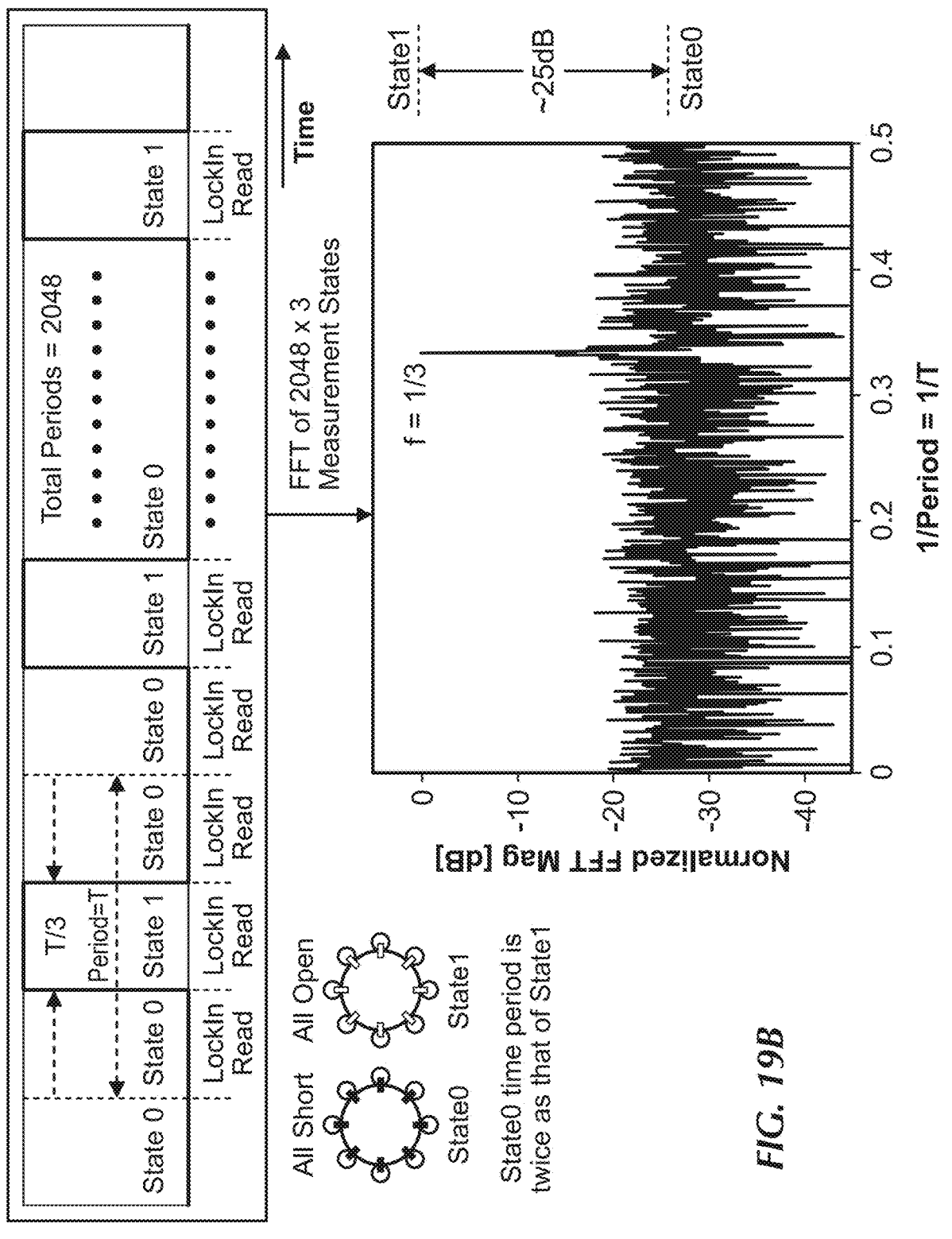

FIGS. 19A and 19B depict a sensitivity improvement methodology using lock-in amplifier setup for ON-OFF ratio measurements.

Figure 20A:
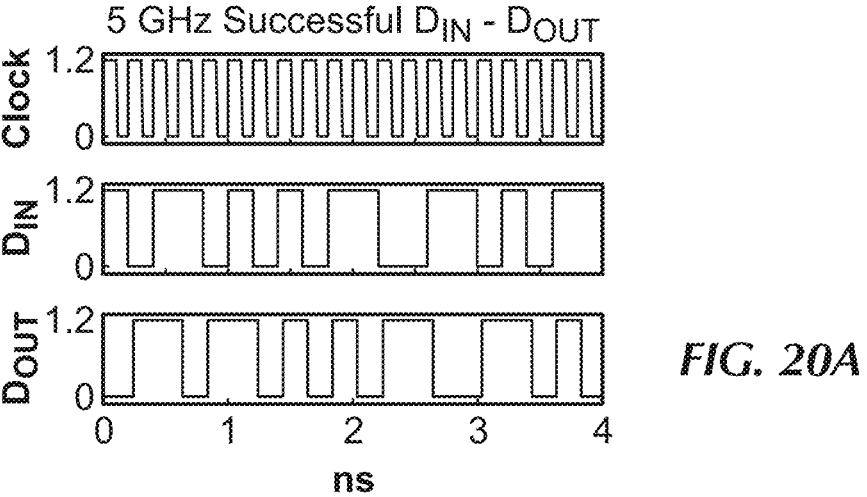
Figure 20B:
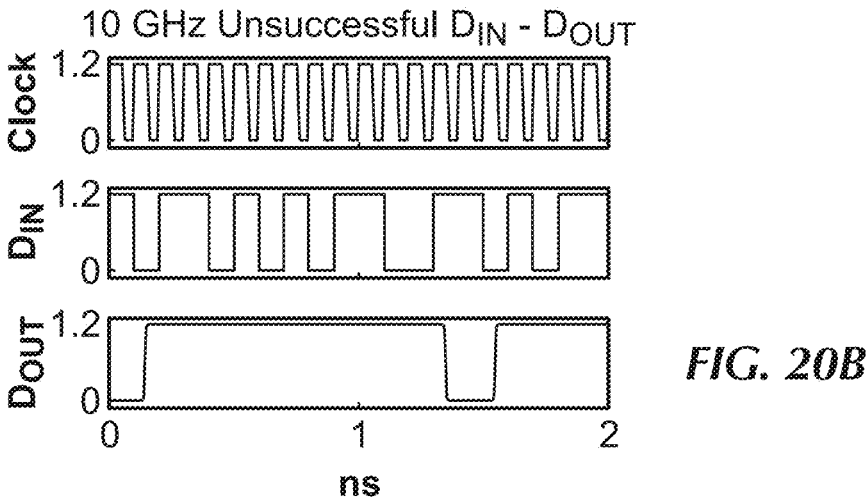
Figure 20C:
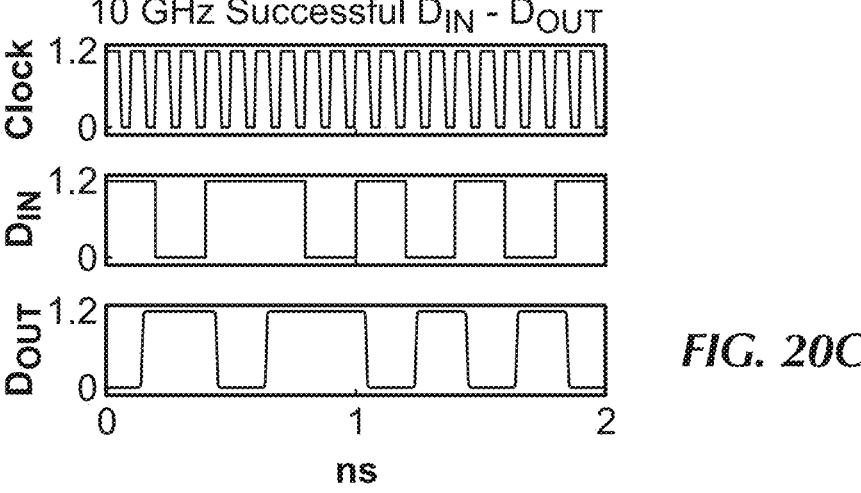

FIG. 20(*a*) depicts, with respect to circuit schematic simulation of the serial shift registers at different clock speeds and arbitrary input data (with $D_{OUT}$ as the delayed version of DIN at the output of the first D flip-flop), the successful data transfer at a clock speed of 5 GHz.

FIG. 20(*b*) depicts, with respect to circuit schematic simulation of the serial shift registers at different clock speeds and arbitrary input data (with $D_{OUT}$ as the delayed version of DIN at the output of the first D flip-flop), the unsuccessful data transfer at a clock speed of 10 GHz when the input data transition rate is increased.

FIG. 20(*c*) depicts, with respect to circuit schematic simulation of the serial shift registers at different clock speeds and arbitrary input data (with $D_{OUT}$ as the delayed version of DIN at the output of the first D flip-flop), the successful data transfer at a clock speed of 10 GHz when the input data transition rate is reduced.

Figure 21:
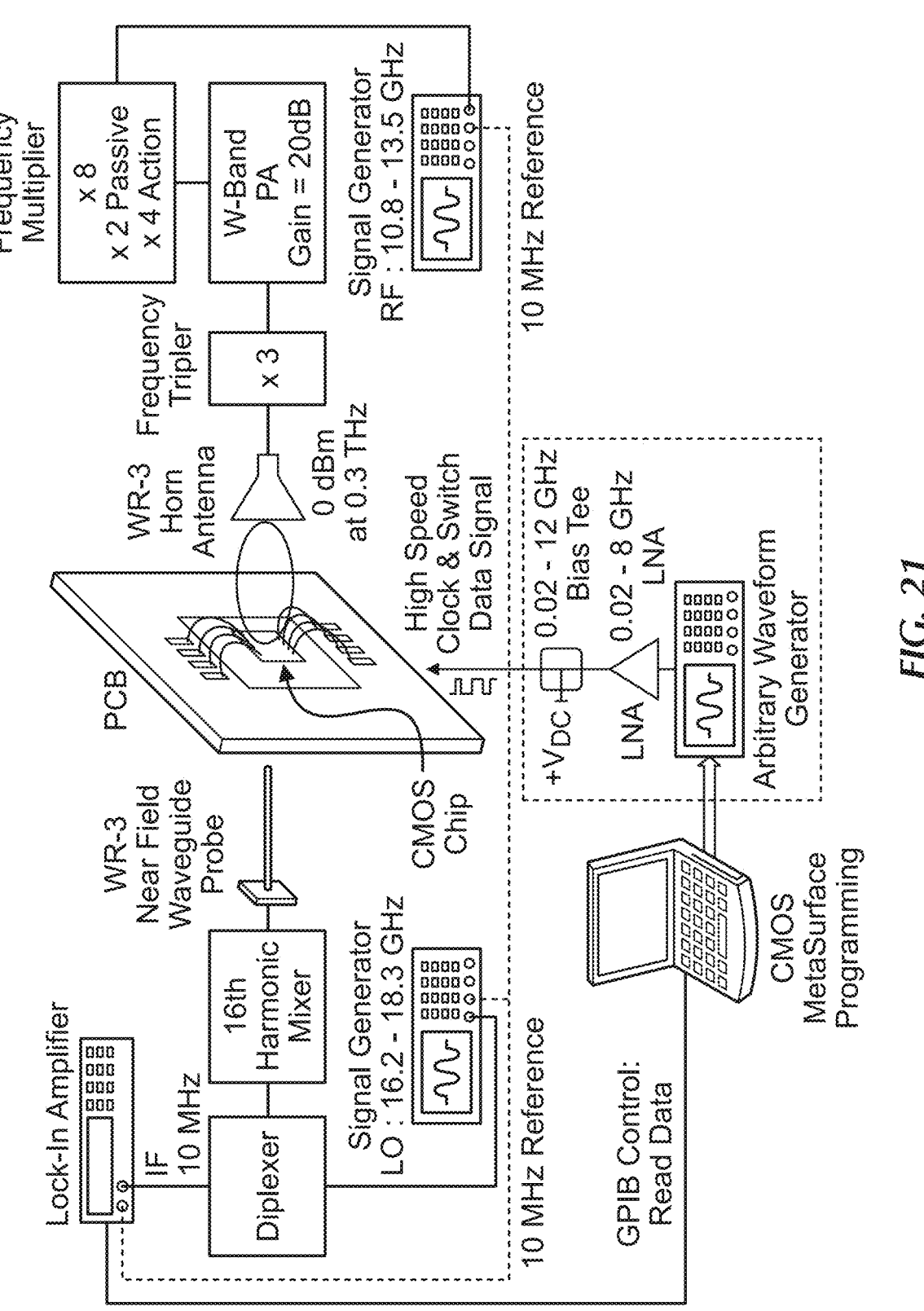

FIG. 21 depicts the modified measurement setup schematic for high speed switching.

Figure 22:
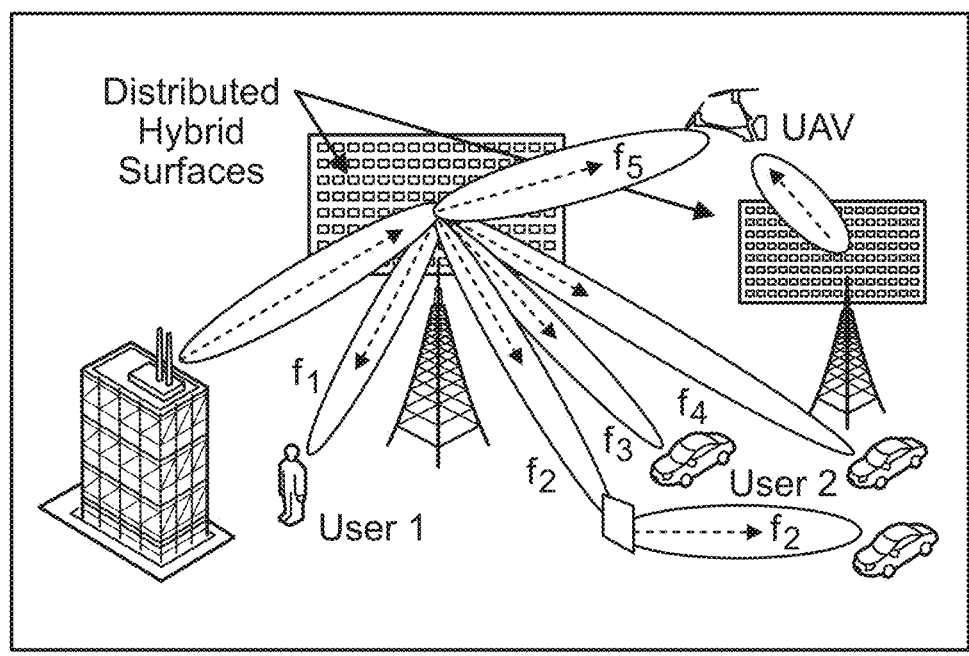

FIG. 22 depicts multiple distributed surfaces meant to create wireless links to users when the main line of sight path gets blocked (e.g., for an outdoor environment).

Figure 23:
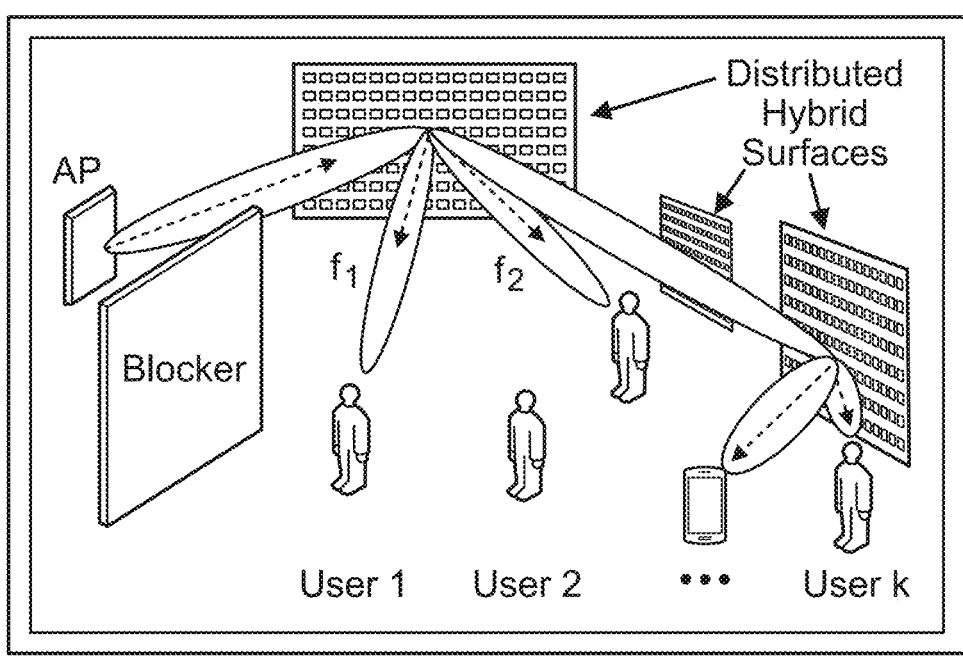

FIG. 23 depicts multiple distributed surfaces meant to create wireless links to users when the main line of sight path gets blocked (e.g., for an indoor environment).

Figure 24:
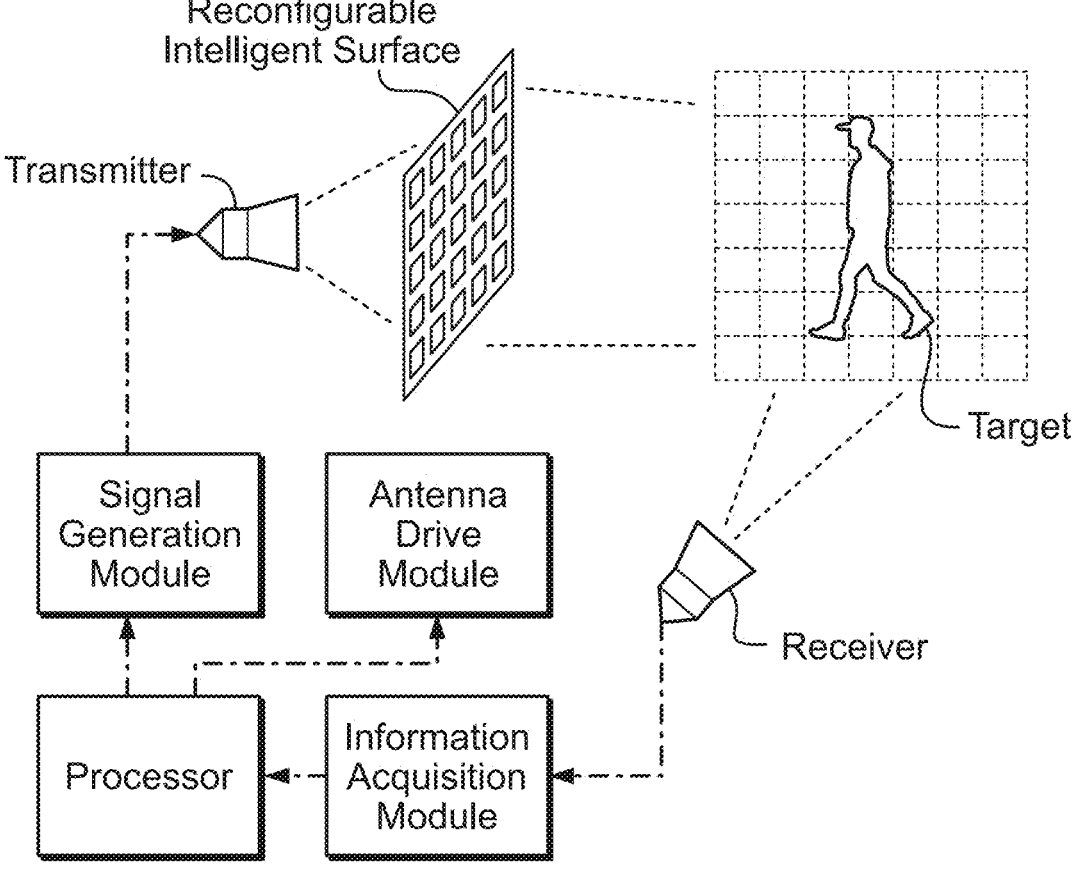

FIG. 24 depicts that the surface can also be used to create images with a transmitter and a receiver with programmable metasurface.

DETAILED DESCRIPTION

Metasurfaces, which consist of arrays of subwavelength scatterers, can be used to precisely control incident electromagnetic fields, but are typically static once fabricated. A dynamically programmable array of terahertz meta-elements, in which each element can be individually reconfigured to allow controlled wavefront shaping, could be of value in terahertz applications such as wireless communication, sensing and imaging. Here, shown here is that large-scale programmable metasurfaces can be created using arrays of complementary metal-oxide-semiconductor (CMOS)-based chip tiles. Developed were an aperture with a 2×2 array of tiled chips consisting of 576 meta-elements, each individually addressable and digitally programmable with 8 bits of control at GHz speed, and fabricated in a 65 nm industry-standard CMOS process. The active-circuit-coupled terahertz meta-element structure can be reconfigured, providing digitally programmable metasurfaces with amplitude and phase control, around 25 dB of amplitude modulation depth, dynamic beamforming across±30°, multibeam formation and programmable holographic projections at 0.3 THz.

The terahertz frequency range (0.1-10 THz) could form the basis of the next generation of high-speed wireless communication, as well as a range of spectroscopy, sensing and imaging applications. Spatiotemporal control of the far- and near-field distribution of terahertz signals, and the manipulation of terahertz fields at subwavelength scales at high speed, will be crucial in enabling these applications. Beyond rapid and reconfigurable beamforming, such capabilities could also deliver new forms of energy-efficient, compact and lensless terahertz sensing and imaging systems with a low number of pixels.

The directionalities of terahertz beams, which are typically generated with high-aperture radiators to overcome path losses, bear similarities to those at optical frequencies. This has naturally led researchers to investigate metasurfaces to accomplish many of these signal processing tasks. Metasurfaces are two-dimensional surfaces with precisely designed scatterers that create controlled field transformation of incident wavefronts across the properties of amplitude, phase, frequency and polarization. The design methodology of such metasurfaces has allowed unprecedented precision in subwavelength control of optical fields and they have demonstrated functionalities such as computational imaging, spin Hall effect, orbital angular momentum wave generation, thin lenses and holograms. To achieve reconfigurability of electromagnetic fields, metasurfaces often rely on heterogeneous integration, which is typically complex and non-scalable. In the microwave and millimeter-wave regime, active elements have been created with discrete switches, diodes and tunable substrates (liquid-crystal based, for example). However, these solutions have limited scalability and reconfigurability, and are extremely challenging to operate at terahertz frequencies due to the frequency limits and lossy nature of the active devices.

In terahertz and infrared regimes, reconfigurability has been demonstrated with phase-change materials that rely on temperature gradients, microelectromechanical systems, two-dimensional materials, phase-change material semiconductors and metal oxides. These approaches are, however, typically slow in terms of response time, require large external stimuli (such as heat, optical pumping or high voltages) and lack scalability. Some can also require cryogenic operating temperatures. Furthermore, the metasurface in these approaches is typically collectively reconfigured, enforcing the same phase discontinuity conditions on all the elements without the ability to control individual meta-elements.

To realize the full potential of reconfigurable metasurfaces, and enable complex electromagnetic transformations, scalable metasurfaces are required that offer individually addressable elements, simultaneous amplitude and phase control, and gigahertz-speed reconfiguration. In the terahertz spectrum, silicon chip dimensions enter a favorable regime with respect to wavelength, and their modular and repetitive architectures make them particularly suitable for metasurface fabrication. A typical millimeter-sized chip occupies an area of around $10\lambda \times 10\lambda$, allowing a moderately sized unit tile to be scaled in both dimensions to create larger surfaces. Importantly, the substrate itself adds the capability of integrating millions of active devices whose cutoff frequencies have reached sub-terahertz frequencies. This opens up the possibility of creating active meta-elements that are code-signed and coupled with active circuit elements.

Figure 1A:
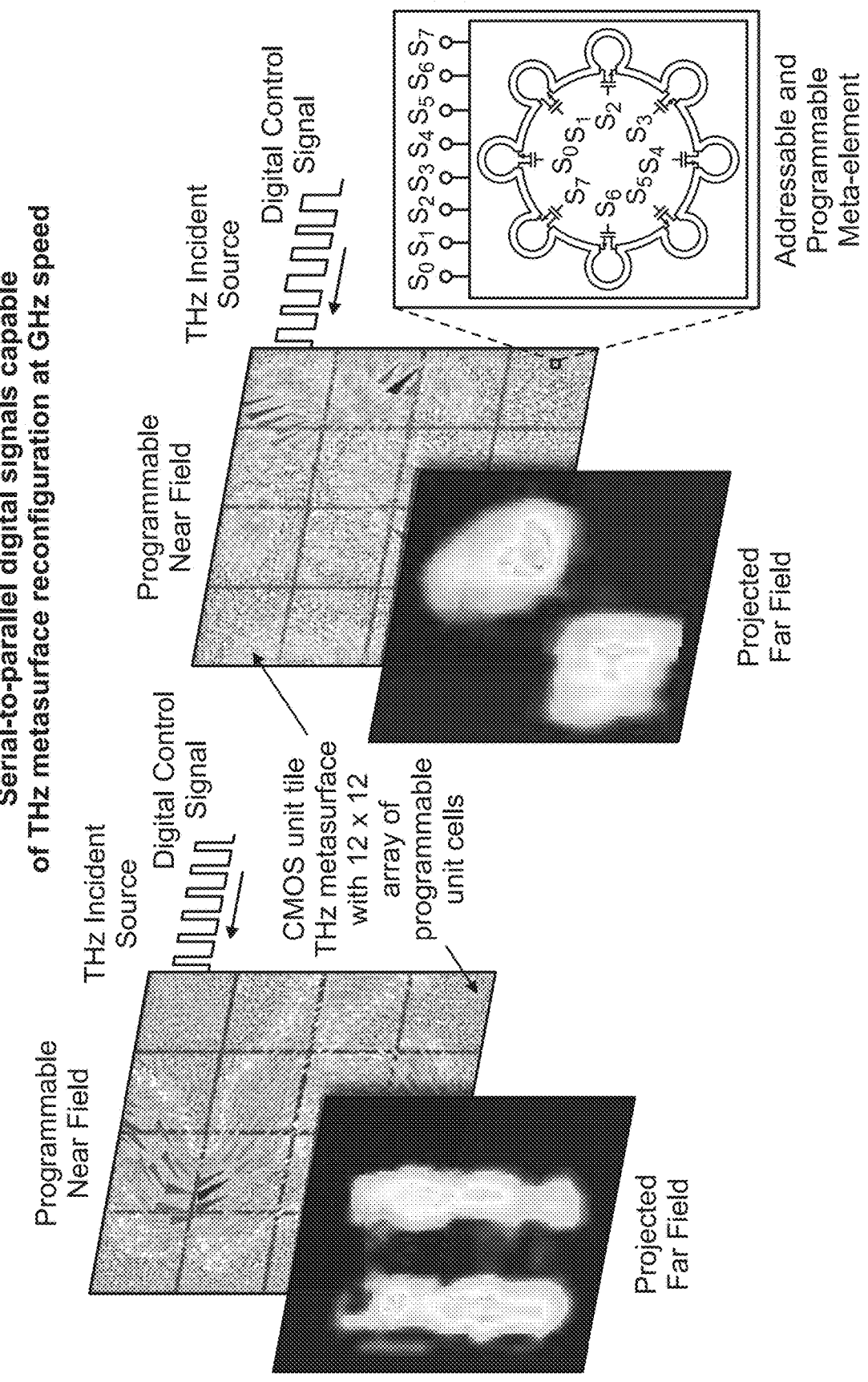
FIG. 1(a) depicts, with respect to a dynamically programmable and scalable terahertz metasurface with tiled silicon chips, a single silicon chip tile measuring 2 mm×2 mm, fabricated in an industry-standard 65 nm cmOS process, consists of a programmable two-dimensional array of 12×12 meta-elements. Active devices are embedded inside each meta-element that operate at terahertz frequencies, exploiting local resonances with the 8 embedded subwavelength microinductive loops. With 8 bits of control, the meta-element can be programmed to realize 84 different split-ring resonator structures, thereby changing the amplitude and phase response. The chip integrates a parallel-to-serial data conversion that can be programmed with a gigahertz clock signal. S, resonator input.
Figure 1C:
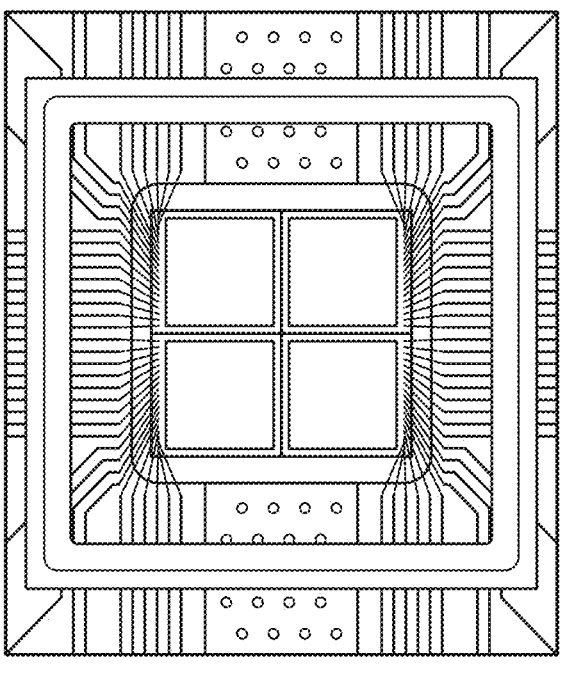
FIG. 1(c) depicts, with respect to a dynamically programmable and scalable terahertz metasurface with tiled silicon chips, a top view of the fabricated 2×2 tiled metasurface chips with quartz protection lid. The overall dimension of the active metasurface area is 4 mm×4 mm. The tiled chips are glued at the bottom to a high-resistivity silicon substrate. The chips are then wire bonded to a custom printed circuit board.
Figure 1D:
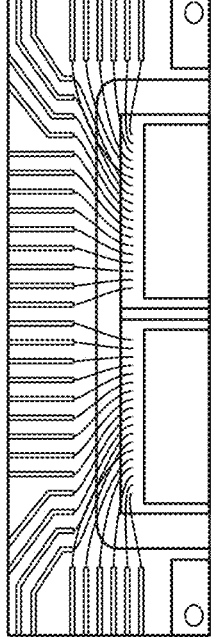
FIG. 1(d) depicts, with respect to a dynamically programmable and scalable terahertz metasurface with tiled silicon chips, a zoomed-in portion of the chip array and the packaging interface for voltage supply and digital control.
Figure 1B:
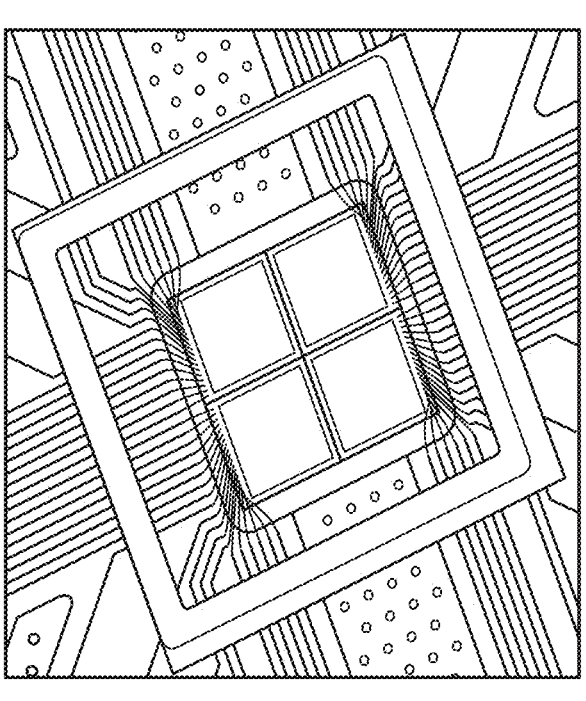
FIG. 1(b) depicts, with respect to a dynamically programmable and scalable terahertz metasurface with tiled silicon chips, a perspective view of the fabricated 2×2 tiled metasurface chips with quartz protection lid. The overall dimension of the active metasurface area is 4 mm×4 mm. The tiled chips are glued at the bottom to a high-resistivity silicon substrate. The chips are then wire bonded to a custom printed circuit board.

Disclosed herein is a modular approach to create programmable terahertz metasurfaces with fully integrated silicon chip tiles. Created were active meta-element structures by incorporating within each subwavelength passive meta-element multiple active devices, strongly coupled with deeper subwavelength inductive loops. Exploiting local resonances within the meta-element, the devices can operate like efficient switches even at terahertz frequencies. The digital codes for various configurations allow the structure to be reconfigured to assume different shapes, creating a multitude of amplitude and phase transformations (FIG. 1*a*).

Each chip incorporates an array of 12×12 elements. Each element is individually addressable and programmable with 8-bit control (FIG. 1b-d; see also FIG. 6). Using these chips as a unit tile, fabricated were 2×2 tile arrays, creating a surface with 576 meta-elements that are independently digitally reconfigurable at a maximum clock speed of 5 GHz. The capabilities of the metasurface include amplitude modulation with a switching depth of 25 dB, operation as a spatial light modulator, reconfigurable beamforming with phased surfaces, and programmable holographic projections at 0.3 THz.

Figure 2A:
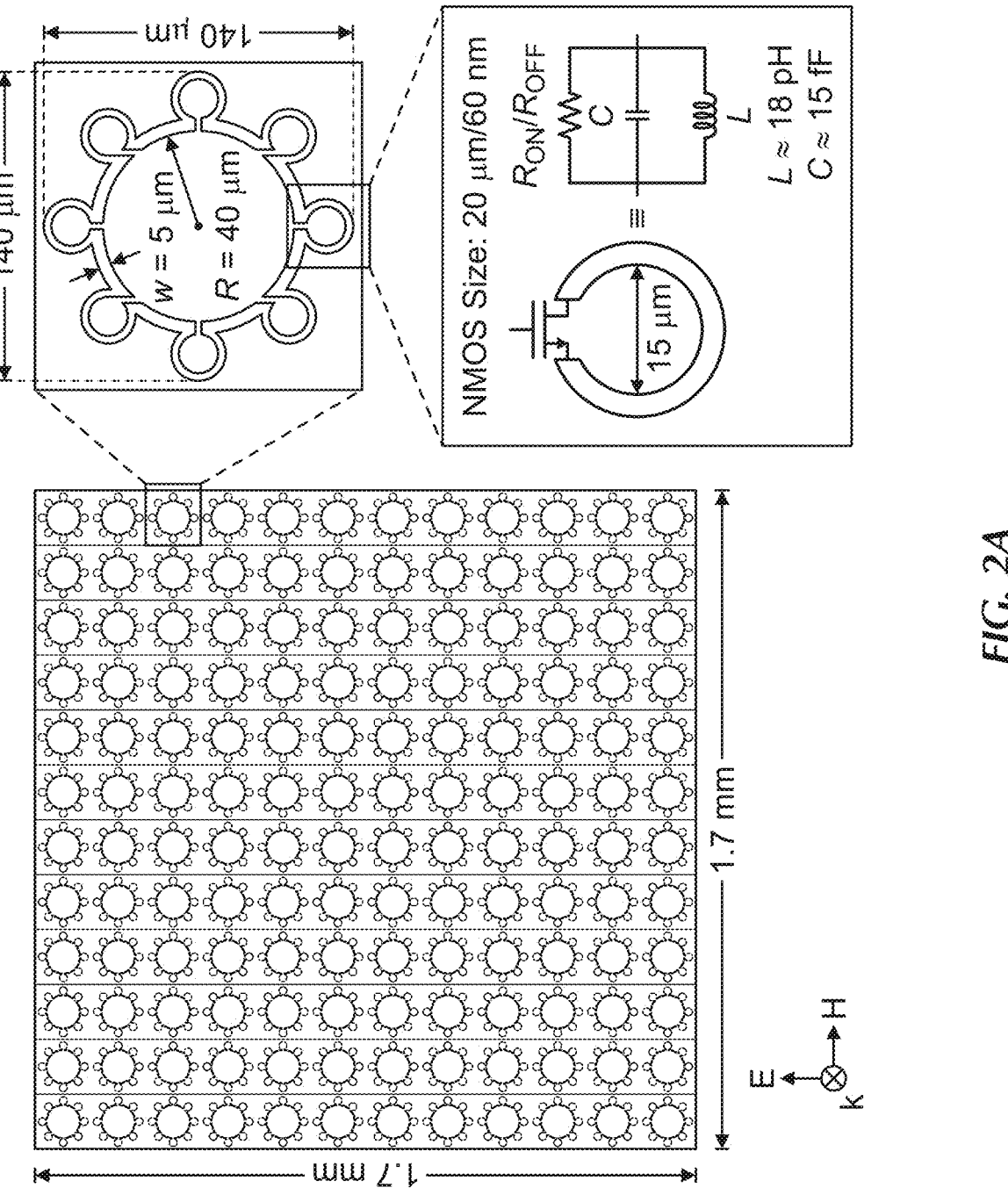
FIG. 2(a) depicts, with respect to a metasurface unit chip tile and the active metasurface structure and operation, a single metasurface tile chip with a 12×12 periodic array of meta-elements along with the zoomed-in portion of a single unit cell. A unit cell consists of a split-ring resonator structure with 8 integrated cmOS switches that allow an 8-bit reconfiguration of each cell. Eight subwavelength inductive loops are embedded in each unit cell to allow the switches to operate at gigahertz speed at 0.3 THz beyond theft of the devices.
Figure 2B:
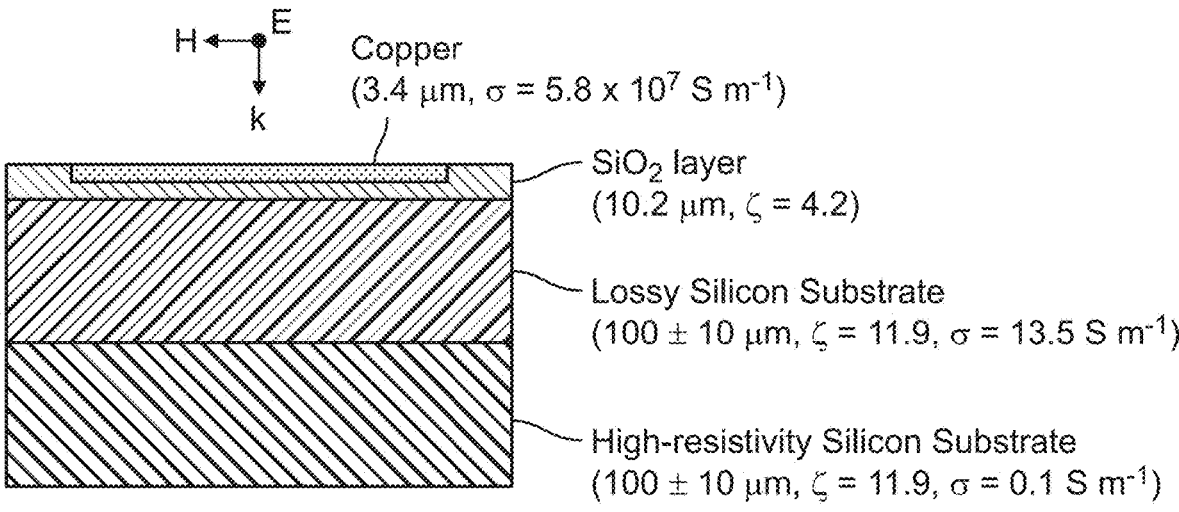
FIG. 2(b) depicts, with respect to a metasurface unit chip tile and the active metasurface structure and operation, the metasurface unit-cell material layers inside the cmOS chip.
Figure 2C:
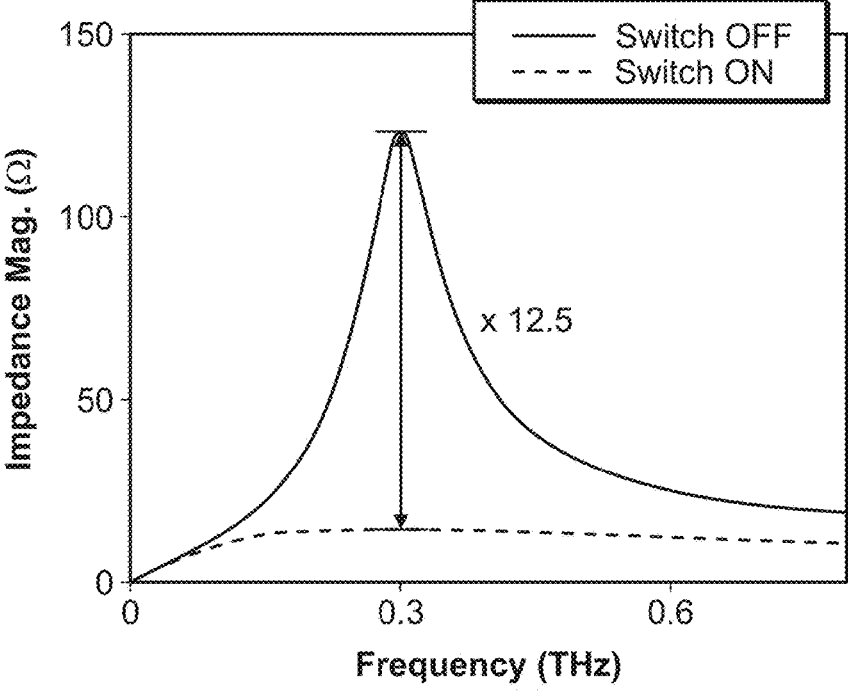
FIG. 2(c) depicts, with respect to a metasurface unit chip tile and the active metasurface structure and operation, a switch OFF/ON ratio enhancement of 12.5 fold at 0.3 THz is achieved by exploiting local resonances with the embedded subwavelength loops in the metastructure.
Figure 2D:
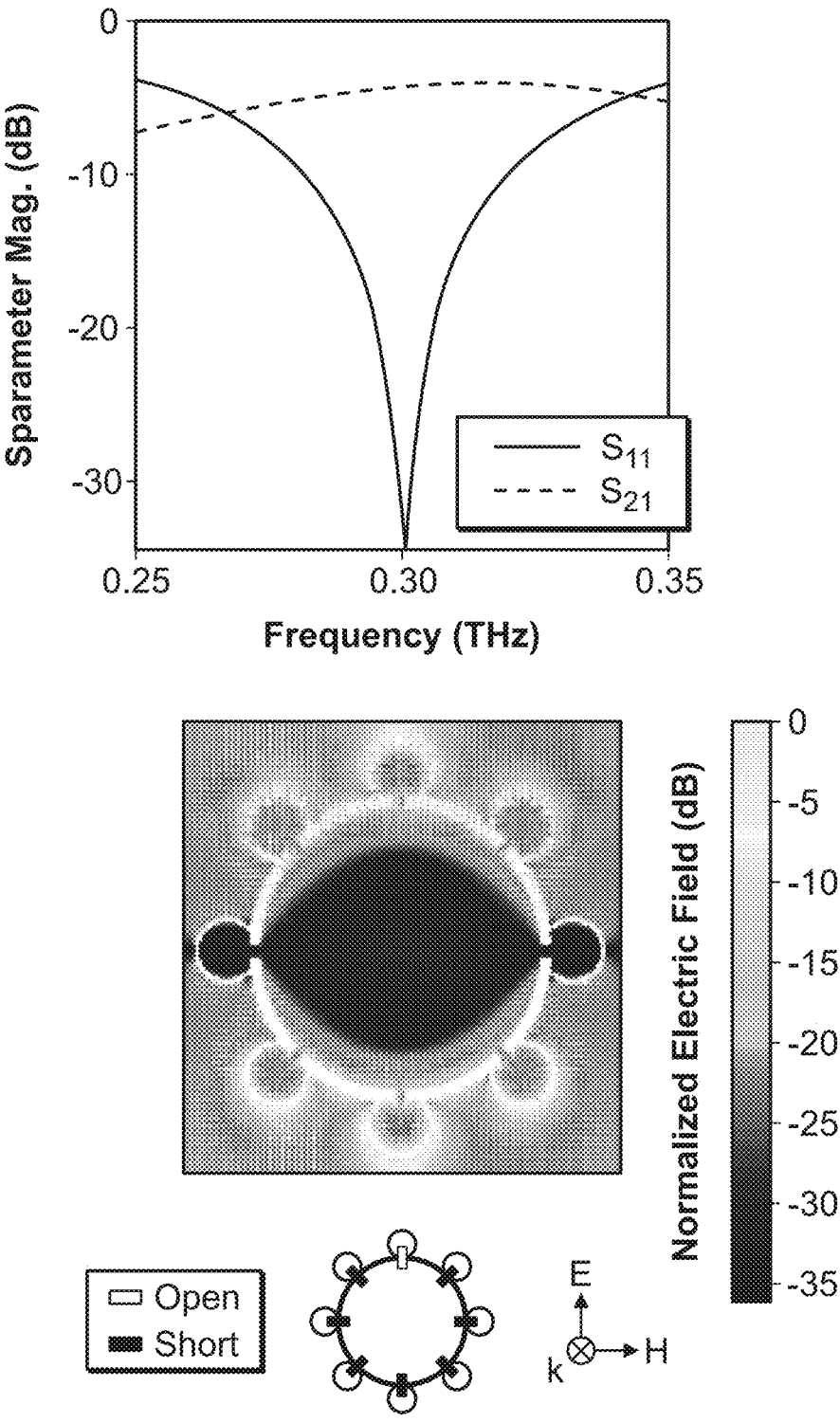
FIGS. 2(d-g) depict, with respect to a metasurface unit chip tile and the active metasurface structure and operation, the simulated S parameters as a function of frequency (top) and the corresponding simulated two-dimensional normalized electric field distribution (middle) for four coded settings at 0.3 THz demonstrating the field enhancement at the expected open switch position (bottom) and variation of the transmitted field amplitude across the various codes. mag., magnitude.
Figure 2E:
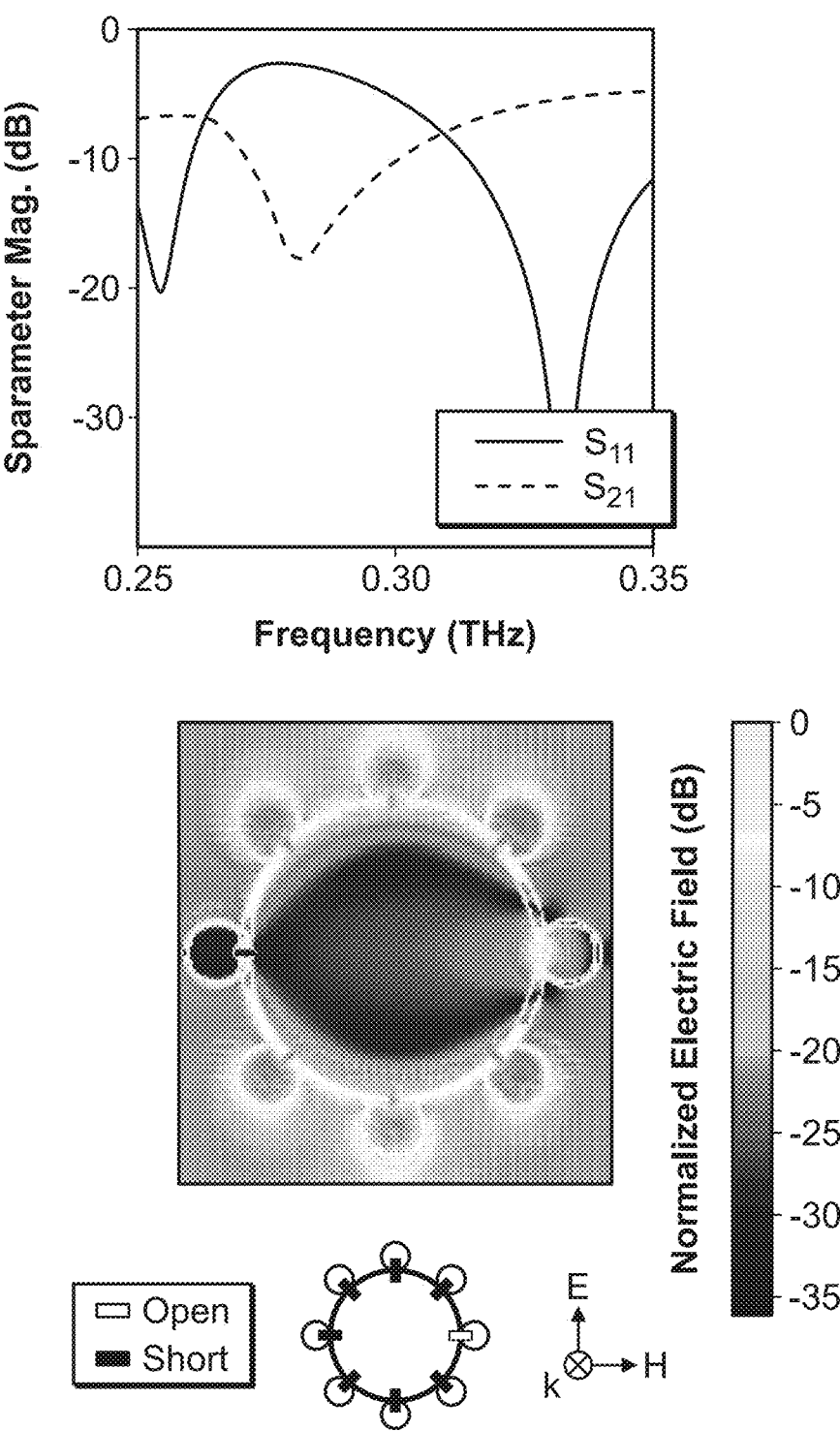
Figure 2F:
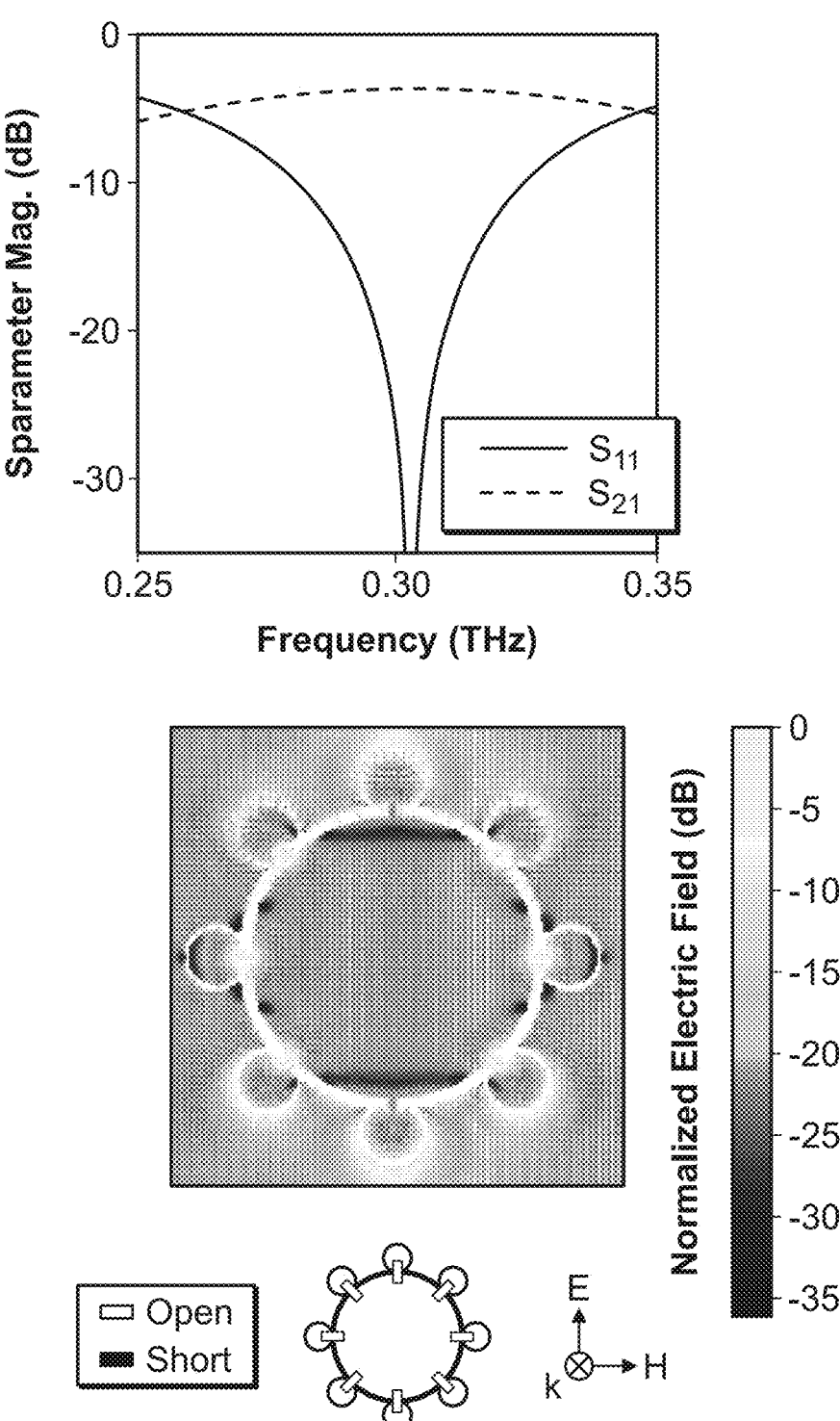
Figure 2G:
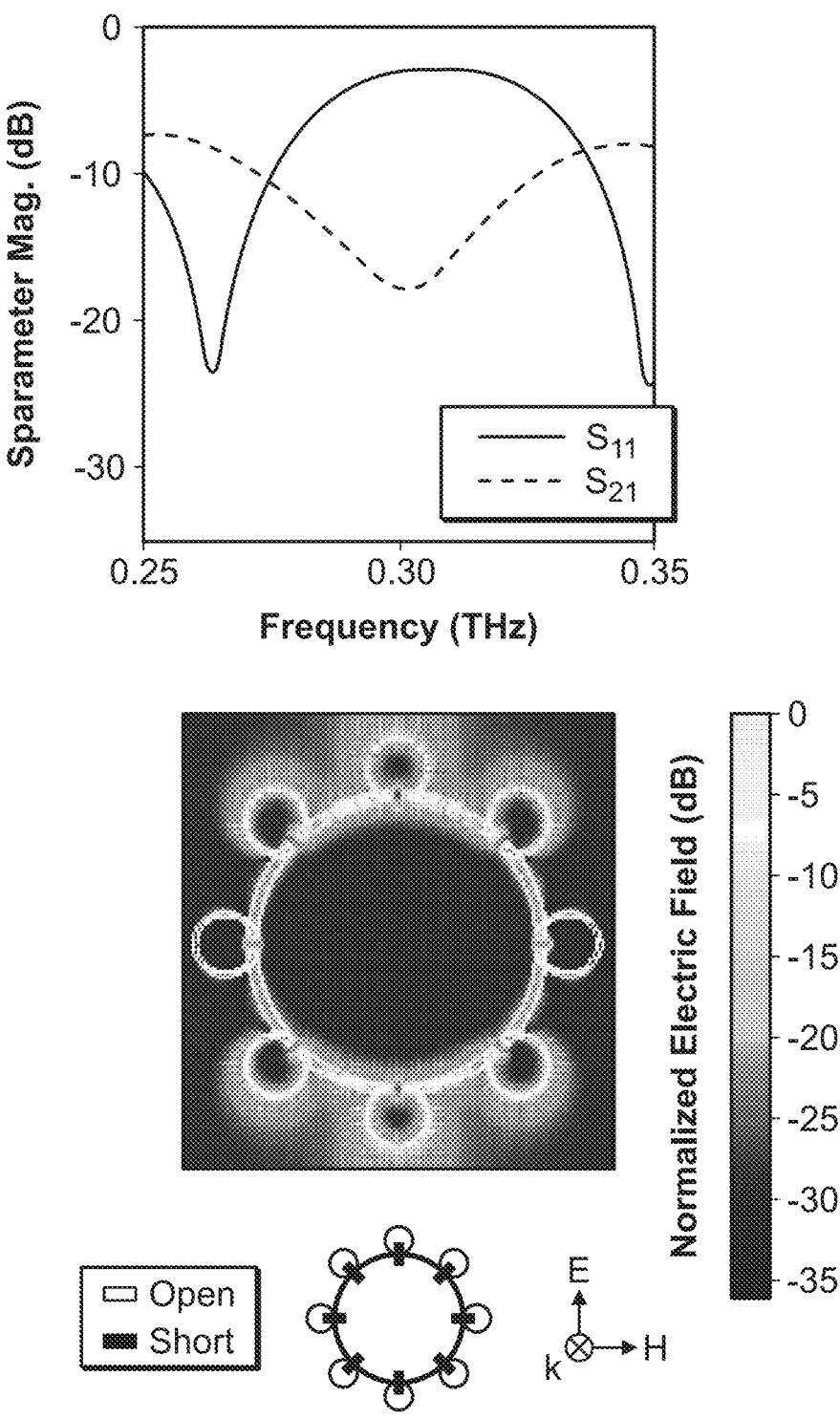

The unit silicon tile of the transmissive metasurface, which was fabricated in a 65 nm industry-standard complementary metal-oxide-semiconductor (CMOS) technology, is shown in FIG. 2a. The active meta-element, as shown in the zoomed portion of FIG. 2a, is based on a rapid reconfiguration of a structure that can be programmed to assume various C-shaped split-ring resonator structures with integrated CMOS-based devices. Each chip tile consists of a 12×12 array of these subwavelength active meta-elements spaced at $\lambda_0/7$ of the free-space wavelength. The active meta-element is designed on a 3.4-μm-thick embedded copper layer with a radius of R=40 μm (trace width, w=5 μm) and occupies an area of 140 μm×140 μm. The meta-elements are embedded inside a 10.2-μm-thick multilayer dielectric stack encompassing nine other copper metal layers that support the interconnect fabric of the chip (FIG. 2b).

A general C-shaped split-ring unit cell supports two symmetric and antisymmetric modes at frequencies where the loop length (l) assumes the values l≈mλ and l≈(2m+1)$\lambda/2$ (where m∈I). When a THz field is incident on a metasurface of C-shaped unit cells, the transmitted copolarized component of the incident field can be controlled by tailoring the Lorentzian response achievable with a periodic array of such C-shaped elements. In particular, there are two precisely independent methods of controlling the amplitude and phase of the transmitted field. The orientation of the aperture opening with respect to the incident polarization can control the transmitted amplitude (while maintaining almost the same phase), while changing the aperture gap between the ends can control the transmitted phase (while maintaining a similar transmitted amplitude).

To allow rapid reconfiguration between various geometries, each such element is broken into eight sectors that are connected with integrated CMOS switches (FIGS. 1a and 2a). The CMOS switch consists of an n-type metal-oxide-semiconductor (NMOS) transistor as shown in FIG. 2a. The configuration of each meta-element is then controlled by an 8-bit state, and the junctions can be ideally shorted or opened to realize the various orientations of the aperture for amplitude control and opening of the aperture for phase control (FIG. 2b). The ability for the meta-element to assume these various structural forms and thereby achieve amplitude and phase control is critically dependent on the switching performance of the integrated field-effect transistor (FET) device. The challenge is that these active FET-based devices are operating beyond their maximum frequency limit or transit frequency, $f_t$, which represents the frequency at which the current gain of the device reduces to unity.

As detailed herein, the switching ratio or the switch OFF/ON impedance ratio ($|Z_{OFF}/Z_{ON}|$) is related to the frequency of operation and f as $$|Z_{OFF}/Z_{ON}| \sim \frac{f_t}{f}.$$

Figure 7:
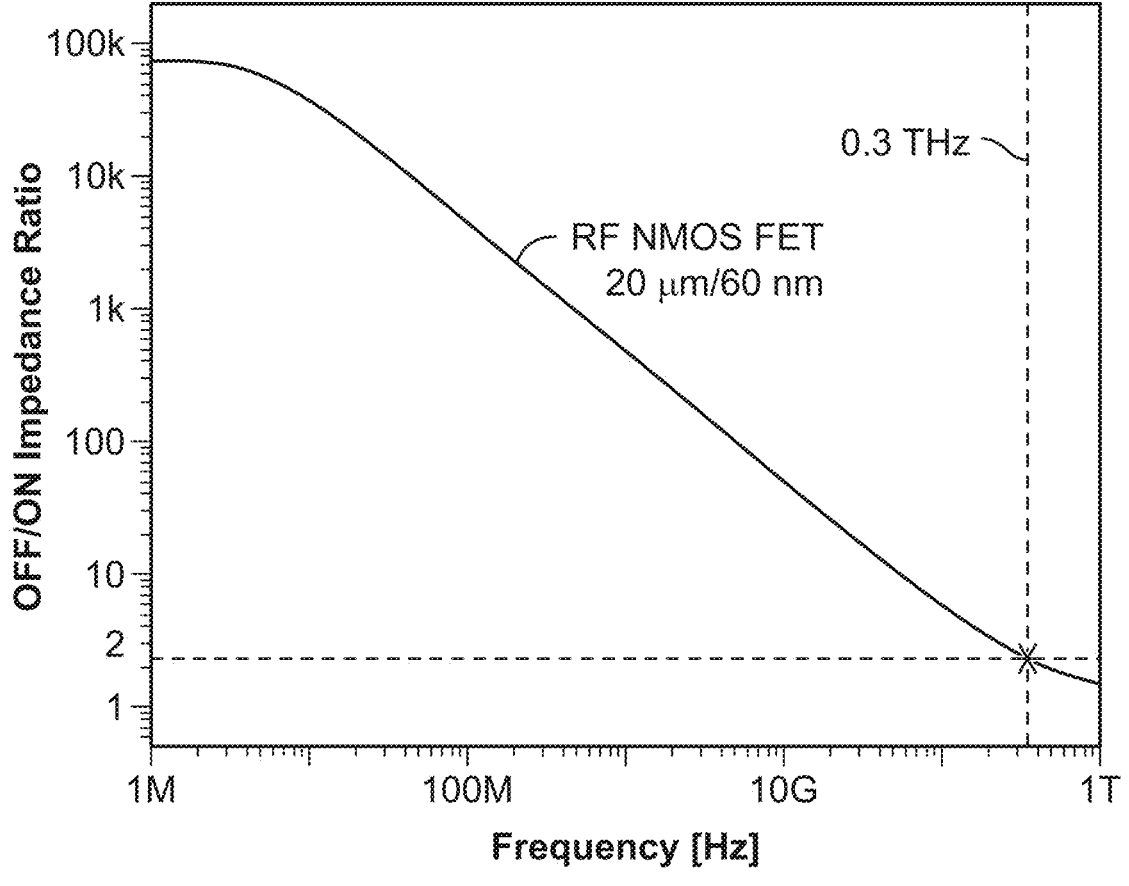
FIG. 7 depicts the simulated OFF to ON impedance ratio of a RF NMOS transistor with a sizing of 20 μm/60 nm operating in the deep triode region.

In the 65 nm CMOS process utilized in this work, $f_t$ is approximately 0.25 THz, and at 0.3 THz $|Z_{OFF}/Z_{ON}|$ falls to approximately 2 (FIG. 7).

To overcome this considerable leakage through the parasitic capacitance (C=15 fF) between these FET terminals near $f_t$, employed were eight subwavelength inductive loops (L=18 pH) in parallel with the CMOS switches that are distributed symmetrically across the meta-element structure to create an active meta-element (FIG. 2). The subwavelength loops and the CMOS switches create local resonance conditions at the frequency of interest (0.3 THz), creating a high-resistance path when the switch is open. The achieved $|Z_{OFF}/Z_{ON}|$ for a single CMOS switch is boosted by ~12.5 times at 0.3 THz as shown in FIG. 2c. This allows the entire structure to behave as one active meta-element capable of emulating the various meta-element geometries as the switch configurations are varied. These microloops have a radius of 7.5 μm with an effective inductance of L=18 pH (FIG. 2a).

The simulated S-parameter magnitudes as a function of frequency and the corresponding normalized electric-field distributions at 0.3 THz of the different reconfigurable meta-element states are shown in FIG. 2d-g. The S parameters are illustrative of the fact that the different metasurface states shape the frequency response of the surface, allowing control over both transmitted amplitude and phase. The field plots illustrate the expected field enhancement at the right gaps when the switches are open and modulation of field transmission through the surface across these four codes. The simulations are carried out in a three-dimensional electromagnetic finite-difference-time-domain simulator with periodic boundary conditions in both the transverse directions, which emulate an infinite two-dimensional array of repeating unit cells.

Figure 3A:
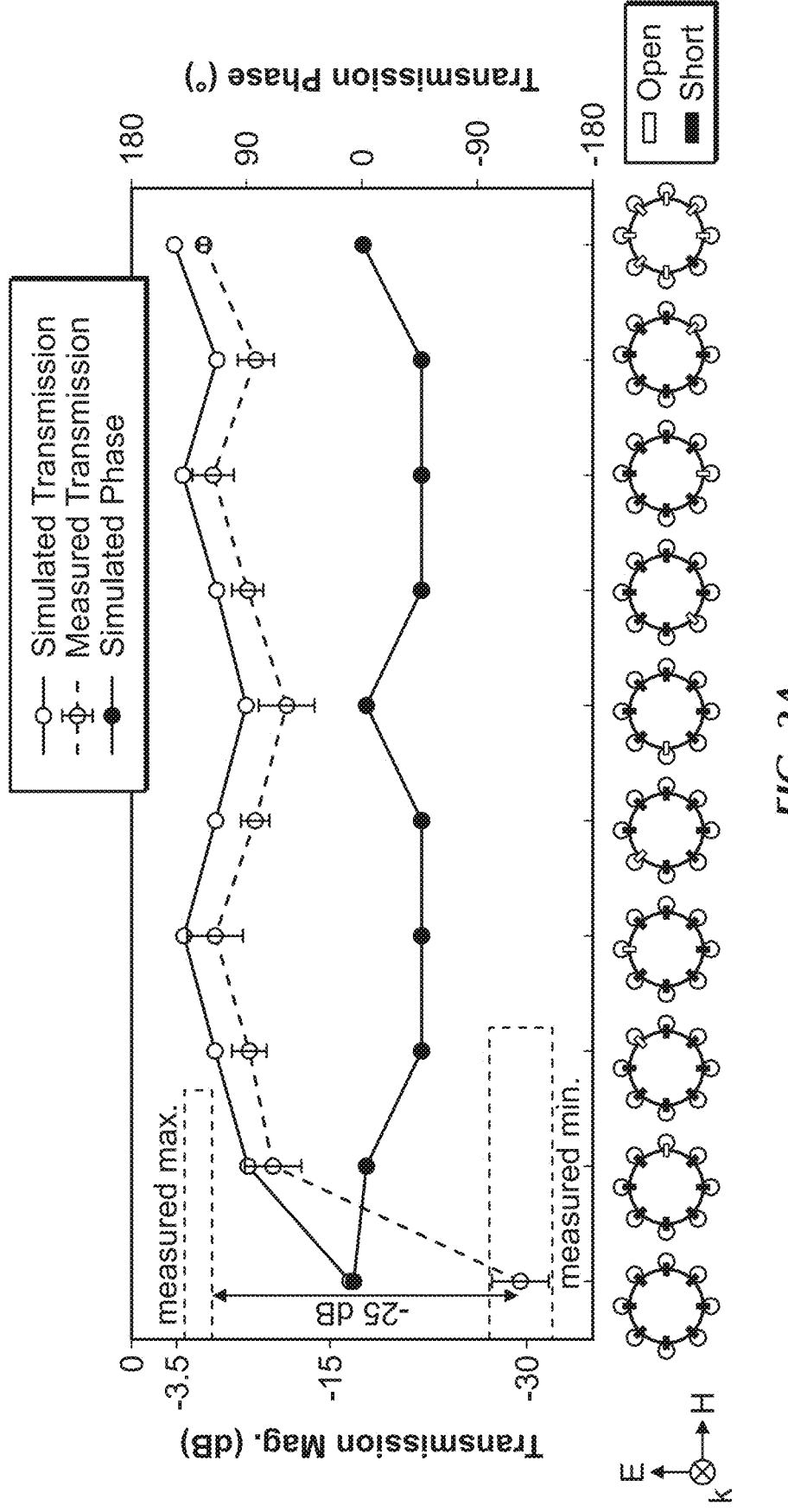
FIG. 3(a) depicts, with respect to a simulated and measured metasurface response, simulated transmission amplitude and phase plot at 0.3 THz when the c-shaped split-ring structure is rotated using a single open switch (bottom row). The plot also shows the corresponding measured transmission amplitude (blue dashed line) with a measured mean variation±1.6 db (error bars). The digital reconfiguration creates a rotating position of the open switch that realizes a rotating c-shaped aperture expected to modulate the amplitude without affecting the phase response. The highest suppression (~30 db) is achieved when all the switches are shorted.

The digital codes of the switch settings can now be mapped to the amplitude and phase profile of the metasurface at the resonant frequency of 0.3 THz. FIG. 3a shows the simulated and measured (dotted blue) transmission ($S_{21}$) amplitudes and simulated phase profiles as the position of a single open switch is circulated in the manner shown in the figure. The variation of the digital states is meant to realize various versions of the rotated C aperture for amplitude control. As expected, the amplitude of the transmitted field is modulated as the code setting is varied and the measured profile follows closely that of the simulation. The maximum achievable transmission amplitude variation is between the 'all-short' (FIG. 3a) and 'all-open' (FIG. 3b) unit-cell switch settings and was measured to be about ~25 dB.

Figure 3B:
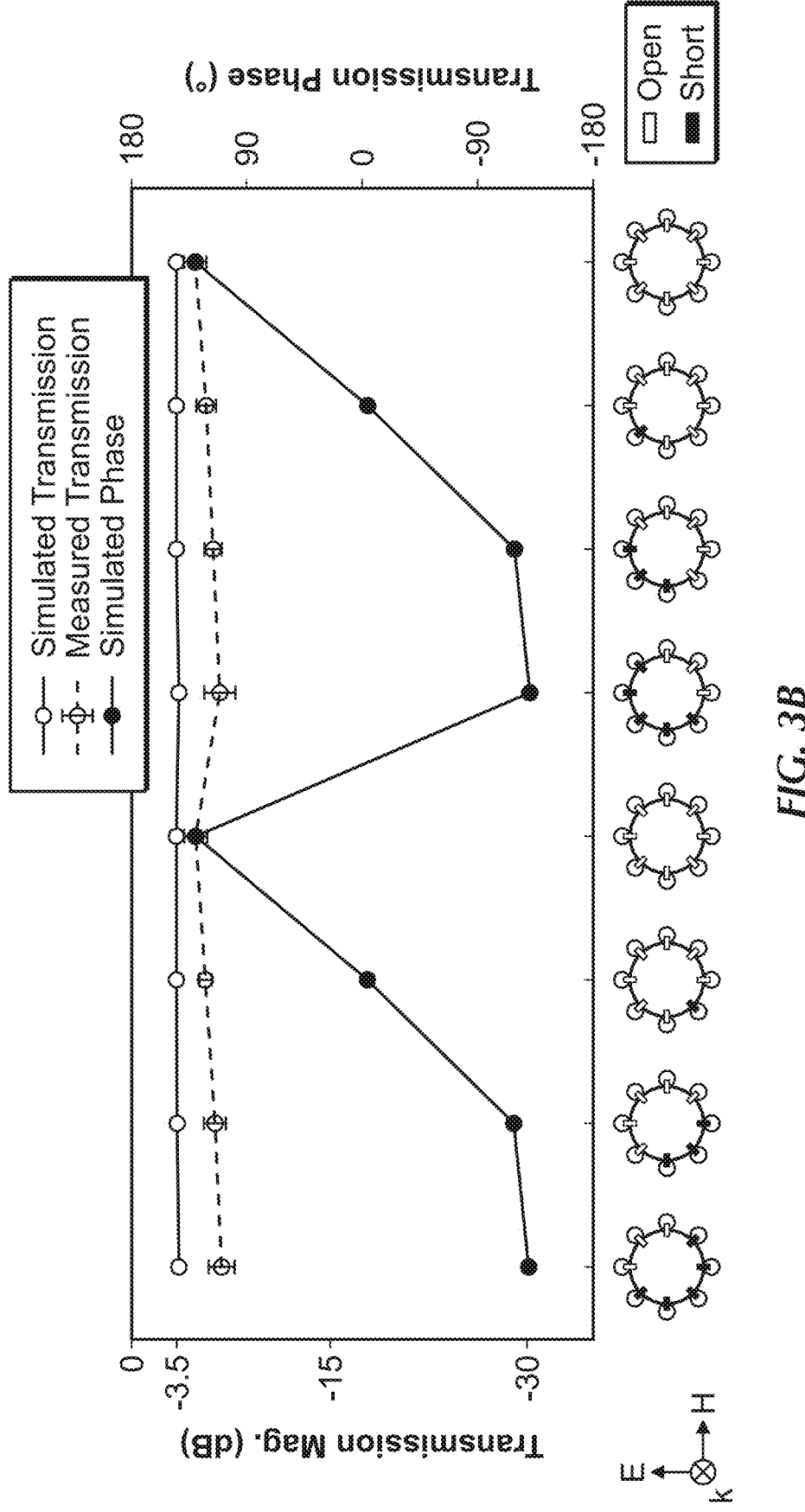
FIG. 3(b) depicts, with respect to a simulated and measured metasurface response, simulated transmission amplitude and phase plot at 0.3 THz when the c-shaped split-ring structure is widened by opening multiple switches (bottom row). The plot also shows the corresponding measured transmission amplitude (blue dashed line) with a measured mean variation±0.8 db (error bars). The simulated and measured transmission amplitudes take into account the calibration due to the front-end horn loss, metasurface dielectric loss and receiver back-end loss.

Similar to the amplitude control, by turning off the number of the active elements in the meta-element, one can realize an opening up of the aperture gap that can allow control of the transmission phase. An overall simulated phase change of 260° with minimal amplitude variation is shown in FIG. 3b. The physics of phase transformation of the incident field on the metasurface relies on controlled excitation of the eigenstates of the meta-element. This behavior can be abstracted to a frequency response of the surface. It can be noted that a second-order resonator-like frequency response can only achieve at most 180° of phase change (and practically much less). Therefore, to realize a phase change of 260°, a multiorder frequency response needs to be synthesized. These dynamics are captured in FIG. 2d and in FIG. 15, which demonstrate the existence of multiple resonances to cover such a large phase plane. This also allows effective amplitude and phase control.

It can be noted that, while ideally each meta-element state is supposed to allow independent control of amplitude and phase, the electronically actuated structure deviates from the behavior of the ideal C aperture. This creates a coupling mechanism between the two parameters (FIG. 3 (a-b)). As can be seen from FIG. 3a, the overall phase change observed across 25 dB of amplitude control is about 45°. On the other hand, the overall measured amplitude variation across these phase control states is less than 2 dB. As detailed in FIG. 11, the various states of the meta-elements need to take into account the ON and OFF resistances of the connected switches. In addition, when multiple successive switches are turned OFF to create the aperture opening for phase control, the floating metal pieces between these FETs can act as spurious scatterers, and their effect needs to be taken into account. In spite of these effects, one achieves 25 dB of amplitude control and 260° of phase control, and the amplitude-phase coupled states can be employed through a simple look-up table.

The measurement set-up, particularly the loss of the external receiver and mixer, and the capture efficiency of the near-field waveguide probe, limits us from directly measuring the phase change for different switch settings. This was demonstrated in measurement indirectly through beamforming by creating a phase gradient on the metasurface, as shown later.

Figure 3C:
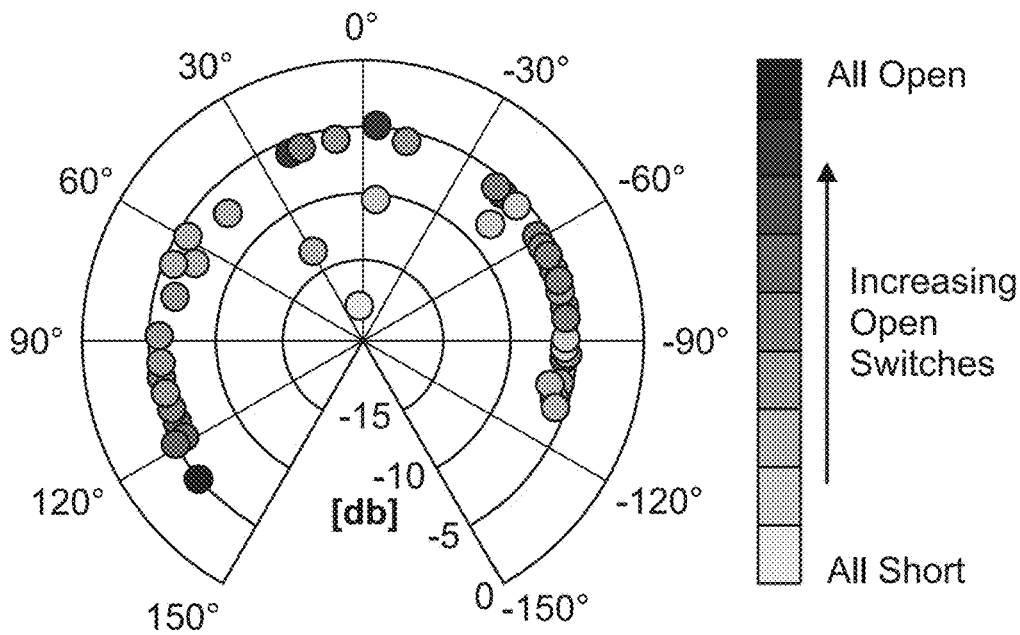
FIG. 3(c) depicts, with respect to a simulated and measured metasurface response, simulated transmission amplitude and phase transformations achievable at 0.3 THz for normal plane-wave incidence across the 84 unique code states for the meta-element.
Figure 16A:
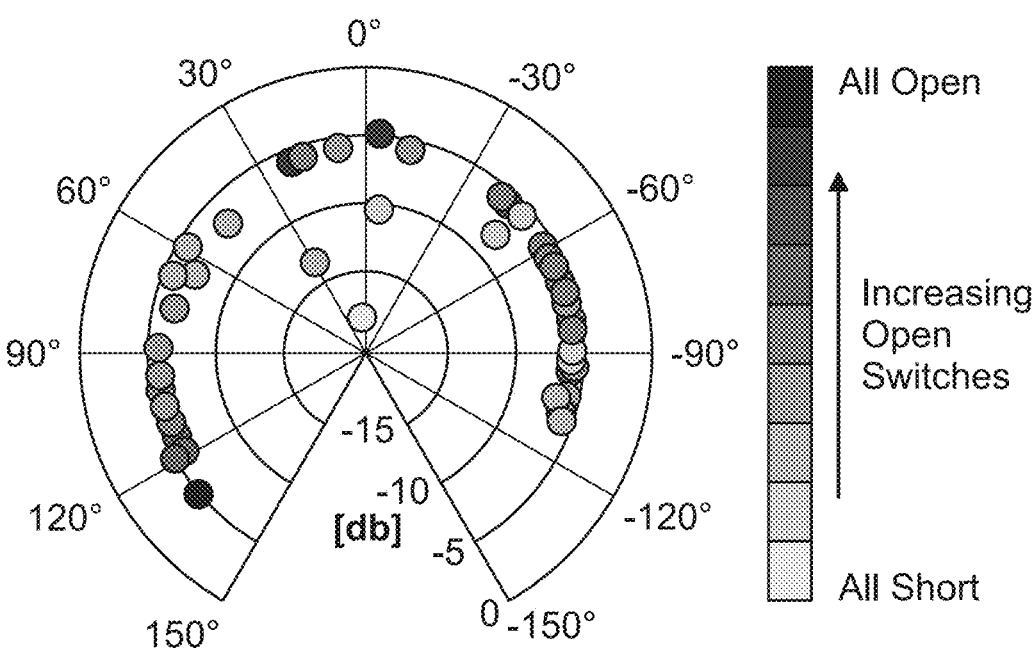
FIG. 16(a) depicts simulated S-parameter responses at 0.3 THz for different switch settings and different angle of incidences, showing the simulated transmission amplitude and phase for different switch settings at 0.3 THz for an incident plane wave at an angle of 30°.
Figure 16B:
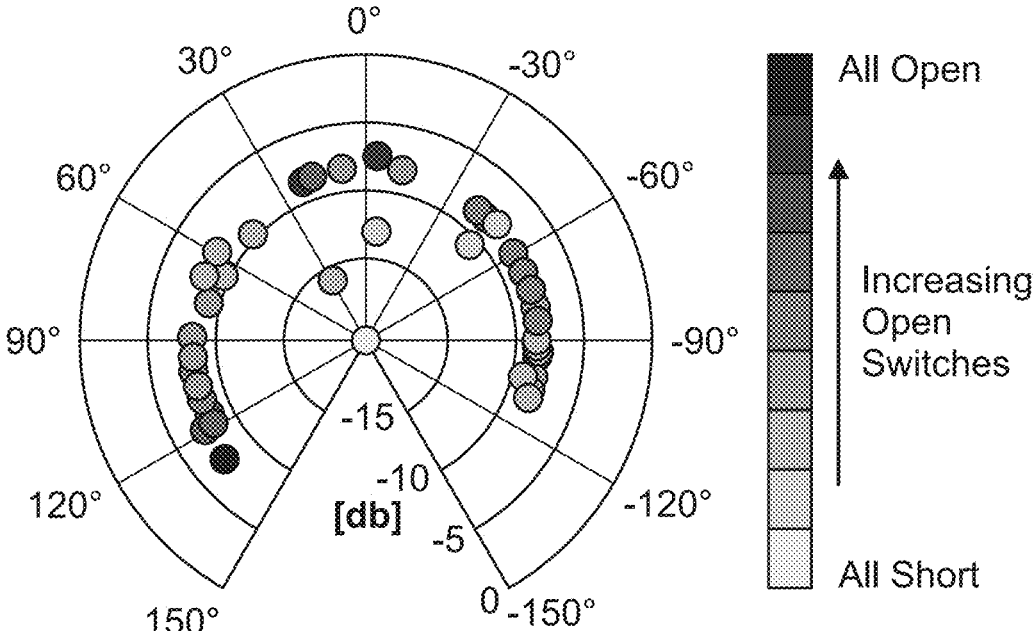
FIG. 16(b) depicts simulated S-parameter responses at 0.3 THz for different switch settings and different angle of incidences, showing the simulated transmission amplitude and phase for different switch settings at 0.3 THz for an incident plane wave at an angle of 45°.

Combining both amplitude and phase control, each meta-element can be reconfigured across 256 states (8 bits). Discounting the ones that produce identical amplitude and phase transformations due to symmetry, there remain 84 unique codes for each element. FIG. 3c shows the simulated transmission-amplitude and phase-control map for these 84 states demonstrating amplitude control of ~17 dB to ~3.5 dB and phase control across 260° at 0.3 THz. The design inherently preserves the unit cell's four-fold symmetry, which makes the metasurface agnostic to incident electric-field polarization. In addition, the individual element-level programmability allows the metasurface to perform similar functions for angular incidences as well (FIG. 16).

Figure 11A:
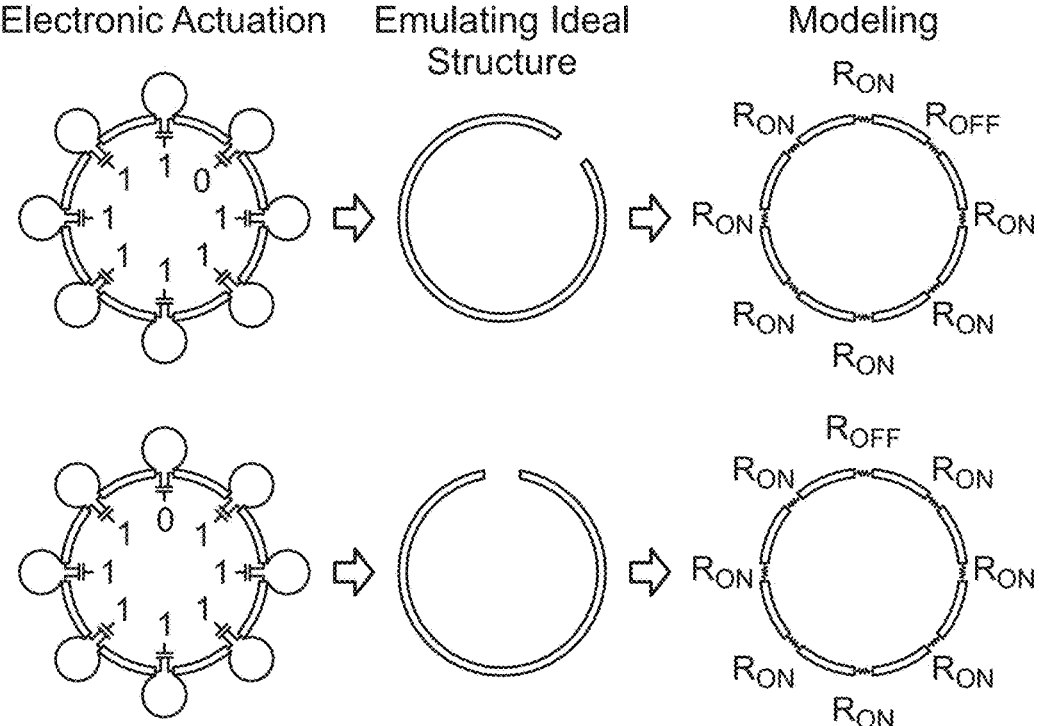
FIG. 11(a) depicts, with respect to a programmable meta-element for amplitude and phase control, an amplitude control and meta-element model.
Figure 11B:
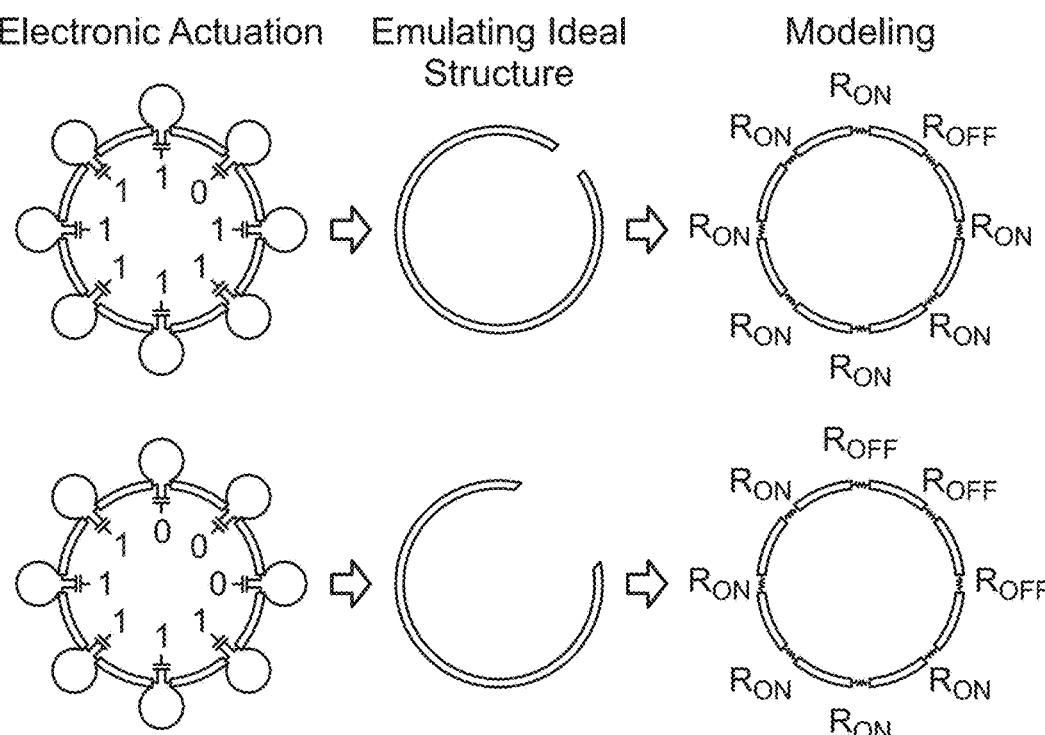
FIG. 11(b) depicts, with respect to a programmable meta-element for amplitude and phase control, a phase control and meta-element model.

The transmitted field strength is evidently a function of the metasurface programming state. When configured for optimal transmission, the major contributor to insertion losses is the lossy silicon substrate ($\sigma_{sub} \approx 13.5$ S m$^{-1}$). The simulated efficiency through the substrate is 64% (~2 dB loss), and the metal and the switch losses contribute another ~1.5 dB. To allow for suppression of reflection at the incident surface, the total silicon substrate is kept at 200 μm, which serves to maximize $S_{21}$ and minimize the reflection coefficient (S11) at 0.3 THz, as detailed herein. The substrate loss is dependent on the choice of the current CMOS technology, and migrating to a high-resistivity substrate process (such as 45 nm silicon-on-insulator) can nearly eliminate the losses, leading to a net loss of ~1.5 dB. This residual loss arises primarily from the insertion losses of the switches. This is taken into account in the unit-cell design and in simulations by modelling the switches as variable resistors in parallel with a capacitor resonating with the subwavelength inductive loop (FIG. 11).

Figure 3D:
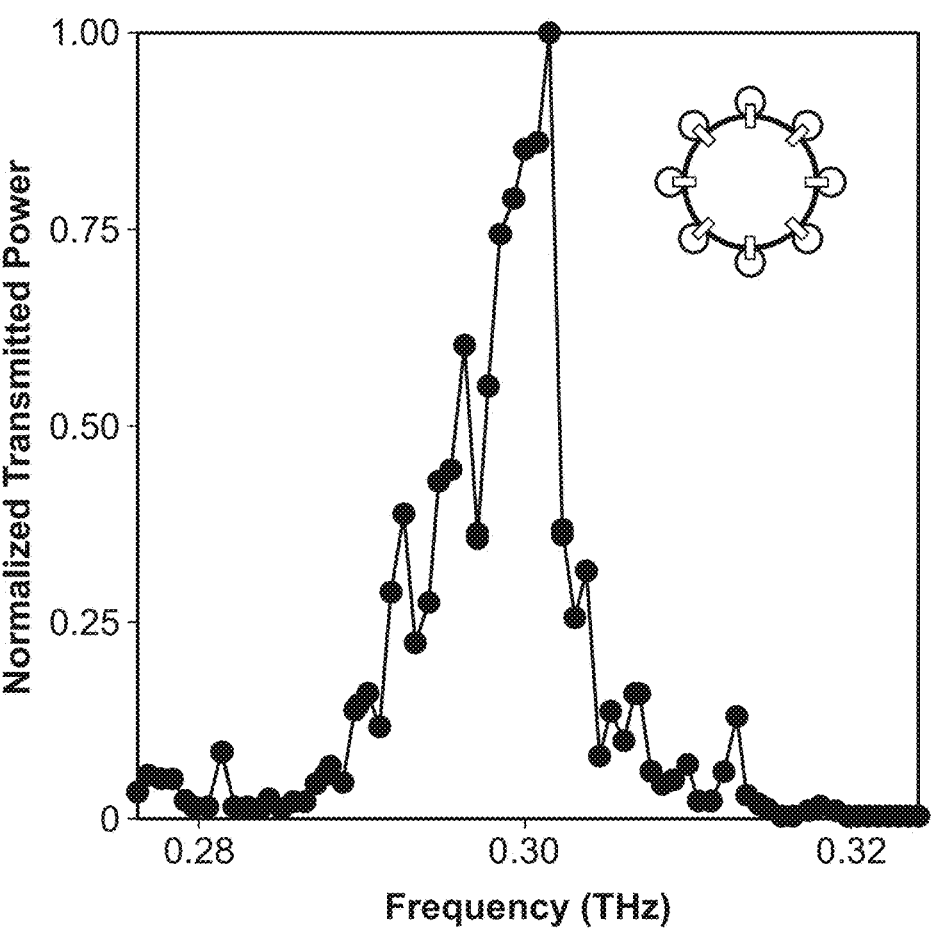
FIG. 3(d) depicts, with respect to a simulated and measured metasurface response, measured transmitted power demonstrating peak transmission at the expected frequency of 0.3 THz due to the local resonance of the subwavelength loops and the cmOS switches.

The metasurface is characterized by exciting the array with a terahertz Gaussian beam and measuring the copolarized transmitted field distribution at various distances with an open-ended waveguide probe. The details of the set-up are described herein (see also FIGS. 17 and 18). First, the frequency response was measured with all switches open. As shown in FIG. 3(d), this results in a symmetric metastructure state allowing maximal transmission independent of polarization. While the C-shaped meta-element itself is fairly broadband between the first antisymmetric and symmetric modes in its capability of controlling the amplitude and phase of the transmitted wave, the frequency response steps primarily from the local resonances at the eight distributed sites between the embedded inductive loops and the CMOS device capacitance. One varies the input frequency from 1.28 to 0.32 THz and the measured normalized power spectrum peaks at the expected frequency at 0.302 THz, where the CMOS switches demonstrate the largest $|Z_{OFF}/Z_{ON}|$.

Figure 8A:
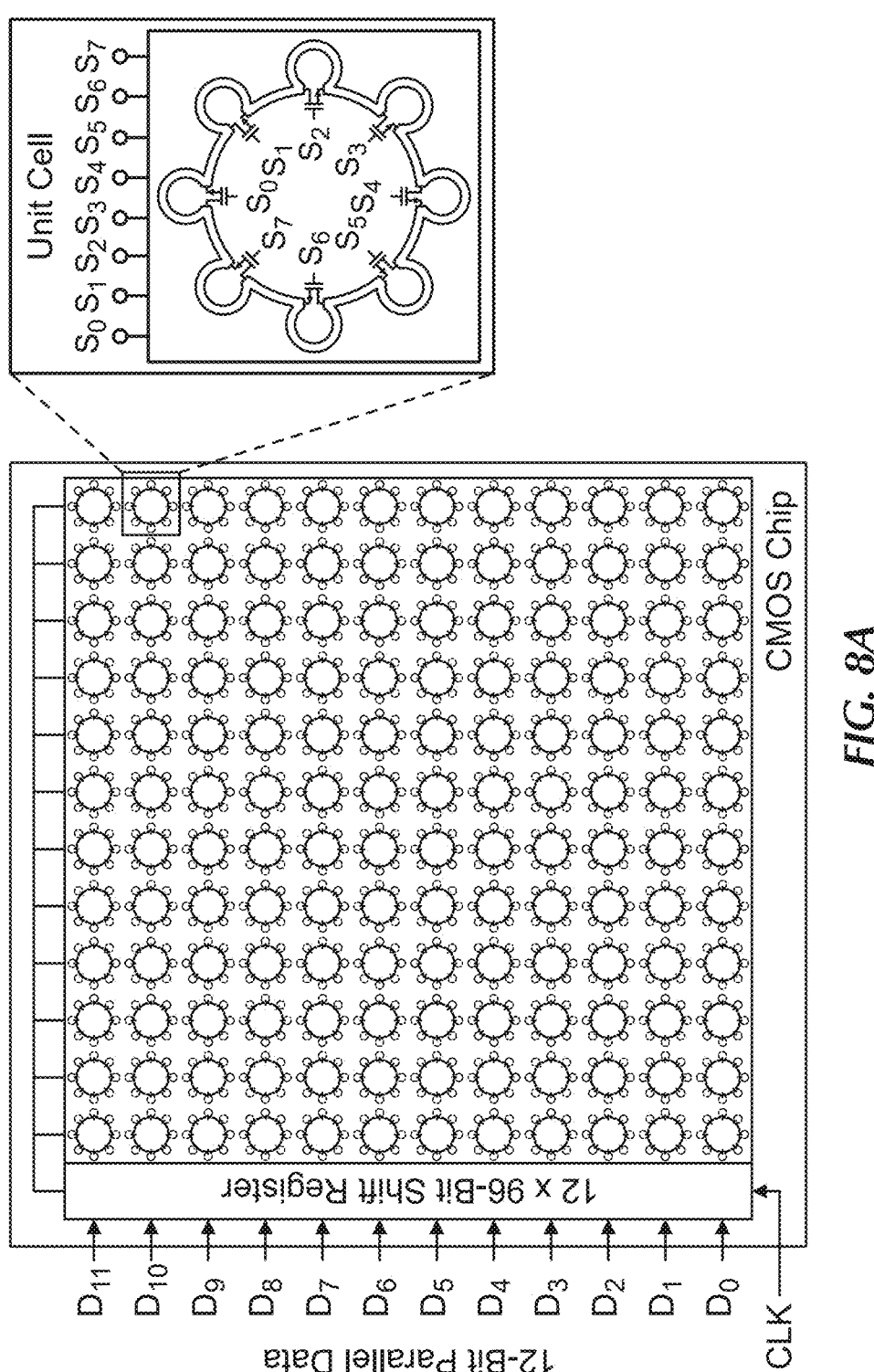
FIGS. 8A and 8B depict the CMOS metasurface integrated chip architecture. The control signal for each meta-element/unit cell is provided through an 8-bit shift register. The sizing of these transistors is also shown. One metasurface tile in total consists of 144 meta-elements. Each row is controlled independently through a 96-bit serial-to-parallel shift register. All the shift registers are controlled through a common clock signal.
Figure 8B:
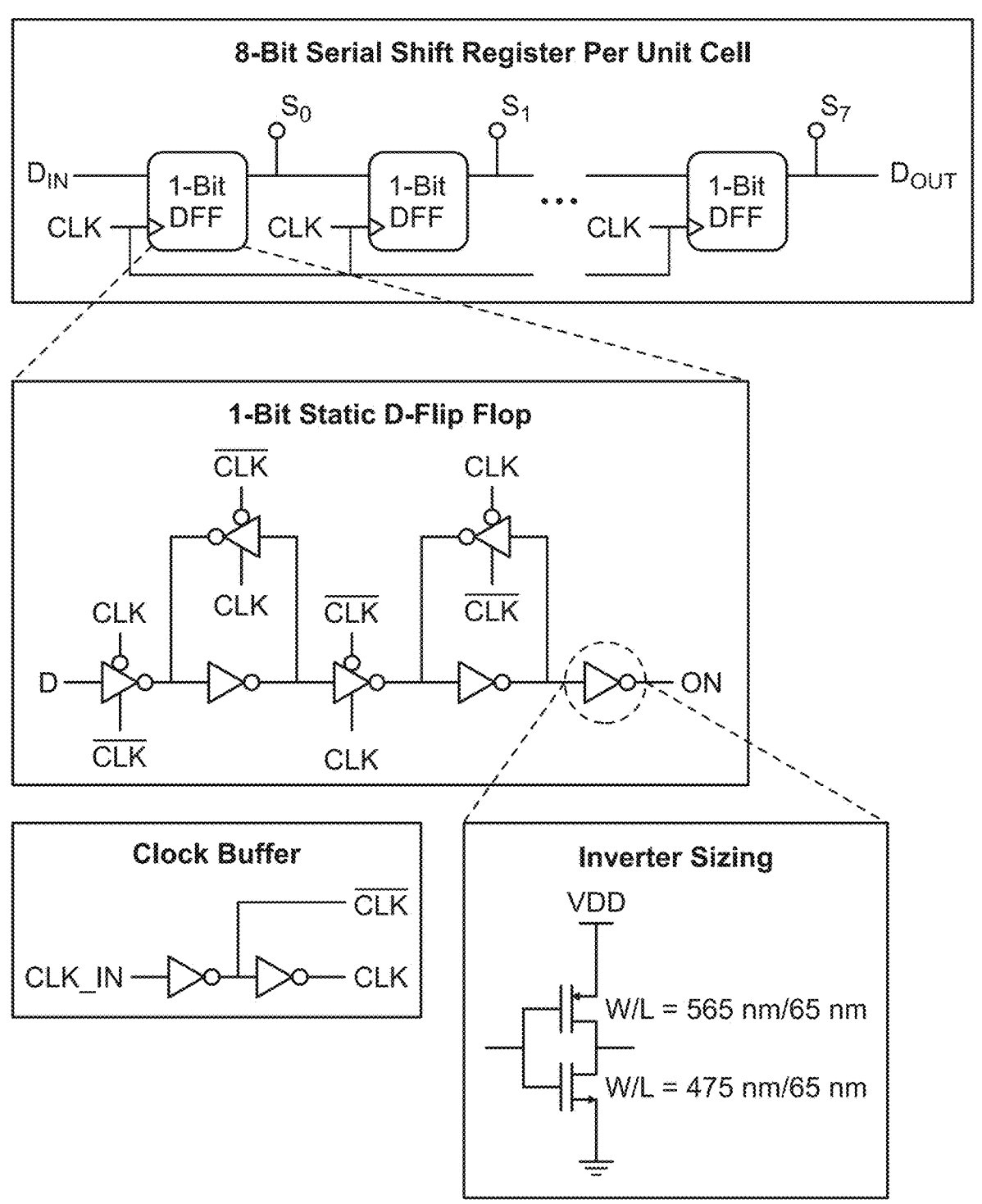

The metasurface packaging and the control interface are shown in FIG. 1. The lossy bulk silicon substrate lying underneath the dielectric stack is thinned to ~100±10 μm and glued to a high-resistivity silicon substrate of thickness ~100±10 μm. The added silicon layer creates an optimal transmissive property at 0.3 THz, and provides a common substrate for the tiled metasurface as shown in FIG. 2a. The chips are enclosed in a thin quartz lid to protect the chip surface and the wirebonds to the printed circuit board. The high-speed digital control of the CMOS switches is enabled through a 96-bit on-chip serial-to-parallel shift register (FIGS. 8A, 8B). The digital signals are carefully routed in these lower metal layers inside the chip, which minimally affect the transmissive property of the metasurface. The integrated chip (silicon tile) operates at 1.2 V with a static power consumption of 240 μW. While demonstrated for a 2×2 tile array, the architecture is fully programmable, modular and scalable to wafer-scale dimensions (FIG. 1b).

The electromagnetic unit cell can be realized either on a semiconductor chip or on a printed circuit board connected to the semiconductor chip that contains the switches.

Figure 4B:
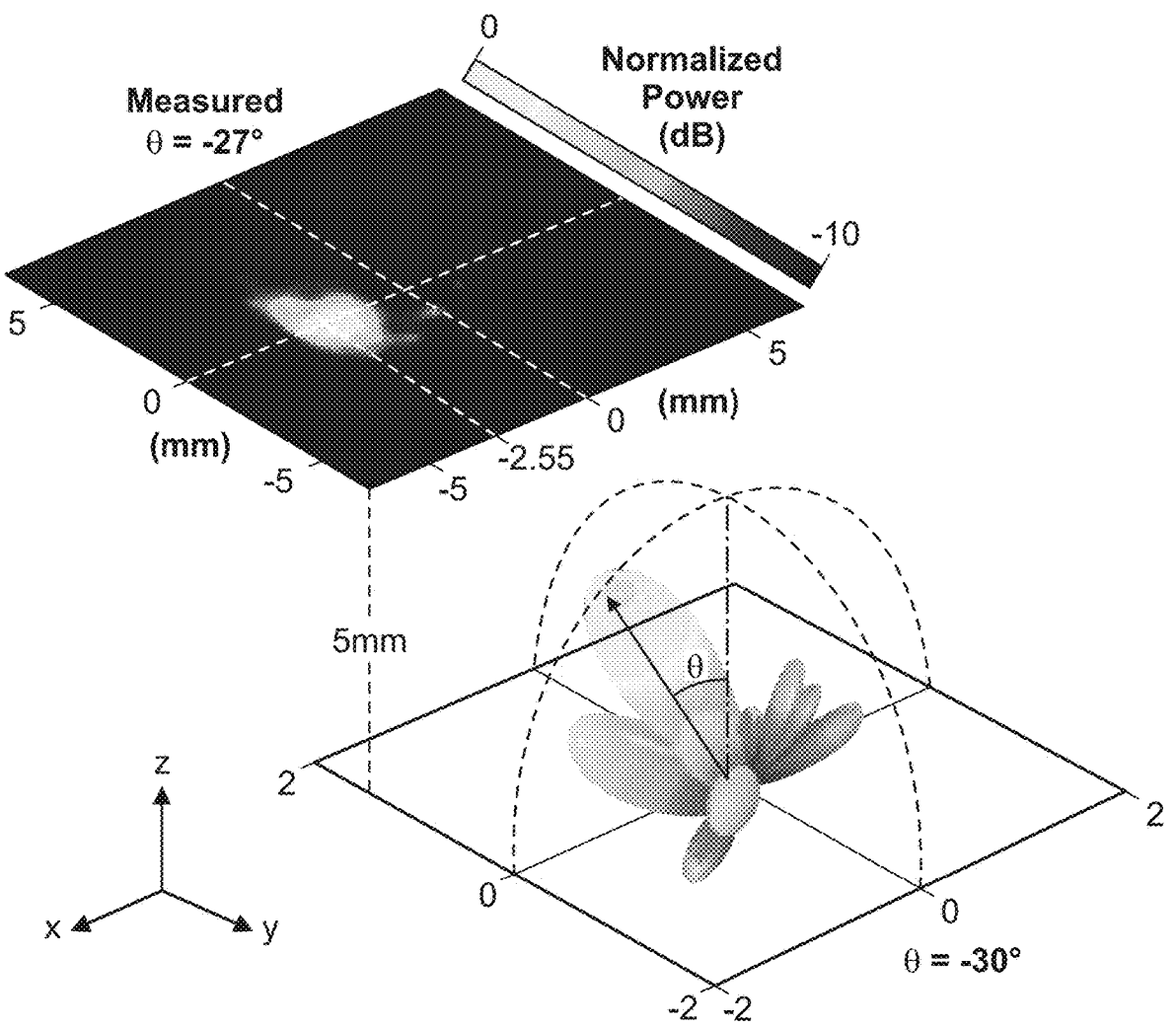
FIG. 4(a) depicts, with respect to programmable terahertz beamforming, simulated beamforming due to linear phase gradients along one axis of the metasurface (left). A group of four unit cells is consecutively set to a particular digital setting to achieve a specific linear phase gradient (middle). Three different phase profiles along with the corresponding meta-element digital settings are also shown (right).
FIGS. 4(b-d) depict, with respect to simulated and measured beamforming at ~30°, 0°, and +30°, respectively, at 0.3 THz. The measurements demonstrate close correspondence with simulation.
FIG. 4(e) depicts the measured ON/OFF ratio of the transmitted wave across the metasurface for the two digital states (all open and all short) as the clock frequency is varied from 1 mHz to 8 GHz. The measured amplitude depth modulation is about ~25 db up to 5 GHz with a variation of about ±1 db (error bars), enabling high-speed spatial light modulation.
Figure 4C:
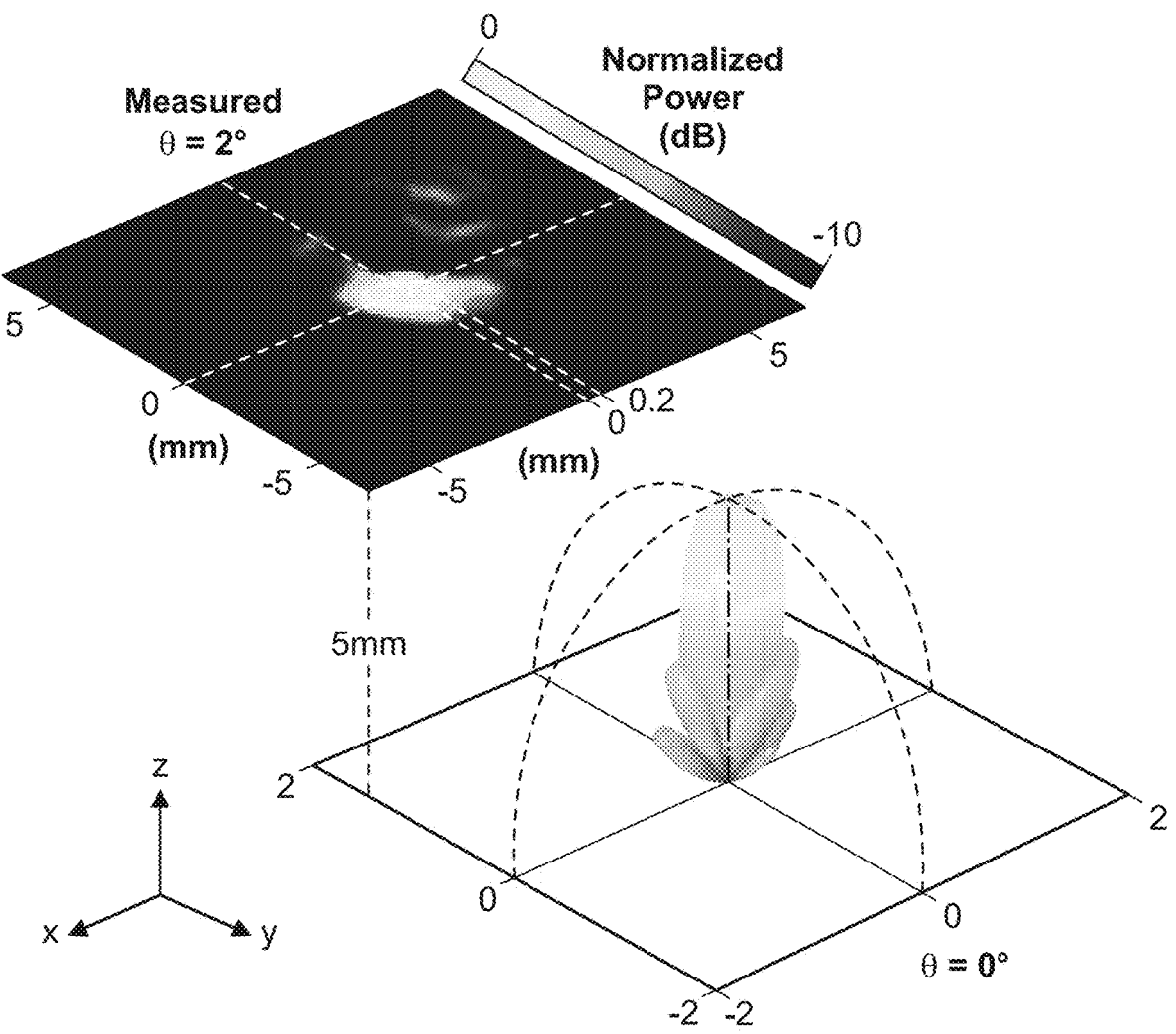
Figure 4D:
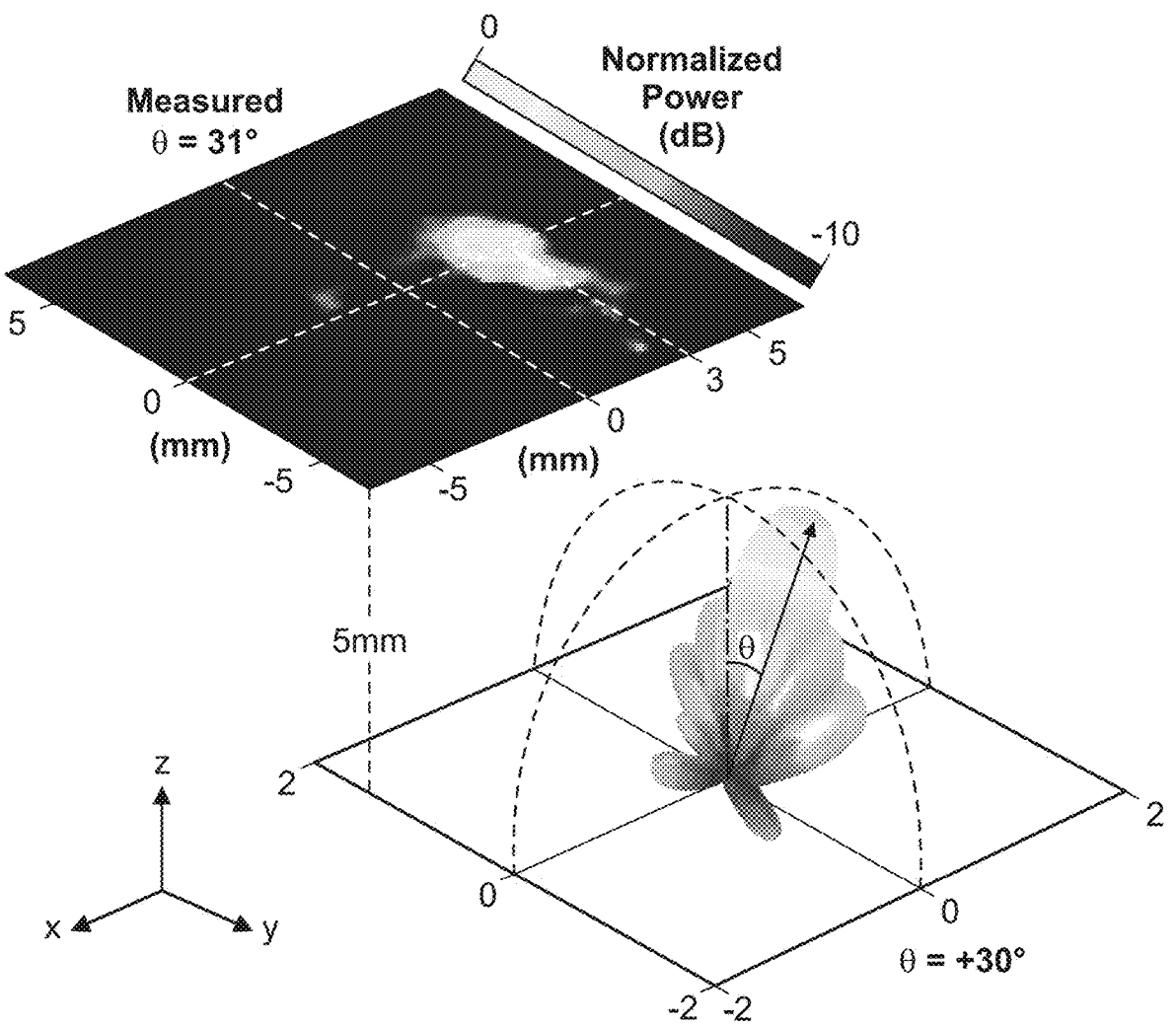
Figure 4E:
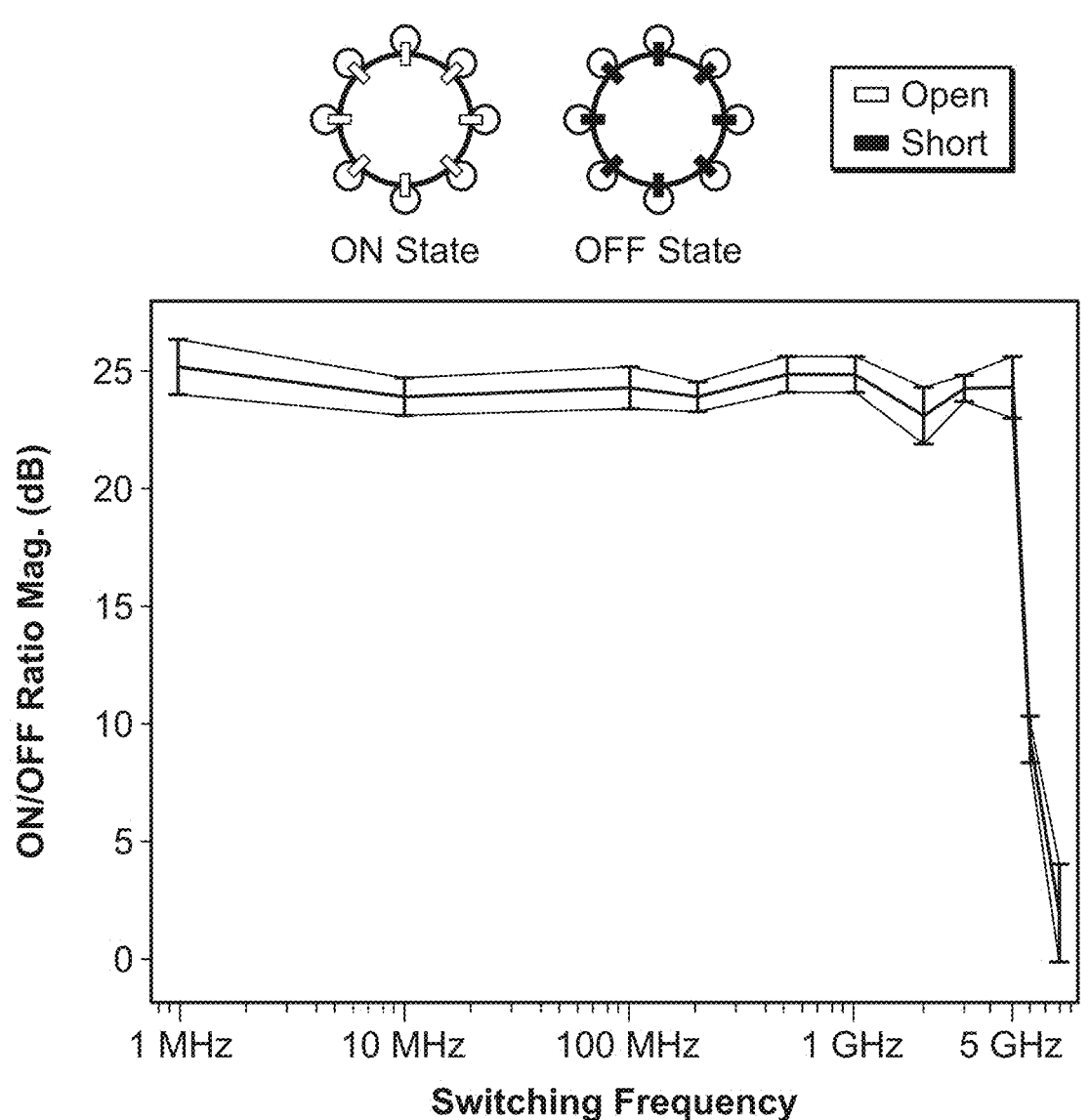
Figure 5A:
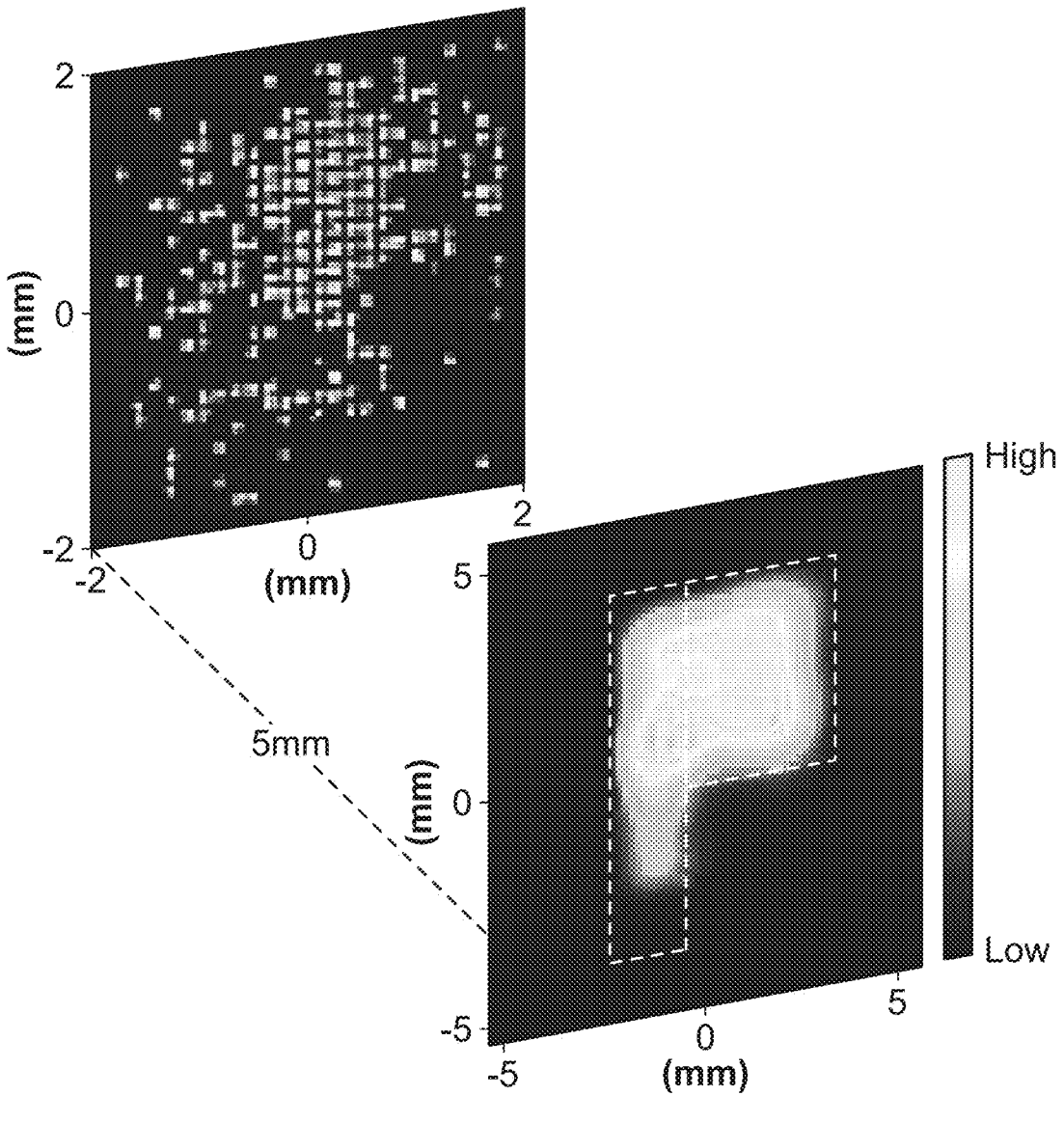
FIG. 5(a) depicts, with respect to programmable holographic projections, a,b, coded meta-element states across the 2×2 cmOS array and simulation of holographic projections of letter 'P' at a distance of 5 mm. Color bars represent normalized power intensity.
Figure 5B:
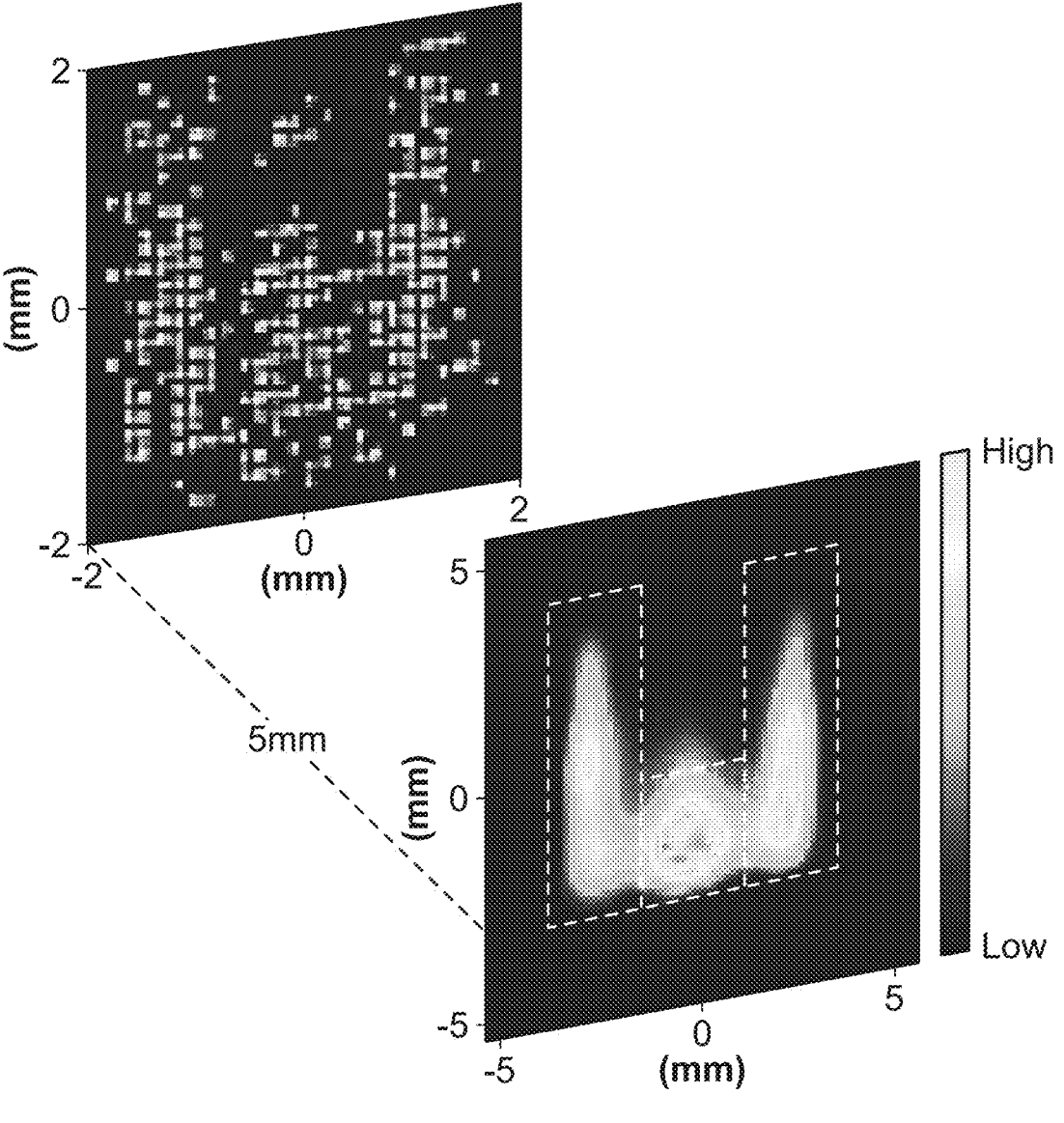
FIG. 5(b) depicts, with respect to programmable holographic projections, coded meta-element states across the 2×2 cmOS array and simulation of holographic projections of letter 'U' at a distance of 5 mm. Color bars represent normalized power intensity.
Figure 5C:
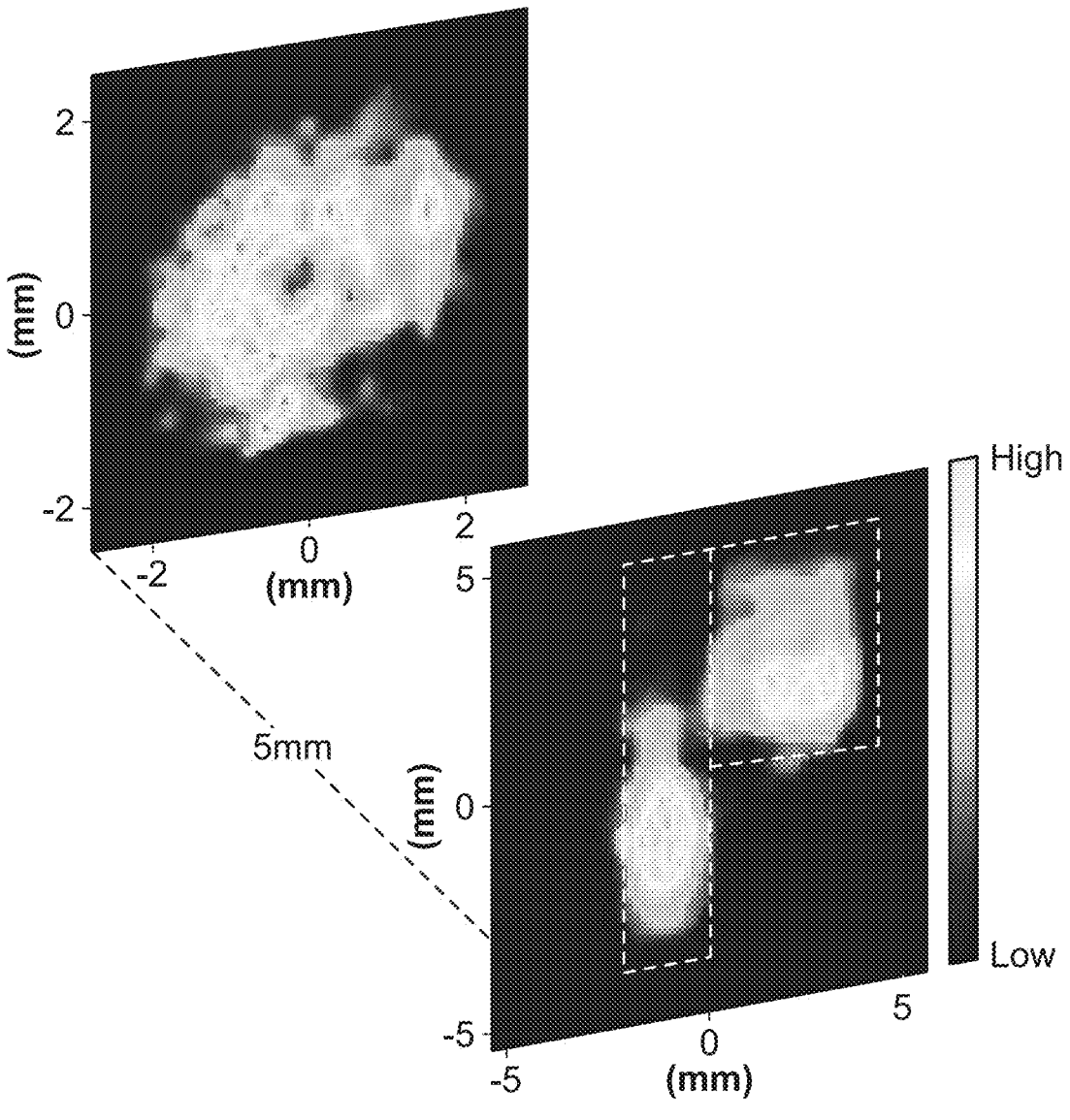
FIG. 5(c) depicts, with respect to programmable holographic projections, measured near fields and holographic projections of letter 'P' at a distance of 5 mm. Color bars represent normalized power intensity. Color bars represent normalized power intensity.
Figure 5D:
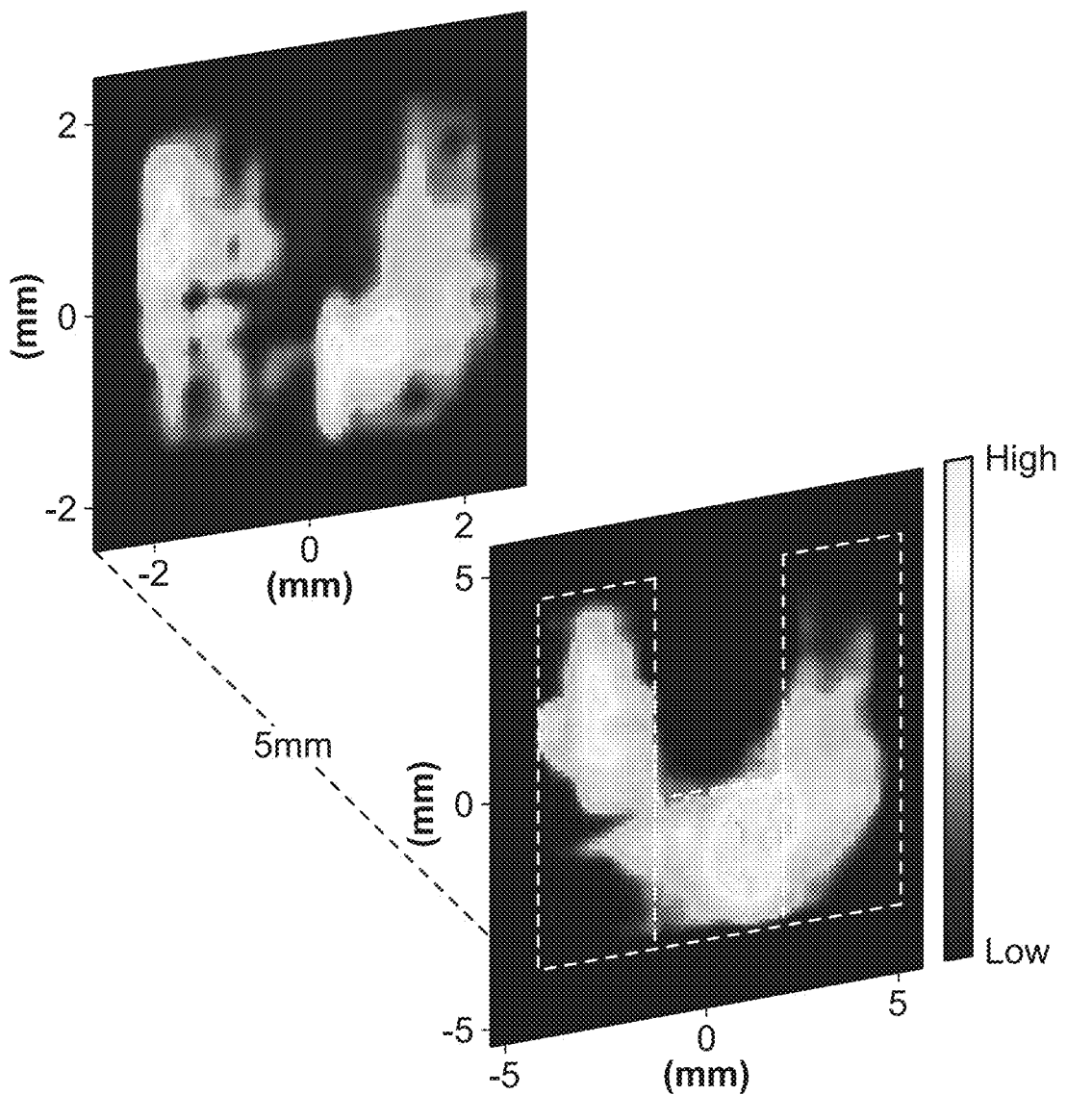
FIG. 5(d) depicts, with respect to programmable holographic projections, measured near fields and holographic projections of letter 'U' at a distance of 5 mm. Color bars represent normalized power intensity. Color bars represent normalized power intensity.

The phase transformation ability through the surface is demonstrated with terahertz beamforming. A beam passing through a programmable phase gradient surface can be directed towards the direction of interest. Here, created were three different phase gradients with the appropriate codes to demonstrate beamforming at +30°, 0° and ~30°. The spatial distributions of the digital switch settings to create the phase gradients are shown in FIG. 4a. The lateral shift of the beam projection was measured at a distance of 5 mm and compared with simulation results (FIG. 4b-d). As can be seen, the surface can be reconfigured to create dynamic beamforming in both azimuth and elevation at terahertz. With the ability to individually control each meta-element state, also demonstrated was beam manipulation by imparting transmissive properties in various parts of the surface of the 2×2 chip array. This allows the surface to operate as a spatial light modulator at terahertz. The results are in FIGS. 12 and 14. The speed of the reconfiguration is limited by the switching speed of the CMOS transistors, which operate at upwards of 3 GHz in modern processors. Custom digital cells for high switching speeds were created. To measure the speed limits of reconfiguration, the surface was modulated between the two digital states, that is all-open (highest transmission) and all-short states (lowest transmission), which provides an OFF/ON ratio of ~25 dB (FIG. 3). The frequency of the digital clock was then varied to observe the OFF/ON ratio. As can be seen, the metasurface can be programmed with a clock frequency reaching up to 5 GHz (FIG. 4e). At 5 GHz clock switching speed, each unit tile chip in the array chip draws a current of ~6.25 mA (total of ~25 mA for the 2×2 array).

The high-speed modulation of the surface at multigigahertz speed allows the surface to establish a high-data-rate terahertz communication link. With the ability to control the amplitude and phase of the transmitted wave, the surface can be operated as a backscatter radio, which can convert a continuous-wave signal into a modulated one. These applications can enable the next generation of ubiquitous terahertz connectivity with high-density deployment of low-cost and low-power terahertz wireless nodes.

Also demonstrated were programmable terahertz holographic projections with spatial near-field amplitude control. Binary-amplitude-only holography was performed by making the unit cells take either all-open or all-short digital states. The angular spectrum method was employed along with genetic-algorithm-based optimization to determine the optimal metasurface digital code state for each element to project a desired field pattern in the Fresnel zone, further detailed herein. For the two states used in this case (all-open high-transmissivity state and all-short high-blocking state), one approximates the impact of a unit cell as a dipole moment to determine the near field and the desired Fresnel zone fields (see FIG. 13). Once the overall states for all the unit cells are determined, the metasurface is coded to achieve the required switch settings. As a proof of concept, one programs the 2×2 array to generate two separate holographic projections of letters 'P' and 'U' at a distance of 5 mm from the metasurface back plane. The simulated optimal metasurface states and simulated projected fields are shown in FIG. 5$a,b$. The measured near field and the projected hologram 5 mm away from the metasurface are shown in FIG. 5$c,d$. The differences between simulated and experimental images can be attributed to edge scattering effects of the metasurface array and the finite resolution of the terahertz measurement probe. Demonstration of such holographic projections is not meant to illustrate applications of such projective holographs per se, but to show the ability of the presented metasurface to cast desirable field projections at a known distance in a robust and programmable fashion. The correspondence to simulation in both the near field (that is the digital control of the metasurface) and the Fresnel zone field illustrate that this can be achieved in a predictable manner. Such structured field projection is a powerful technique for many other applications such as sensing, computational imaging, lensing and beamforming, and demonstrates the range of functionalities that can be achieved with the silicon chip tiling approach.

The surfaces can be reconfigured to allow reflection or transmission of an incident beam, and allow beamforming to the intended directions. This allows these smart surfaces to reconfigure the channel when links get disrupted due to channel disruptions including blockages and channel propagation variations, fading, and interferences in complex mobile multi-user networks. To overcome disruptions of such nature requires presence of a strong enough secondary non line-of-sight path. The existence of such a path is fully channel-dependent and its absence will lead to outage. The surface can allow creation of a secondary path (including multi-beams) to allow for link closures when the main channel is blocked as shown in FIGS. 22 and 23. FIG. 24 depicts that the surface can also be used to create images with a transmitter and a receiver with programmable metasurface (a terahertz coded-aperture imaging system with one transmitter, one receiver and a coded-aperture antenna at the transmitting end is disclosed in Liu, Xingyue, et al. "Antenna Phase Error Compensation for Terahertz Coded-Aperture Imaging." *Electronics* 9.4 (2020): 628, incorporated herein by reference).

Disclosed herein is a codesign approach that combines passive meta-elements and active transistors, which could deliver large-scale, low-cost and high-performance active terahertz systems. By eliminating the separation of passive and active design, it was shown that new metastructures and functionality can emerge. The approach can simultaneously deliver high-efficiency metasurfaces and programmability, with active devices operating beyond their cutoff frequencies. The approach of tiling identical silicon chips to create larger arrays exploits the high-yield and low-cost nature of the silicon chip fabrication technology, enabling complex systems at scale. Metasurfaces naturally lend themselves to this approach due to their repetitive architecture and the need for reconfigurability.

It is also important to note that the power consumption of an individual integrated chip is extremely low, allowing it to be powered by a battery. The chip operates at 1.2 V and draws a static current of ~200 μA. Power consumption is a critical metric, especially in such transmissive structures, since thermal dissipation could become a potential issue. Such systems do not require external stimulus (such as optical pumping, heat, magnetic bias or high voltages) for reconfigurability, neither do they require cryogenic cooling. The chip-scale integration could also allow terahertz sources to be integrated with active metasurfaces in the same substrate. The ability to reconfigure the surface at subwavelength scales and at gigahertz speed could potentially lead to terahertz surface modulators that enable high-speed terahertz transmitters, circumventing the need for frequency mixers. Such systems could be of use in future terahertz sensing and imaging systems, and in multi-gigabits-per-second terahertz wireless links.

The chip was designed and fabricated in an industry-standard 65 nm CMOS process. To illuminate the metasurface, one generates the terahertz signal through an electronic upconversion technique. A 0 dBm, 12.5 GHz single tone signal is first fed to a two-stage frequency multiplier chain with a frequency multiplication factor of eight. The output signal is fed to a W-band 75-110 GHz power amplifier with a saturated power output of 17 dBm that drives a WR-3 (220-330 GHz) passive tripler to generate a 0.3 THz signal. This is radiated out through a WR-3 standard gain horn antenna. The total radiated output power at the tripler is 0 dBm, measured using an Erickson PM-5 calorimeter-style power meter. The terahertz signal illuminates the 2×2 metasurface chips and the transmitted signal at the back plane is measured using a WR-3 near-field open-ended waveguide probe. The received signal is then fed to a 16th-harmonic mixer.

The local oscillator (LO) signal to this mixer is fed through a diplexer. The LO frequency is chosen to be such that (RF−16 LO)=10 MHz. The open-ended waveguide probe and the mixer set-up are mounted on an X-Y position scanner to map the spatial field patterns. The output 10 MHz signal from the downconverting mixer is fed to a lock-in amplifier to improve the sensitivity of the measurements since the harmonic mixer has a measured conversion loss of about 50 dB at 0.3 THz. The lock-in amplifier and the LO signal generator are locked with a 10 MHz clock output from the transmitting signal source end for coherent detection. An external Nexys 4 DDR field-programmable gate array was used to send the clock and switch data signals to the on-chip shift registers. A computer running a custom MATLAB program controls the field-programmable gate array, signal generators and lock-in amplifier through a GPIB (general purpose interface bus). The lock-in amplifier integration time is set to ~100 μs. The data acquisition from the lock-in amplifier takes about 0.2-0.3 ms using the GPIB protocol.

Figure 18A:
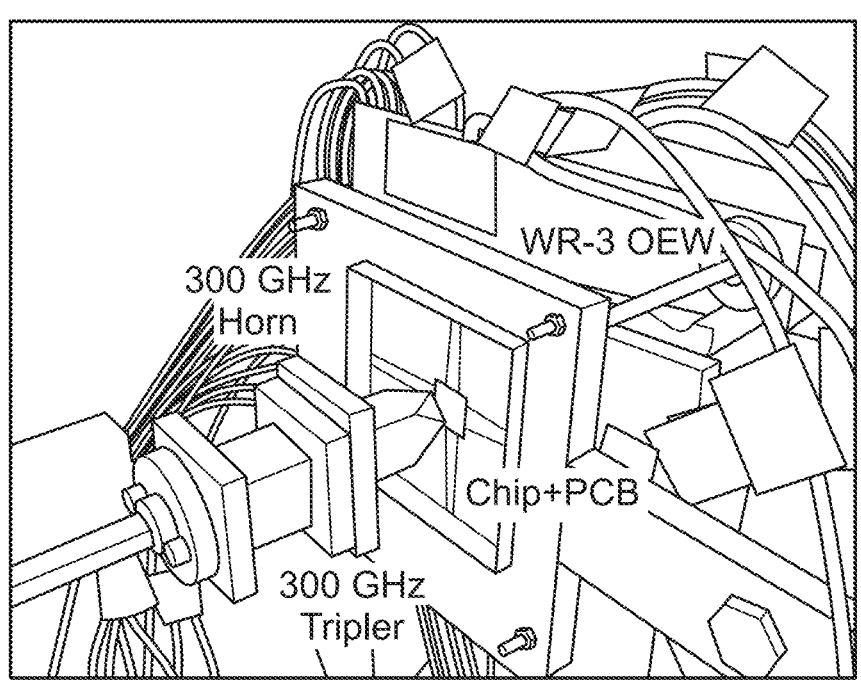
FIG. 18 depicts the side and top view of the experiment setup: the chip is mounted on a PCB and the digital signals are fed through a programmable FPGA; the chip is illuminated from a 0.3 THz standard gain horn antenna and the transmission through the chip is received from a WR-03 open-ended near field probe; and the near field probe is mounted on an X-Y scanner stage.
Figure 18B:
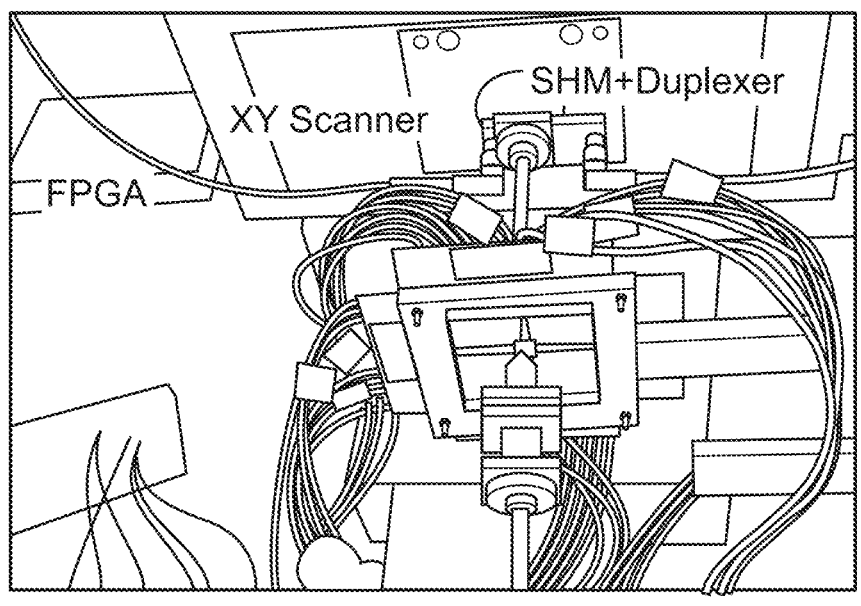

The method of improving the measurement sensitivity is discussed elsewhere herein. A complete schematic of the measurement set-up is shown in FIG. 11 and the actual experimental set-up photographs are shown in FIG. 18.

As to discrete dipole approximation, given the near vector fields of an aperture, E, these fields can be approximated and converted to magnetic surface currents using the surface equivalence theorem, as further detailed in Venkatesh, S., Lu, X., Saeidi, H. et al. A high-speed programmable and scalable terahertz holographic metasurface based on tiled CMOS chips. *Nat Electron* 3, 785-793 (2020). https:// doi.org/10.1038/s41928-020-00497-2 and its supplementary information, which are also part of this application and are incorporated by reference in their entirety as if fully set forth herein.

The reconfiguration of the various meta-element states for amplitude/phase control is dependent on the switching performance of the integrated FET device as shown in FIG. 2. When operated at frequencies close to $f_t$, this can degrade considerably due to the leakage of the parasitic capacitances. A simple log-channel FET model is described here to illustrate the effect (FIG. 6). While the 65 nm devices used in this work do not strictly obey long-channel models, this provides an analytical insight on the trade-off between switching ratio and operation frequency.

In the ON state, the FET is in deep triode and for a long-channel model, the current-voltage relationship-tan be expressed as $$I_{sw} = \mu_n C_{ox} \frac{W}{L} (V_{ctrl} - V_T) V_{sw},$$

where $I_{sw}$, $V_{sm}$, express the current and voltage through the switch, $\mu_n$ is the electron mobility, $C_{ox}$ represents the gate capacitance per unit area, W and L are the width and channel length of the device, and $V_{ctrl}$ is the gate voltage of the switch and $V_T$ is the FET threshold voltage. Therefore, the ON resistance of the switch can be expressed as $$R_{on} = \frac{1}{\mu_n C_{ox} \frac{W}{L} (V_{ctrl} - V_T)} = \frac{1}{g_m},$$

where gm is the trans-conductance of the FET when biased in the saturation region at a gate voltage Vctrl. In the ON-state, Ron dominates the on resistance and therefore, $Z_{on} \approx R_{on}$.

In the off-state, the leakage through the parasitic capacitance dominates the off-resistance. Therefore, as shown in the figure, $$Z_{off} \approx \frac{1}{j\omega(C_{gd} + C_{ds})}.$$

Therefore, the switching ratio $$\left| \frac{Z_{off}}{Z_{on}} \right| = \frac{g_m}{\omega(C_{gd} + C_{ds})} = \frac{f_t}{f} \left( \frac{C_{gd} + C_{gs}}{C_{gd} + C_{ds}} \right) \sim \frac{f_t}{f}$$

since the cut-off frequency $$f_t = \frac{g_m}{2\pi(C_{gd} + C_{gs})}.$$

In summary, the switching ration improves with ft and falls almost linearly with frequency. When operated close to ft, the switching ratio is expected to fall to 1.

Figure 12A:
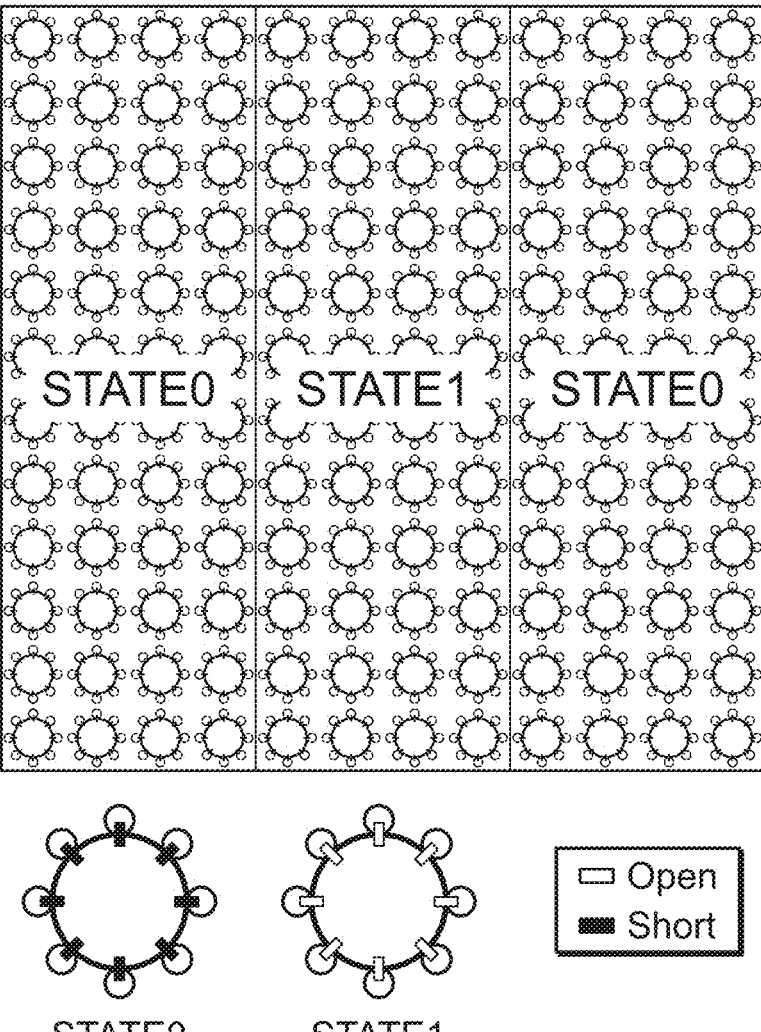
FIG. 12(a) depicts, with respect to operation of the unit chip tile as a spatial light modulator, the digital state configuration of the chip that shows the high transmissive and high blocking states.
Figures 12B, 12C:
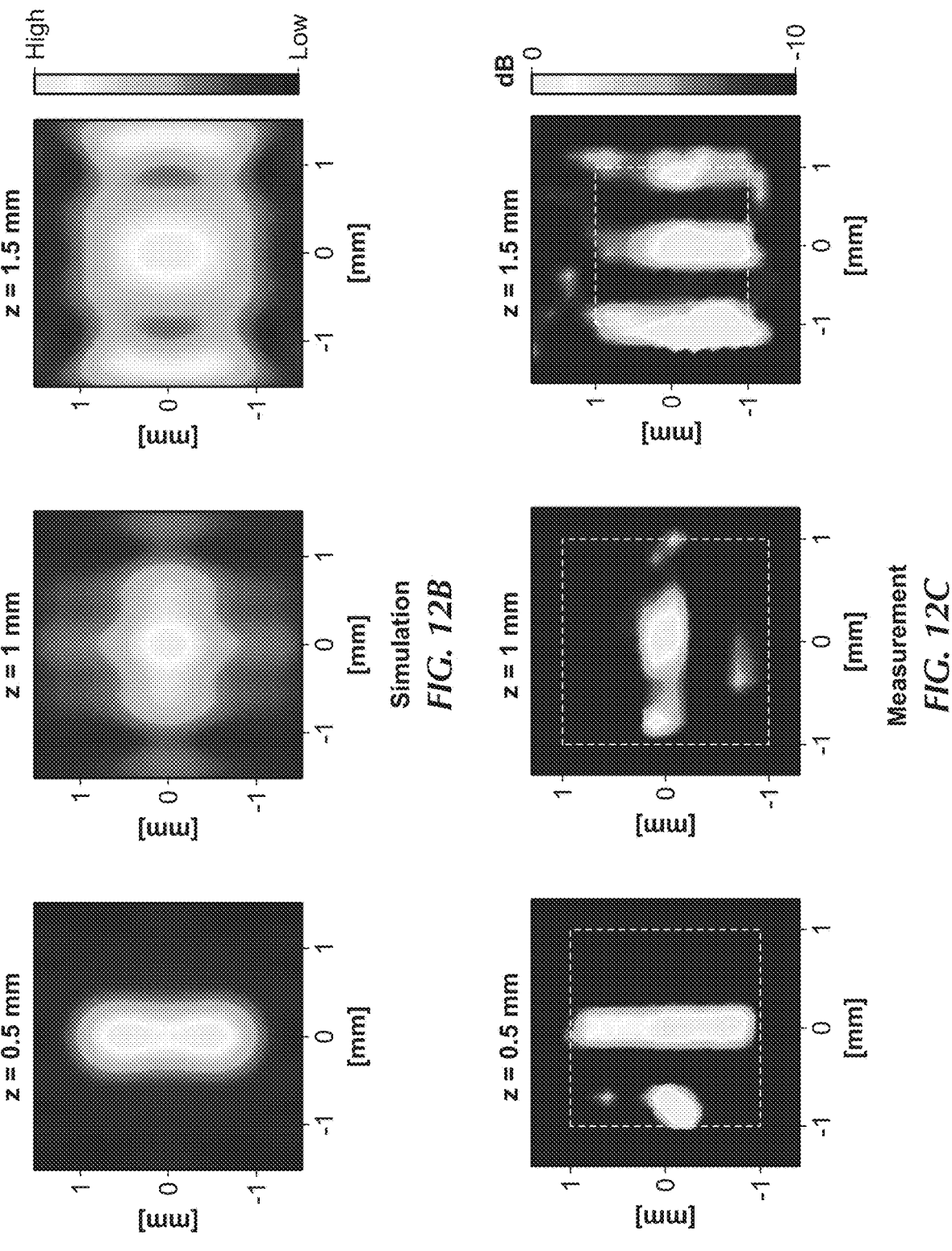
FIG. 12(b) depicts, with respect to operation of the unit chip tile as a spatial light modulator, simulated fields at different propagation distances.
FIG. 12(c) depicts, with respect to operation of the unit chip tile as a spatial light modulator, measured normalized electric field patterns at different distances demonstrating correspondence with the simulations.

As shown in the FIG. 12, the simulated switching ratio at of a TSMC RF NMOS transistor of sizing 20 μm/65 nm operating in the deep triode region. The cut-off frequency limit ft of this process is about 0.25 THz. At such high frequencies, due to the parasitic leakage, the OFF-ON impedance ($|Z_{OFF}/Z_{ON}|$) ratio is 2 at 0.3 THz. The performance of the switch that is critical for the meta-element reconfiguration can be enhanced by exploiting local resonances with eight sub-wavelength inductive loops embedded within the meta-element. The OFF-ON impedance ($|Z_{OFF}/Z_{ON}|$) ratio can be boosted by a factor of ≈12.5 (FIG. 2).

FIGS. 8A and 8B show the CMOS metasurface chip architecture. The digital control signal that programs the individual meta-element/unit cell is provided through an 8-bit serial to parallel shift register. Each element in a row in the metasurface is controlled independently through a 96 bit serial-to-parallel shift register. The clock signal can reach up to a maximum frequency of 5 GHz. The transistor sizing for each block is also shown in the figure.

Figure 9:
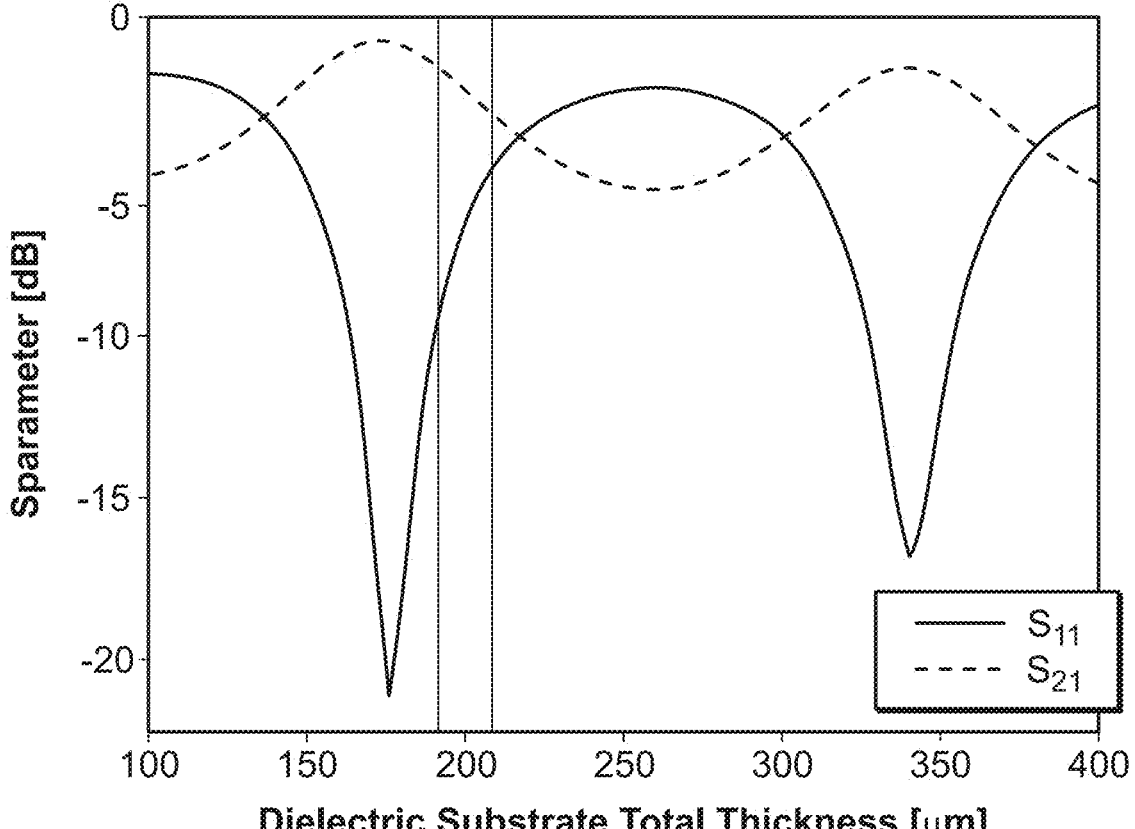
FIG. 9 depicts the simulated reflection and transmission coefficient at 0.3 THz for varying substrate thicknesses.

The dielectric layers include $SiO_2$, followed by lossy Si and high resistive Si as shown in the material stack layers in FIG. 2 *b*. The thickness is adjusted to minimize the overall reflection and maximize transmission. It was shown that the simulated variation of $S_{11}$ and $S_{21}$ parameters as a function of overall dielectric thickness in FIG. 9. The transmission peaks and reflection dips around 185 μm. This is because at this dielectric thickness ($d \approx 3\lambda_{Si}/4$)), the round-trip phase change through the silicon substrate approximates 3π. However, this is only approximate since one cannot apply ray optic principles with such substrate thickness. Accurate calculations using substrate mode theory shows that the relationship still approximately holds 45. For more accurate results, shown is the full electromagnetic simulation in FIG. 9.

To achieve this condition, one thins the lossy Si to 100 μm (overall chip thickness) and attaches a high resistive silicon of 100 μm, thus realizing an overall thickness of 200 μm. Typically, thinning of the chips/substrates have a certain precision of ±10 μm. Therefore, shown was a green band around 200 μm which was used for simulations. Extra care needs to be taken while thinning the chips as the bulk Si layer also provides mechanical support to the chip and thinning below 100 μm can potentially damage the chip. The loss due to the substrate is very specific to the choice of the CMOS process and can be easily circumvented by choosing a Si process with high resistivity substrate.

The substrates are extremely thin compared to the operating wavelength (λ/5) and hence ray optics approach may not be ideal. Hence, performed was full-wave vector electromagnetic simulation to evaluate the beamforming scenario. Using Gaussian beam incidence, one excites the metasurface layer. The responses of the meta-atoms are modeled as phased sub-wavelength magnetic dipole scatterer. The equivalence theorem is presented elsewhere herein. As shown in the simulation in FIG. 10 there is a significant electric field enhancement in the metasurface layer. However, the wave propagates out according to the phasing of these dipoles. Also performed was the beamforming simulation for different metasurface thicknesses demonstrating the highest transmission at the substrate thickness of 200 μm.

The amplitude and phase control of the meta-element through the digital control of the structure shape is intended to emulate the orientation rotation of the aperture (as shown in FIG. 11(*a*)) for amplitude control and opening of the aperture to realize phase control (as shown in FIG. 11(*b*)).

While ideally, each such control mechanism is supposed to allow independent control these two parameters, the non-idealities of the electronically actuated structure from the ideal C-aperture creates slight coupling between the two (FIG. 3). The modeling of the meta-element under these actuations are presented with two examples in FIG. 11. As can be seen, for amplitude control, the ON and OFF-resistances of the FET switches need to be taken into account while modeling the meta-element structures.

For phase control, in addition to the FET switch models, as the aperture is opened up, the floating metal segments between the OFF FETs can cause spurious scattering. Taking all these complex interactions into account, the metasurfaces still allows a measured ~25 dB of amplitude control and nearly 260° of simulated phase control. To realize the intended amplitude and phase transformation, this amplitude and phase response 8-bit coded meta-element can be translated to a look-up-table that can be utilized to realize the meta-element settings.

The performance of a single metasurface integrated chip was characterized. The single chip consists of a 12×12 periodic array of unit cells. Created was a pattern of 4 consecutive unit cells with 'all short' (high blocking), 'all open' (high transmissive), and 'all short' configuration as shown in FIG. S7. Simulation of the transmitted field evolution using the angular spectrum method showed the 2D slice results at different propagation distances. This is shown in FIG. 12 *b*). The measured normalized 2D electric field distribution for the different propagation distances is shown in FIG. 12 *c*). Suppose one is interested in only binary amplitude-only holographic projections, one could replace the ON pixels in the aperture plane with a certain constant magnetic dipole moment and the OFF pixel with zero (since the ON to OFF measured ratio is ~25 dB). Dipole approximation explained elsewhere herein was employed to approximate the metasurface unit cells to magnetic dipole moments. The spacing of these magnetic dipoles can be approximated to the spacing of the unit cells due to their subwavelength nature. This assumption is valid since one is interested in overall holographic pattern/feature in the Fresnel zone rather than the actual field strengths. This assumption was first confirmed through simulations and validated in measurements as shown in FIG. S7. The assumption also simplifies the genetic algorithm-based optimization for binary amplitude-only holographic projections.

Figures 14A, 14B, 14C, 14D, 14E, 14F:
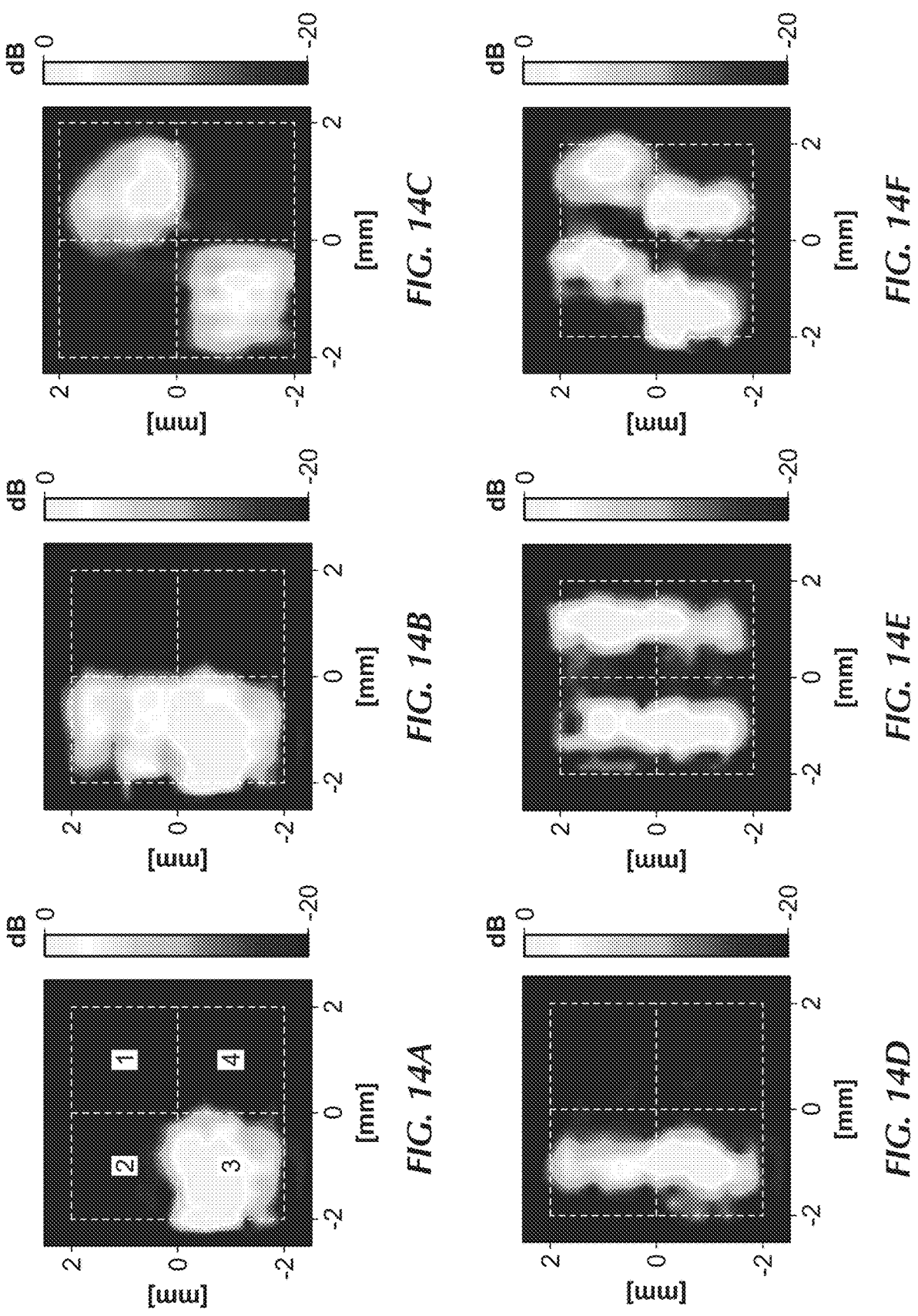

FIG. 14 shows the reconfigurability nature of the 2×2 metasurface chip array. Sub figures a)-c) illustrate the measured field patterns when different and multiple quadrants of the chips are turned ON. Sub figures d)-f) show the field patterns when certain unit cells in different quadrants of the chips are set to 'all open' while the rest is set to 'all short' settings. These configurations generate more complex beam patterns.

Figure 15A:
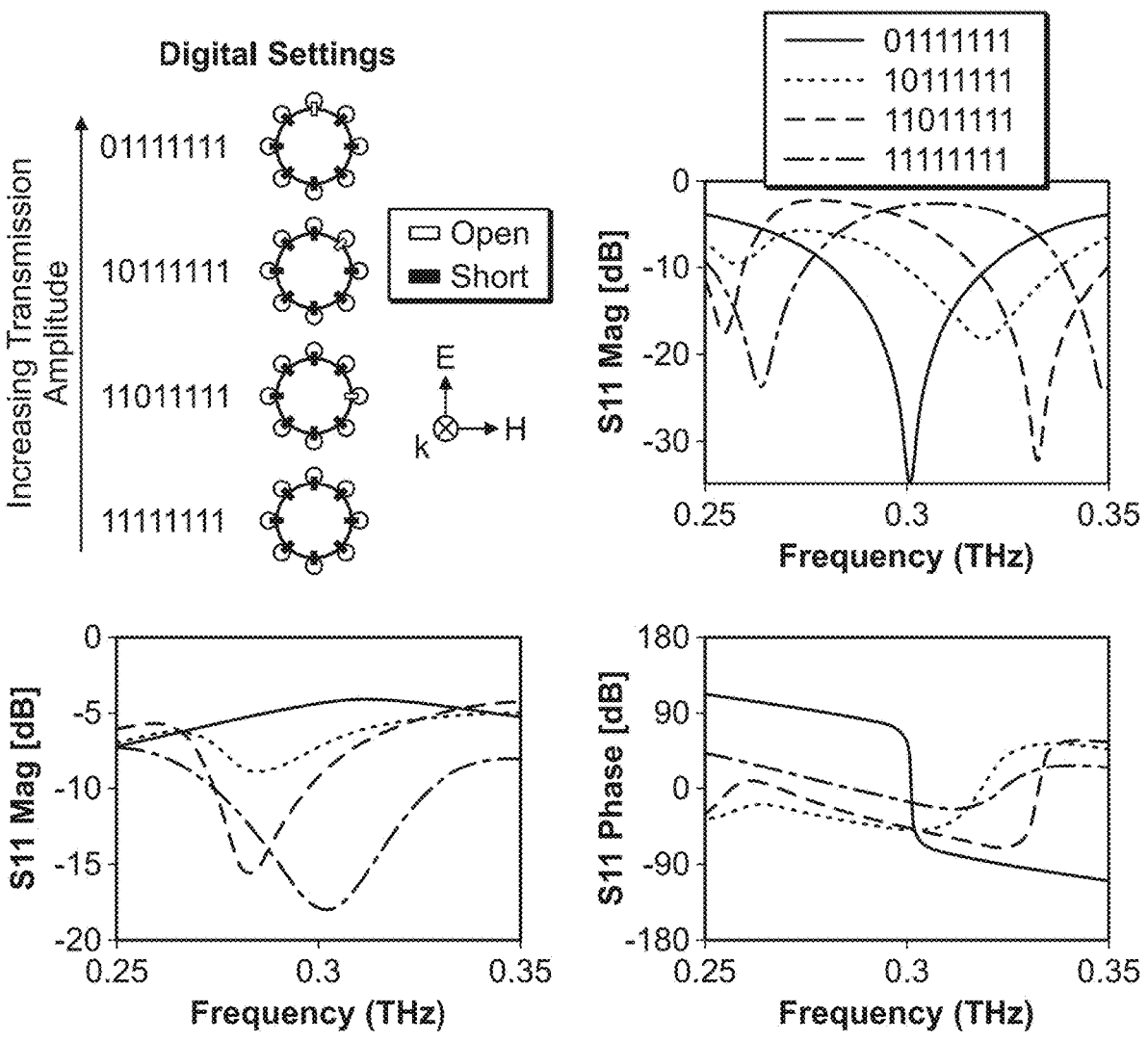
FIG. 15 depicts simulated S-parameter responses as a function of frequency for different meta-element codes.
Figure 15B:
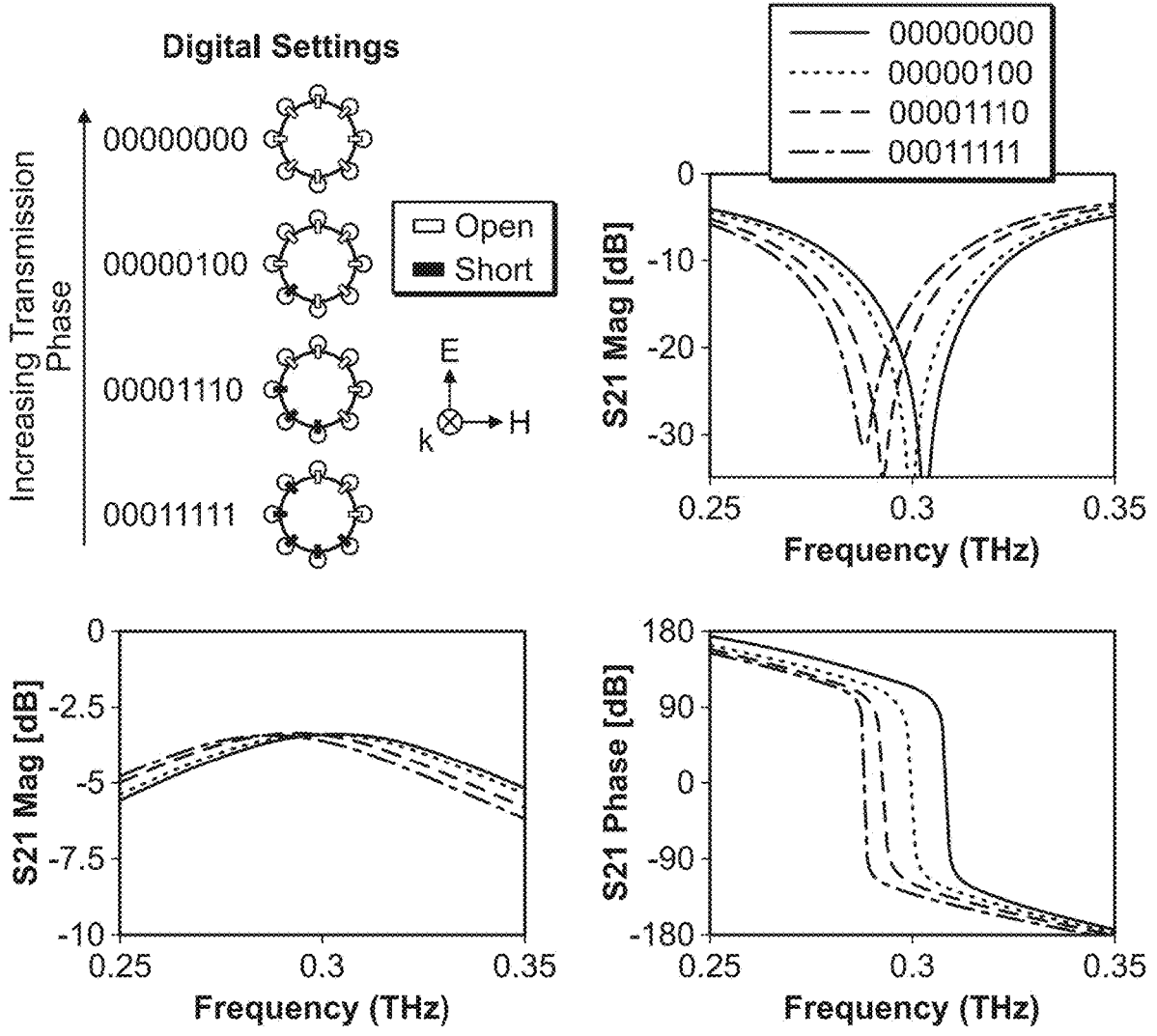

FIG. 15 shows the simulated S-parameter responses as a function of frequency for different code settings. The top row represents the particular code settings responsible for transmission amplitude control while keeping the transmission phase mostly unchanged. The bottom row represents the particular code settings responsible for transmission phase control while keeping the transmission amplitude mostly unchanged. FIG. 16 *a-b* show the simulated transmission amplitude and phase for different switch settings at 0.3 THz for an incident plane wave at an angle of 30° and 45° respectively.

Figure 17:
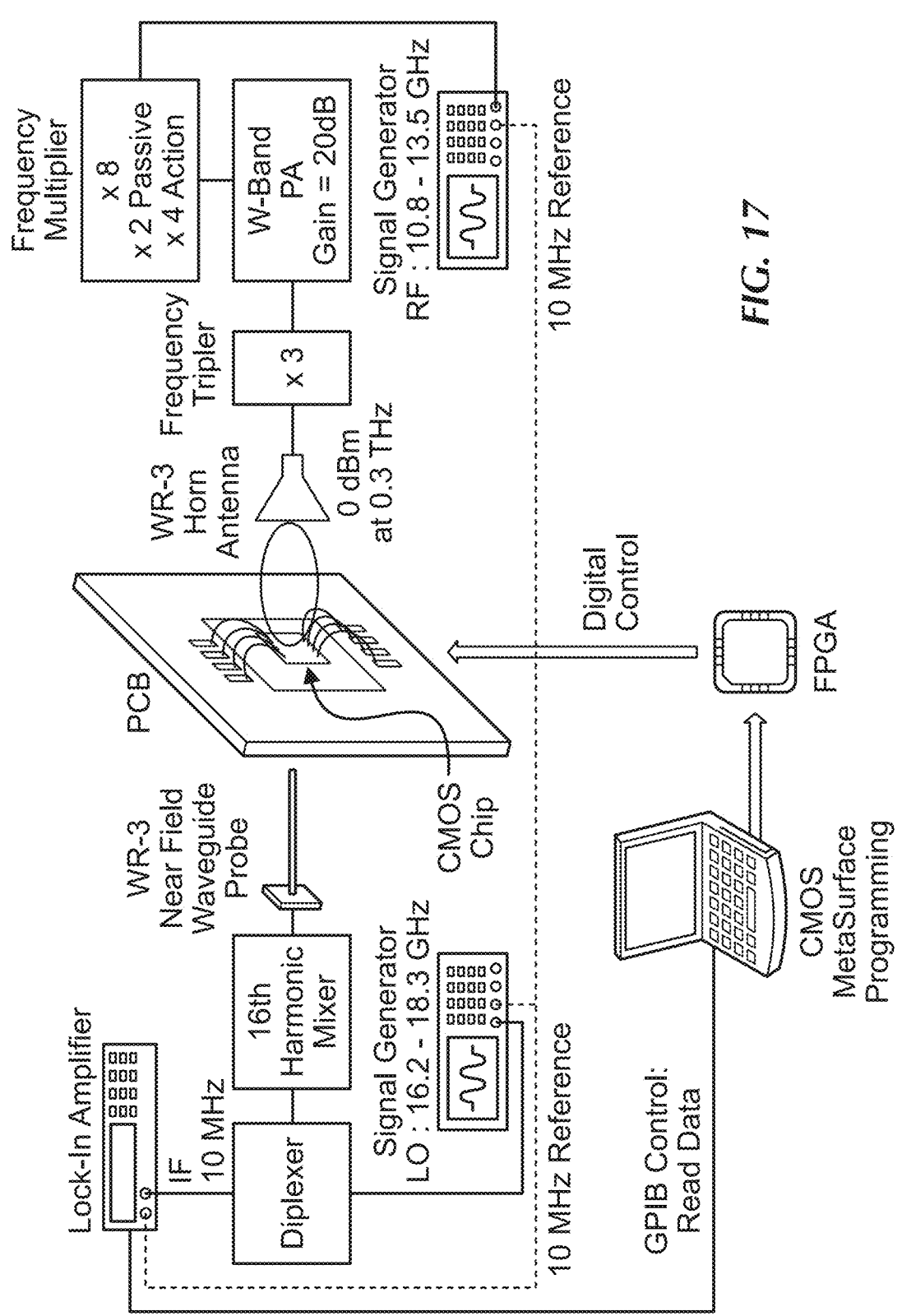
FIG. 17 depicts a measurement setup schematic, showing that the electronic up-mixing generates 0 dBm power at 0.3 THz which illuminates the metasurface array, and a WR-3 near field OEW probe along with a 16th harmonic mixer and a lock-in amplifier used for back-end detection.

FIG. 17 shows the measurement schematic illustrating the 0.3 THz power generation for metasurface platform illumination and detection. The metasurface chip is programmed through an external Nexys 4 DDR Field Programmable Gate Array (FPGA) board. The FPGA and the lock-in amplifier are controlled through a computer. The experimental setup is shown in FIG. 18.

Due to the limited power generation at 0.3 THz, high conversion loss of the harmonic mixer at the detector back-end, and the aperture efficiency of the open-ended WR-03 near field probe the sensitivity of the detector is extremely limited. In order to improve the detector sensitivity, one employs lock-in amplifier with a chopping mechanism achieved by switching the metasurface in a regular periodic fashion. In this method, the THz beam is continuously illuminating the aperture and the metasurface is modulated using two predefined states (one with the lowest-All short State® and the highest-All open State1 transmission states) in a periodic manner. This switching in turn modulates the output of the THz beam when it passes through the chip. After every switching state, the lock-in amplifier value is recorded. The metasurface is switched in a periodic manner, as shown in FIGS. 19A, 19B. The time period ratio between all short (State0) and all open (State1) states is chosen to 2:1. After each state the locking amplifier amplitude is recorded and stored asynchronously. This recorded time domain waveform is then Fourier transformed to determine the difference between the State® and State1. Due to the nature of 2:1 switching ratio format between State® and State1, the Fourier transform of the time domain signal peaks at f=0.3333 Hz, assuming the total period T=1 s (though this assumption is just for the convenience and has nothing to with data acquisition time or the lock-in amplifier settling time). The lock-in amplifier is set to have an integration time of 100 μs. The shift registers set the metasurface to the stable required state within 10 μs even for a lowest switching clock frequency of 10 MHz. The limitation in data acquisition is mainly due to the GPIB to custom MATLAB program interface which takes about 0.2-0.3 ms for every lock-in amplifier read. This method helps to improve the sensitivity of the measurements. The down-converted signal from the harmonic mixer is at a frequency of 10 MHz. The reference signal to the lock-in amplifier is fed from the clock output of the input RF signal generator which is used for upconversion. The LO signal generator and the RF signal generator are also locked through the 10 MHz clock to make the setup coherent.

Digital transistors in CMOS 65 nm process inherently allow high speed operation. The clock signal is responsible for loading and latching the RF NMOS transistor switches. The highest achievable clock frequency in simulation and measurement is 5 GHz and the simulations are shown in FIG. 20(*a*). When the clock speed is increased to 10 GHz, there are missing latching instances when the switch data transition rate is high. However, when the data transitions are reduced the data is latched correctly. This effect is simulated and plotted in FIG. 20 (*b-c*). The measurement setup is slightly altered to allow for high speed clock switching. The FPGA is replaced with an arbitrary waveform generator (AWG) which sends clock and data signals to the chip. The signal from the AWG is amplified, and the appropriate bias is applied through a bias tee before feeding the signals to the chips. This schematic is shown in FIG. 21.

What is claimed is:

1. A device, comprising:
   one or more electronic tiles, each tile integrated into at least one semiconductor chip, each electronic tile comprising at least one electromagnetic unit cell, each electromagnetic unit cell comprising a resonator element divided into a plurality of sectors, where adjacent sectors are connected via a switch at a connection point, each switch connected in parallel to a separate subwavelength inductive loop to create a high-resistance path when the switch is open, where each electromagnetic unit cell is programmable.

2. The device according to claim 1, wherein the resonator element is a split-ring resonator structure.

3. The device according to claim 1, wherein the resonator element is a C-shaped aperture structure.

4. The device according to claim 1, wherein the one or more electronic tiles are packaged on a printed circuit board.

5. The device according to claim 1, wherein each semiconductor chip tile is a complementary metal-oxide-semiconductor (CMOS)-based chip tile.

6. The device according to claim 1, wherein the electronic tiles are configured as an array of semiconductor chip tiles.

7. The device according to claim 6, wherein the array of semiconductor chip tiles is an m×n array of semiconductor chip tiles, where m, n≥2.

8. The device according to claim 1, wherein each electromagnetic unit cell is a uniquely addressable and programmable.

9. The device according to claim 1, wherein each electromagnetic unit cell has a length or width that is less than $\lambda_0/2$ of the free-space wavelength, and each electromagnetic unit cell is separated from a neighboring electromagnetic unit cell by a distance that is less than $\lambda_0/2$ of the free-space wavelength.

10. The device according to claim 1, wherein each electromagnetic unit cell has a length or width that is greater than or equal to $\lambda_0/2$ of the free-space wavelength, and each electromagnetic unit cell is separated from a neighboring electromagnetic unit cell by a distance that is equal to or greater than $\lambda_0/2$ of the free-space wavelength.

11. The device according to claim 1, wherein each electromagnetic unit cell has a length or width that is less than $\lambda_0/2$ of the free-space wavelength, and each electromagnetic unit cell is separated from a neighboring electromagnetic unit cell by a distance that is equal to or greater than $\lambda_0/2$ of the free-space wavelength.

12. The device according to claim 1, wherein each electromagnetic unit cell has a length or width that is greater than or equal to $\lambda_0/2$ of the free-space wavelength, and each electromagnetic unit cell is separated from a neighboring electromagnetic unit cell by a distance that is equal to or greater than $\lambda_0/2$ of the free-space wavelength.

13. The device according to claim 1, wherein each of a plurality of CMOS switches is equally spaced around a split-ring resonator structure.

14. The device of claim 1, wherein a digital control signal for each electromagnetic unit cell is provided through an 8-bit shift register.

15. A system, comprising a device comprising one or more electronic tiles, each tile fully integrated into a semiconductor chip, each electronic tile comprising at least one electromagnetic unit cell, each unit cell comprising a resonator element divided into sectors, where adjacent sectors are connected via a switch at a connection point, each switch connected in parallel to a separate subwavelength inductive loop to create a high-resistance path when the switch is open, where each electromagnetic unit cell is programmably activatable by the switch at the connection point; and at least one processor configured to control the on- or off-state of each switch at each connection point on the device.

16. The system according to claim 15, wherein the system is configured for at least one of beamforming, high speed spatial light modulation, dynamic holographic projections, and wavefront manipulation.

17. The system according to claim 15, wherein the at least one processor is operably coupled to a field gate programmable array or an arbitrary waveform generator.

18. The system according to claim 15, further comprising a transmitter configured to direct a beam of radiation towards the device.

19. The system according to claim 18, further comprising at least one receiver configured to receive radiation after transmitting through the device or reflecting from the device.

20. The system according to claim 19, wherein the at least one receiver is a mobile receiver.

21. The system according to claim 19, wherein the at least one receiver is a non-mobile receiver.

22. The system according to claim 19, wherein the at least one transmitter is configured to transmit one or more frequencies of radiation.

23. The system according to claim 19, wherein the at least one processor is configured to produce an image based on information received by the at least one receiver.

24. The system according to claim 19, wherein the at least one processor is configured to reflect the beam towards a second device comprising one or more electronic tiles.

25. The system according to claim 19, wherein two or more receivers, each at a different geographic location, are operably coupled to a single transmitter, wherein the at least one processor is configured to direct a beam from the transmitter to one of the two or more receivers.

26. The system according to claim 19, wherein the transmitter and the at least one receiver are located indoors.

27. The system according to claim 19, wherein at least one of the transmitter and/or the at least one receiver are located outdoors.

28. The system according to claim 19, wherein the at least one processor is configured to adjust a reflected beam or a transmitted beam to track the at least one receiver as the at least one receiver changes position.

* * * * *